(12) United States Patent
Yun et al.

(10) Patent No.: US 11,165,045 B2
(45) Date of Patent: Nov. 2, 2021

(54) ORGANIC LIGHT-EMITTING DEVICE AND METHOD OF MANUFACTURING THE SAME

(71) Applicant: Samsung Display Co., Ltd., Yongin-si (KR)

(72) Inventors: Wonmin Yun, Yongin-si (KR); Yohan Kim, Yongin-si (KR); Yisu Kim, Yongin-si (KR); Eungseok Park, Yongin-si (KR); Byoungduk Lee, Yongin-si (KR); Yoonhyeung Cho, Yongin-si (KR); Youngcheol Joo, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 16/261,321

(22) Filed: Jan. 29, 2019

(65) Prior Publication Data

US 2019/0393447 A1 Dec. 26, 2019

(30) Foreign Application Priority Data

Jun. 20, 2018 (KR) .................. 10-2018-0070903

(51) Int. Cl.
*H01L 51/56* (2006.01)
*H01L 51/52* (2006.01)

(52) U.S. Cl.
CPC .......... *H01L 51/5256* (2013.01); *H01L 51/56* (2013.01); *H01L 2251/301* (2013.01)

(58) Field of Classification Search
CPC .................................................. H01L 51/5256
See application file for complete search history.

(56) References Cited

U.S. PATENT DOCUMENTS

| 9,543,521 | B2 | 1/2017 | Kaihovirta et al. | |
|---|---|---|---|---|
| 2003/0113568 | A1* | 6/2003 | Murschall | C08J 5/18 428/515 |
| 2007/0182314 | A1* | 8/2007 | Oh | H01L 51/5256 313/500 |
| 2008/0316573 | A1* | 12/2008 | Shim | G02F 1/155 359/265 |
| 2011/0042702 | A1 | 2/2011 | Lim et al. | |
| 2014/0125219 | A1* | 5/2014 | Choi | H05B 33/28 313/503 |

(Continued)

FOREIGN PATENT DOCUMENTS

| KR | 10-2006-0084978 A | 7/2006 |
|---|---|---|
| KR | 10-2011-0019195 A | 2/2011 |

(Continued)

*Primary Examiner* — Mohammad M Choudhry
(74) *Attorney, Agent, or Firm* — Lewis Roca Rothberber Christie LLP

(57) ABSTRACT

An organic light-emitting device includes a substrate, an organic light-emitting diode on the substrate, an encapsulation layer sealing the organic light-emitting diode, and an ultraviolet-reflective layer, the encapsulation layer including at least one inorganic layer and at least one organic layer that are alternately stacked, at least one selected from the at least one organic layer included in the encapsulation layer including an ultraviolet-absorbing material, and the ultraviolet-reflective layer consisting of an inorganic material.

15 Claims, 7 Drawing Sheets

(56) References Cited

U.S. PATENT DOCUMENTS

| | | | | |
|---|---|---|---|---|
| 2014/0145154 A1* | 5/2014 | Kim | ................... | H01L 51/5256 |
| | | | | 257/40 |
| 2014/0160404 A1* | 6/2014 | Yamada | ................ | G02B 5/208 |
| | | | | 349/96 |
| 2014/0217371 A1* | 8/2014 | Kim | ................... | H01L 51/5256 |
| | | | | 257/40 |
| 2015/0002953 A1* | 1/2015 | Yoon | ................ | G02F 1/133555 |
| | | | | 359/850 |
| 2016/0155975 A1 | 6/2016 | Jin et al. | | |
| 2016/0247974 A1* | 8/2016 | Huang | ................... | H01L 33/46 |
| 2016/0293803 A1* | 10/2016 | Kim | ..................... | H01L 33/465 |

FOREIGN PATENT DOCUMENTS

| | | |
|---|---|---|
| KR | 10-2014-0101788 A | 8/2014 |
| KR | 10-2015-0136798 A | 12/2015 |
| KR | 10-2016-0065553 A | 6/2016 |

\* cited by examiner

ORGANIC LIGHT-EMITTING DEVICE AND METHOD OF MANUFACTURING THE SAME

CROSS-REFERENCE TO RELATED APPLICATION

This application claims priority to and the benefit of Korean Patent Application No. 10-2018-0070903, filed on Jun. 20, 2018, in the Korean Intellectual Property Office, the entire content of which is incorporated herein by reference.

BACKGROUND

1. Field

One or more embodiments relate to an organic light-emitting device and a method of manufacturing the same.

2. Description of the Related Art

Organic light-emitting diodes are self-emission diodes that produce full-color images, and also have wide viewing angles, high contrast ratios, short response times, as well as excellent characteristics in terms of brightness, driving voltage, and response speed.

In an example, an organic light-emitting diode includes an anode, a cathode, and an organic layer between the anode and the cathode. The organic layer may include a hole transport layer, an emission layer, an electron transport layer, and a cathode. When a voltage is applied between the anode and the cathode, holes injected from the anode pass the hole transport layer and migrate toward the emission layer, and electrons injected from the cathode pass the electron transport layer and migrate toward the emission layer. Carriers, such as holes and electrons, recombine in the emission layer to produce excitons. These excitons transit (e.g., transition or relax) from an excited state to a ground state, thereby generating light. An organic light-emitting diode including the organic light-emitting diode may further include a driving transistor or a switching transistor.

The organic light-emitting diode may be deteriorated by oxygen and/or moisture, and may also have reduced lifespan due to ultraviolet rays. Thus, to implement a high-quality organic light-emitting diode, an effective way for sealing an organic light-emitting diode is required.

SUMMARY

Aspects of embodiments of the present disclosure provide an organic light-emitting device including an encapsulation layer (e.g., a sealing means), the encapsulation layer (e.g., the sealing means) being capable of preventing oxygen and/or moisture from penetrating into an organic light-emitting diode (or capable of reducing a likelihood or amount of oxygen and/or moisture penetrating into the organic light-emitting diode) to thereby provide a long lifespan and capable of protecting the organic light-emitting diode from ultraviolet light, and a method of manufacturing the organic light-emitting device.

Additional aspects of embodiments will be set forth in part in the description which follows and, in part, will be apparent from the description, or may be learned by practice of the presented embodiments.

An aspect of an embodiment provides an organic light-emitting device including a substrate, an organic light-emitting diode on the substrate, an encapsulation layer sealing the organic light-emitting diode, and an ultraviolet-reflective layer, wherein the organic light-emitting diode is located between the substrate and the encapsulation layer, the encapsulation layer is located between the organic light-emitting diode and the ultraviolet-reflective layer, the encapsulation layer includes at least one inorganic layer and at least one organic layer which are alternately stacked, at least one selected from the at least one organic layer included in the encapsulation layer includes an ultraviolet-absorbing material, and the ultraviolet-reflective layer consists of an inorganic material.

In one embodiment, the encapsulation layer may include encapsulation units in the number of n, in which an inorganic layer and an organic layer are stacked sequentially from the organic light-emitting diode, wherein n may be an integer of 1 or more.

In one embodiment, the ultraviolet-reflective layer may be a multi-layered film including two or more layers, in which inorganic films having different refractive indices are alternately stacked.

In one embodiment, the ultraviolet-reflective layer may include at least one first inorganic film having a first refractive index, and at least one second inorganic film having a second refractive index different from the first refractive index.

In one embodiment, the ultraviolet-reflective layer may include m stacking units, in which a first inorganic film having a first refractive index and a second inorganic film having a second refractive index different from the first refractive index are stacked, wherein m may be an integer of 3 or more.

In one embodiment, the ultraviolet-reflective layer may have a reflectance of about 90% or more with respect to light having a wavelength of about 405 nm or less.

In one embodiment, the ultraviolet-reflective layer may have a transmittance of about 80% or more with respect to light in a visible light region.

In one embodiment, the organic layer including the ultraviolet-absorbing material may have an absorptance of about 90% or more with respect to light having a wavelength of about 405 nm or less.

In one embodiment, the organic layer including the ultraviolet-absorbing material may have a transmittance of about 80% or more with respect to light in a visible light region.

In one embodiment, the encapsulation layer may have an absorptance of 90% or more with respect to light having a wavelength of about 405 nm or less.

In one embodiment, the encapsulation layer may have a transmittance of about 80% or more with respect to light in a visible light region.

In one embodiment, the ultraviolet-absorbing material may include at least one selected from a benzophenone-based compound, a cyanoacrylate-based compound, a benzotriazine-based compound, a benzotriazole-based compound, a triazine-based compound, an oxanilide-based compound, a salicylate-based compound, an ultraviolet-absorbing dye, and a photoluminescent material which absorbs ultraviolet light.

In one embodiment, the at least one organic layer may include a cured product of an organic layer formation composition including a monomer, a photopolymerization initiator, and an ultraviolet-absorbing material.

In one embodiment, the at least one inorganic layer included in the encapsulation layer may include at least one selected from silicon oxide, silicon nitride, silicon oxynitride, silicon carbide, silicon carbonitride, aluminum oxide, aluminum nitride, zinc oxide, titanium oxide, titanium nitride, tantalum oxide, tantalum nitride, hafnium oxide, hafnium nitride, zirconium oxide, zirconium nitride, cerium oxide, cerium nitride, tungsten oxide, tin oxide, tin nitride, and copper oxide.

In one embodiment, the ultraviolet-reflective layer may include at least one selected from silicon oxide, silicon nitride, silicon oxynitride, silicon carbide, silicon carbonitride, aluminum oxide, aluminum nitride, zinc oxide, titanium oxide, titanium nitride, tantalum oxide, tantalum nitride, hafnium oxide, hafnium nitride, zirconium oxide, zirconium nitride, cerium oxide, cerium nitride, tungsten oxide, tin oxide, tin nitride, and copper oxide.

In one embodiment, the organic light-emitting device may further include a lower organic layer between the organic light-emitting diode and the encapsulation layer.

Another aspect of an embodiment provides a method of manufacturing an organic light-emitting device, the method including: providing a substrate; forming an organic light-emitting diode on the substrate; forming an encapsulation layer on the organic light-emitting diode and the substrate; and forming an ultraviolet-reflective layer on the encapsulation layer, wherein the encapsulation layer includes at least one inorganic layer and at least one organic layer which are alternately stacked, at least one selected from the at least one organic layer included in the encapsulation layer includes an ultraviolet-absorbing material, and the ultraviolet-reflective layer consists of an inorganic material.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
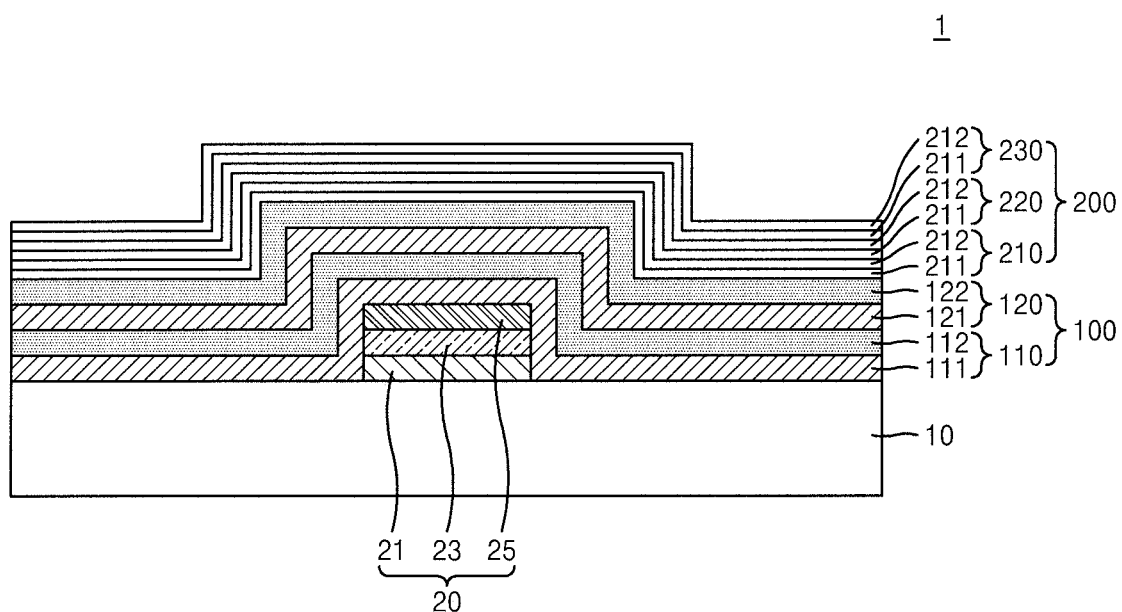
FIG. 1 is a schematic cross-sectional view of an organic light-emitting device according to an embodiment.

Hereinafter, exemplary embodiments of the present disclosure will be described in more detail with reference to the attached drawings. However, the subject matter of the present disclosure is not limited to the exemplary embodiments, and may be embodied in other forms.

The subject matter of the present disclosure will now be described more fully with reference to exemplary embodiments. The subject matter of the present disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Features of the subject matter of the present disclosure, and how to achieve them, will become apparent by reference to the embodiments that will be described herein below in more detail, together with the accompanying drawings. The subject matter of the present disclosure may, however, be embodied in many different forms and should not be limited to the exemplary embodiments.

Hereinafter, certain embodiments are described in more detail by referring to the attached drawings, and in the drawings, like reference numerals denote like elements, and a redundant explanation thereof may not be repeated herein.

As used herein, the terms as "first", "second", etc., are used only to distinguish one component from another, and such components should not be limited by these terms.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present. In addition, it will also be understood that when an element or layer is referred to as being "between" two elements or layers, it can be the only element or layer between the two elements or layers, or one or more intervening elements or layers may also be present.

Sizes of components in the drawings may be exaggerated for convenience of explanation. In other words, since sizes and thicknesses of components in the drawings may be arbitrarily illustrated for convenience of explanation, the following embodiments of the present disclosure are not limited thereto.

FIG. 1 is a schematic cross-sectional view of an organic light-emitting device according to an embodiment.

The organic light-emitting device 1 of FIG. 1 may include a substrate 10, an organic light-emitting diode 20 on the substrate, an encapsulation layer 100 sealing the organic light-emitting diode 20, and an ultraviolet-reflective layer 200.

For use as the substrate 10, any suitable substrate that is used in general for an organic light-emitting device may be used. In some embodiments, the substrate 10 may be a glass substrate or a plastic substrate, each having excellent mechanical strength, thermal stability, transparency, surface smoothness, ease of handling, and water repellency. For example, the substrate 10 may include an inorganic material such as a transparent glass material containing $SiO_2$ as a main component, or an insulating organic material such as a transparent plastic material. Examples of the insulating organic material may be selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP), but embodiments of the present disclosure are not limited thereto.

The organic light-emitting diode 20 including a first electrode 21, an organic layer 23, and a second electrode 25 may be formed on the substrate 10. The organic light-emitting diode 20 may be disposed between the substrate 10 and the encapsulation layer 100.

First Electrode 21

The first electrode 21 may be formed by depositing or sputtering a material for forming the first electrode 110 on the substrate. When the first electrode 21 is an anode, the material for a first electrode may be selected from materials with a high work function to facilitate hole injection.

The first electrode 21 may be a reflective electrode, a semi-transmissive electrode, or a transmissive electrode. When the first electrode 21 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. When the first electrode 21 is a semi-transmissive electrode or a reflective electrode, as a material for forming the first electrode 110, magnesium (Mg), silver (Ag), aluminum (Al), aluminum-lithium Al—Li), calcium (Ca), magnesium-indium (Mg—In), magnesium-silver (Mg—Ag), or any combination thereof may be used. However, the material for forming the first electrode 110 is not limited thereto.

The first electrode 21 may have a single-layered structure, or a multi-layered structure including two or more layers. For example, the first electrode 21 may have a three-layered structure of ITO/Ag/ITO, but the structure of the first electrode 110 is not limited thereto.

Organic Layer 23

The organic layer 23 is disposed on the first electrode 21. The organic layer 23 may include an emission layer.

The organic layer 23 may further include a hole transport region between the first electrode 21 and the emission layer, and an electron transport region between the emission layer and the second electrode 25.

Second Electrode 25

The second electrode 25 may be disposed on the organic layer 23 having such a structure. The second electrode 25 may be a cathode that is an electron injection electrode, and in this regard, a material for forming the second electrode 25 may be a material having a low work function, and such a material may be metal, alloy, an electrically conductive compound, or a combination thereof.

The second electrode 25 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 25 may be a transmissive electrode, a semi-transmissive electrode, or a reflective electrode.

The second electrode 25 may have a single-layered structure, or a multi-layered structure including two or more layers.

The organic light-emitting device 1 of FIG. 1 may include an encapsulation layer 100 that encapsulates an organic light-emitting diode 20 and an ultraviolet-reflective layer 200. The encapsulation layer 100 may be disposed between the organic light-emitting diode 20 and the ultraviolet-reflective layer 200.

Encapsulation Layer 100

The encapsulation layer 100 may include at least one organic layer and at least one organic layer which are alternately stacked.

The expression "(two or more different layers) are stacked sequentially," as used herein, refers to the vertical arrangement order of two or more different layers. A method of stacking the two or more different layers is not limited, and the two or more different layers may be stacked by using any suitable method available in the art. Meanwhile, another layer may be disposed between the two or more different layers.

The encapsulation layer 100 may include n encapsulation units, in which an inorganic layer and an organic layer are stacked sequentially from the organic light-emitting diode 20, wherein n may be an integer of 1 or more, for example, an integer from 1 to 10. The repeating number n of the encapsulation units may be variously and suitably changed according to luminescent efficiency of the organic light-emitting diode. In one embodiment, in the encapsulation layer of the organic light-emitting diode 20, n may be 1, 2, 3, 4, or 5, but embodiments of the present disclosure are not limited thereto. Meanwhile, when the encapsulation layer 100 includes two or more encapsulation units, another layer (for example, any suitable organic film, any suitable inorganic film, and/or the like included in an encapsulation layer of another organic light-emitting device) may be additionally disposed between two different encapsulation units. In this manner, various suitable modifications may be made thereto. FIG. 1 illustrates an example in which n is 2.

The encapsulation layer 100 has a structure in which a first encapsulation unit 110 and a second encapsulation unit 120 are stacked in this order from the organic light-emitting diode 20. For example, in some embodiments, the encapsulation layer 100 includes two encapsulation units (n=2) as described above. The first encapsulation unit 110 includes a first inorganic layer 111 and a first organic layer 112 stacked in this order from the organic light-emitting diode 20, and the second encapsulation unit 120 includes a second inorganic film 121 and a second organic layer 122 stacked in this order from the organic light-emitting diode 20.

The first inorganic layer 111 and the second inorganic layer 121 serve to prevent moisture and/or oxygen of an external environment from penetrating into the organic light-emitting diode 20 (or serve to reduce a likelihood or amount of oxygen and/or moisture penetrating into the organic light-emitting diode 20).

A material for forming the first inorganic layer 111 and a material for forming the second inorganic layer 121 may be selected from any suitable inorganic materials available in the art as a material for an encapsulation layer. For example, the first inorganic layer 111 and the second inorganic layer 121 may each independently include at least one selected from a metal, metal oxide, metal nitride, metal oxynitride, metal carbide, metal carbonitride, metal sulfide, and metal selenide. In one embodiment, the first inorganic layer 111 and the second inorganic layer 121 may each independently include at least one selected from oxide, nitride, oxynitride, carbide, carbonitride, sulfide, or selenide of a metal selected from silicon, aluminum, zinc, titanium, tantalum, hafnium, zirconium, cerium, tungsten, tin, and copper. In one embodiment, the first inorganic layer 111 and the second inorganic layer 121 may each independently include at least one selected from silicon oxide, silicon nitride, silicon oxynitride, silicon carbide, silicon carbonitride, aluminum oxide, aluminum nitride, zinc oxide, titanium oxide, titanium nitride, tantalum oxide, tantalum nitride, hafnium oxide, hafnium nitride, zirconium oxide, zirconium nitride, cerium oxide, cerium nitride, tungsten oxide, tin oxide, tin nitride, and copper oxide. The first inorganic layer 111 and the second inorganic layer 121 may include the same material or different materials.

The suitable or optimal thicknesses of the first inorganic layer 111 and the second inorganic layer 121 may be determined according to productivity or device characteristics. For example, the first inorganic layer 111 and the second inorganic layer 121 may each independently have a thickness in a range of about 100 Å to about 3,000 Å, for example, about 100 Å to about 1,000 Å, but embodiments of the present disclosure are not limited thereto. When the first inorganic layer 111 and the second inorganic layer 121 are within any of these ranges, the encapsulation layer 100 may provide excellent sealing characteristics.

The first inorganic layer 111 and the second inorganic layer 121 may be formed by using chemical vapor deposition (CVD), plasma enhanced chemical vapor deposition (PECVD), atom layer deposition (ALD), vacuum deposition, or sputtering, but embodiments of the present disclosure are not limited thereto.

The first organic layer 112 and the second organic layer 122 may serve to planarize the lower structures of the first organic layer 112 and the second organic layer 122 and provide flexible characteristics to the encapsulation layer 100.

At least one selected from the first organic layer 112 and the second organic layer 122 may include an ultraviolet-absorbing material. The organic layer including the ultraviolet-absorbing material in the first organic layer 112 and the second organic layer 122 may be a layer that absorbs light having a wavelength of about 405 nm or less. The organic layer including the ultraviolet-absorbing material may absorb ultraviolet light from incident light and cause the remaining light to be incident on the organic layer 23 through the second electrode 25.

The ultraviolet-absorbing material may include at least one selected from a benzophenone-based compound, a cyanoacrylate-based compound, a benzotriazine-based compound, a benzotriazole-based compound, a triazine-based compound, an oxanilide-based compound, a salicylate-based compound, an ultraviolet-absorbing dye, and a photoluminescent material which absorbs ultraviolet light.

The ultraviolet-absorbing material may be a molecule having excited state intramolecular proton transfer (ESIPT) characteristics. The ultraviolet-absorbing material may include a site capable of forming a hydrogen bond within a molecule.

Figure 3:
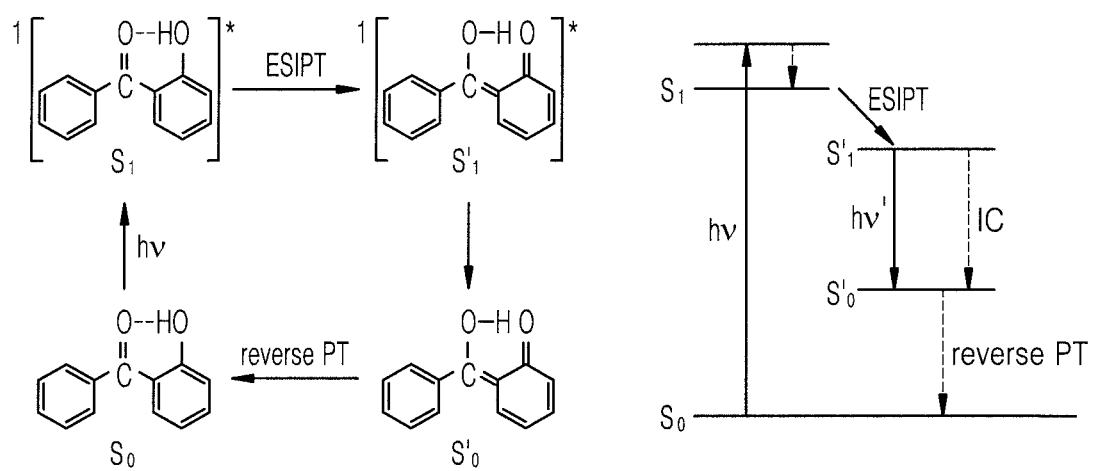
FIG. 3 is a flow chart illustrating a mechanism by which an ultraviolet-absorbing material absorbs ultraviolet light due to excited state intramolecular proton transfer (ESIPT)

FIG. 3 is a flow chart illustrating a mechanism by which a 2-hydroxybenzophenone molecule, which is a type (or kind) of the ultraviolet-absorbing material, absorbs ultraviolet light. A ground state molecule ($S_0$) may be excited by light (ultraviolet light) to become an excited state molecule ($S_1$). ESIPT is a phototautomerization process in which a proton moves within an excited molecule as illustrated in FIG. 3. In a molecule forming an intermolecular hydrogen bond, for example, a molecule having ESIPT characteristics with a structure of a proton donor such as —OH, —NH, and —SH groups and a proton acceptor such as N, O, S, and F, a keto form (e.g., a keto structure) is stable in a ground state, but an enol form (e.g., an enol structure) is stable in an excited state. Therefore, molecules having ESIPT characteristics release energy from an enol form (e.g., an enol structure) formed after proton transition within a very fast time (~ps) in an excited state. The excited state molecule ($S_1$) becomes an excited state tautomeric isomer molecule ($S_1'$) due to ESIPT, and then energy release occurs. Therefore, due to such characteristics, molecules having ESIPT characteristics may maximize (or increase) an energy difference (e.g., Stokes' shift) between absorption and release by such a mechanism. Therefore, when the molecules having ESIPT characteristics returns to the excited state from the excited state, the molecules may release light having a wavelength longer than that of ultraviolet light, or may release energy in the form of heat energy. The ground state tautomeric isomer ($S_0'$) may be isomerized again to the ground state molecule ($S_0$) by reverse proton transfer.

The ultraviolet-absorbing material may be included in at least one of the first organic layer 112 and the second organic layer 122 in a range of more than 0 wt % to about 5 wt %. When the ultraviolet-absorbing material is within this range, the first organic layer 112 and the second organic layer 122 may effectively absorb ultraviolet light.

The organic layer including the ultraviolet-absorbing material may have an absorptance of about 90% or more with respect to light having a wavelength of about 405 nm or less. The organic layer including the ultraviolet-absorbing material may have a transmittance of about 80% or more with respect to light having a visible light band.

The first organic layer 112 and the second organic layer 122 may include a cured product of an organic layer formation composition including a monomer, a photopolymerization initiator, and an ultraviolet-absorbing material.

The monomer included in the organic layer formation composition may include at least one selected from an acrylate-based compound, a methacrylate-based compound, an isoprene-based compound, a vinyl-based compound, an epoxy-based compound, a urethane-based compound, a cellulose-based compound, a perylene-based compound, and an imide-based compound.

In one embodiment, the monomer may include at least one selected from an acrylate compound and a methacrylate-based compound.

In one embodiment, the acrylate compound may be represented by Formula 1:

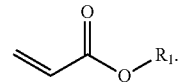

Formula 1

In Formula 1,
$R_1$ may be selected from:
hydrogen, deuterium, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, and a $C_1$-$C_{30}$ heteroaryl group; and a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, and a $C_1$-$C_{30}$ heteroaryl group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, a $C_6$-$C_{30}$ aryloxy group, a $C_6$-$C_{30}$ aryloxy group substituted with a $C_6$-$C_{30}$ aryl group, a $C_6$-$C_{30}$ arylthio group, and a $C_1$-$C_{30}$ heteroaryl group.

In one embodiment, the acrylate compound may be selected from 2-phenylphenoxyethyl acrylate, methyl acrylate, ethyl acrylate, n-propyl acrylate, isopropyl acrylate, n-butyl acrylate, isoamyl acrylate, isobutyl acrylate, isooctyl acrylate, sec-butyl acrylate, t-butyl acrylate, n-pentyl acrylate, 3-methylbutyl acrylate, n-hexyl acrylate, 2-ethyl-n-hexyl acrylate, n-octyl acrylate, cyclohexyl acrylate, isobornyl acrylate, dicyclopentanyl acrylate, dicyclopentanyloxyethyl acrylate, isomyristyl acrylate, lauryl acrylate, methoxydipropyleneglycol acrylate, methoxytripropyleneglycolacrylate, benzyl acrylate, 2-hydroxy ethyl acrylate, 2-hydroxy propyl acrylate, 3-hydroxy propyl acrylate, 4-hydroxy butyl acrylate, 5-hydroxy pentyl acrylate, 6-hydroxy hexyl acrylate, 4-hydroxy cyclohexyl acrylate, neopentylglycol monoacrylate, 3-chloro-2-hydroxy propyl acrylate, (1,1-dimethyl-3-oxobutyl) acrylate, 2-acetoacetoxy ethyl acrylate, 2-methoxyethyl acrylate, 2-ethoxyethyl acrylate, neopentylglycol monoacrylate, ethyleneglycol monomethylether acrylate, glycerin monoacrylate, 2-acryloyloxyethyl phthalate, 2-acryloyloxy 2-hydroxy ethyl phthalate, 2-acryloyloxyethyl hexahydrophthalate, 2-acryloyloxy propylphthalate, neopentylglycol benzoate acrylate, nonylphenoxypolyethyleneglycol acrylate, nonylphenoxypolypropyleneglycol acrylate, para-cumylphenoxyethyleneglycol acrylate, ECH denatured phenoxyl acrylate, phenoxyethyl acrylate, phenoxydiethyleneglycol acrylate, phenoxyhexaethyleneglycol acrylate, phenoxytetraethyleneglycol acrylate, polyethyleneglycol acrylate, polyethyleneglycol phenylether acrylate, polyethyleneglycol-polypropyleneglycol acrylate, polypropyleneglycol acrylate, stearyl acrylate, ethoxylated phenol acrylate (phenol (EO) acrylate), ethoxylated cresol acrylate, dipropyleneglycol acrylate, ethoxylated phenylacrylate, ethoxylated succinic acid acrylate, tert-butyl acrylate, tribromophenyl acrylate, ethoxylated tribromophenyl acrylate, tridodecyl acrylate, and tetrahydofurfuryl acrylate, but embodiments of the present disclosure are not limited thereto.

For example, the acrylate compound may be 2-phenylphenoxyethyl acrylate.

In one embodiment, the monomer may include at least one selected from dimethacrylate compound and at least one selected from monomethacrylate compound.

In one embodiment, the dimethacrylate compound may be selected from:
a compound represented by Formula 2; and
ethyleneglycol dimethacrylate, diethyleneglycol dimethacrylate, triethyleneglycol dimethacrylate, propyleneglycol dimethacrylate, dipropyleneglycol dimethacrylate, neopentyl glycol dimethacrylate, 1,4-butandiol dimethacrylate, 1,6-hexanediol dimethacrylate, bisphenol A dimethacrylate, pentaerythritol dimethacrylate, and dipentaerythritol dimethacrylate:

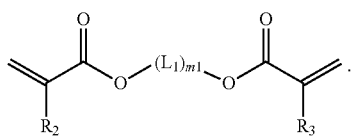

Formula 2

In Formula 2,
$L_1$ may be —O—, —S—, $S(=O)_2$—, —C(=O)—, —C(=O)O—, —C(=O)NH—, —N($R_6$)—, —C($R_6$)($R_7$)—, —Si($R_6$)($R_7$)—, or an unbranched $C_6$-$C_{20}$ alkylene group,
m1 may be an integer from 1 to 10,
$R_2$ and $R_3$ may each independently be selected from:
hydrogen, deuterium, a $C_1$-$C_{20}$ alkyl group, a $C_2$-$C_{20}$ alkenyl group, a $C_2$-$C_{20}$ alkynyl group, a $C_1$-$C_{20}$ alkoxy group; and a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, a $C_6$-$C_{30}$ aryloxy group, a $C_6$-$C_{30}$ aryloxy group substituted with a $C_6$-$C_{30}$ aryl group, a $C_6$-$C_{30}$ arylthio group, and a $C_1$-$C_{30}$ heteroaryl group.

For example, at least one dimethacrylate may be 1,12-dodecanediol dimethacrylate.

In one embodiment, the monomethacrylate compound may be selected from biphenyloxy ethyl methacrylate, methyl methacrylate, ethyl methacrylate, n-propyl methacrylate, isopropyl methacrylate, n-butyl methacrylate, isoamyl methacrylate, isobutyl methacrylate, isooctyl methacrylate, sec-butyl methacrylate, t-butyl methacrylate, n-pentyl methacrylate, 3-methylbutyl methacrylate, n-hexyl methacrylate, 2-ethyl-n-hexyl methacrylate, n-octyl methacrylate, cyclohexyl methacrylate, isobornyl methacrylate, dicyclopentanyl methacrylate, dicyclopentanyloxyethyl methacrylate, isomyristyl methacrylate, lauryl methacrylate, methoxydipropyleneglycol methacrylate, methoxytripropyleneglycolmethacrylate, benzyl methacrylate, 2-hydroxy ethyl methacrylate, 2-hydroxy propyl methacrylate, 3-hydroxy propyl methacrylate, 4-hydroxy butyl methacrylate, 5-hydroxy pentyl methacrylate, 6-hydroxy hexyl methacrylate, 4-hydroxy cyclohexyl methacrylate, neopentylglycol monomethacrylate, 3-chloro-2-hydroxy propyl methacrylate, (1,1-dimethyl-3-oxobutyl) methacrylate, 2-acetoacetoxyethyl methacrylate, 2-methoxyethyl methacrylate, 2-ethoxyethyl methacrylate, neopentylglycol monomethacrylate, ethyleneglycol monomethylether methacrylate, glycerin monomethacrylate, 2-acryloyloxyethyl phthalate, 2-acryloyloxy 2-hydroxy ethyl phthalate, 2-acryloyloxyethyl hexahydrophthalate, 2-acryloyloxy propylphthalate, neopentylglycol benzoate methacrylate, nonylphenoxypolyethyleneglycol methacrylate, nonylphenoxypolypropyleneglycol methacrylate, para-cumylphenoxyethyleneglycol methacrylate, ECH denatured phenoxyl acrylate, phenoxyethyl methacrylate, phenoxydiethyleneglycol methacrylate, phenoxyhexaethyleneglycol methacrylate, phenoxytetraethyleneglycol methacrylate, polyethyleneglycol methacrylate, polyethyleneglycol phenylether methacrylate, polyethyleneglycol-polypropyleneglycol methacrylate, polypropyleneglycol methacrylate, stearyl methacrylate, ethoxylated phenol acrylate (phenol (EO) acrylate), ethoxylated cresol methacrylate, dipropyleneglycol methacrylate, ethoxylated phenylmethacrylate, ethoxylated succinic acid methacrylate, tert-butyl methacrylate, tribromophenyl methacrylate, ethoxylated tribromophenyl methacrylate, tridodecyl methacrylate, and tetrahydofurfuryl methacrylate, but embodiments of the present disclosure are not limited thereto.

In one embodiment, the at least one organic layer included in the encapsulation layer may be formed from an organic layer formation composition in which an ultraviolet-absorbing material is included in a polymer formation monomer in a range of about 5 wt % or less. For example, at least one selected from the first organic layer 112 and the second organic layer 122 may be formed from an organic layer formation composition in which an ultraviolet-absorbing material is included in an acrylate-based monomer in a range of about 5 wt % or less.

In one embodiment, the photopolymerization initiator may use any suitable initiators available in the art without special limitation. For example, an initiator capable of being cured at a wavelength of about 360 nm to about 450 nm may be used.

In one embodiment, the organic layer formation composition may further include two or more types (or kinds) of photopolymerization initiator. For example, among the two or more types (or kinds) of the photopolymerization initiator, one type (or kind) may be cured in a UV region (for example, a wavelength of about 360 nm to about 450 nm), and another type (or kind) may be cured in a visible light region (for example, a wavelength of about 450 nm to about 770 nm). In one or more embodiments, the two or more types (or kinds) of the photopolymerization initiator may be all cured in the UV region, but the two or more types (or kinds) of the photopolymerization initiators may be all cured in the visible light region.

Examples of the photopolymerization initiator may include an acetophenone-based compound, a benzophenone-based compound, a thioxanthone-based compound, a benzoin-based compound, a triazine-based compound, an acylphosphine oxide-based compound, and an oxime-based compound.

Examples of the acetophenone-based compound may include 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropane-1-one, and 2-benzyl-2-dimethylamino-1-(4-morpholinophenyl)-butane-1-one.

Examples of the benzophenone-based compound may include benzophenone, benzoyl benzoic acid, methyl benzoyl benzoic acid, 4-phenyl benzophenone, hydroxy benzophenone, acrylated benzophenone, 4,4'-bis(dimethyl amino) benzophenone, 4,4'-bis(diethylamino)benzophenone, 4,4'-dimethylaminobenzophenone, 4,4'-dichlorobenzophenone, and 3,3'-dimethyl-2-methoxybenzophenone.

Examples of the thioxanthone-based compound may include thioxanthone, 2-methylthioxanthone, isopropyl thioxanthone, 2,4-diethyl thioxanthone, 2,4-diisopropyl thioxanthone, and 2-chlorothioxanthone.

Examples of the benzoin-based compound may include benzoin, benzoin methyl ether, benzoin ethyl ether, benzoin isopropyl ether, benzoin isobutyl ether, and benzyldimethyl ketal.

Examples of the triazine-based compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolryl)-4,6-bis(trichloro methyl)-s-triazine, 2-biphenyl-4,6-bis(trichloro methyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-bis(trichloromethyl)-6-piperonyl-s-triazine, and 2-4-bis(trichloromethyl)-6-(4-methoxystyryl)-s-triazine.

Examples of the acylphosphine oxide-based compound may include 2,4,6-trimethylbenzoyl diphenylphosphineoxide (TPO), bis(2,4,6-trimethylbenzoyl) phenylphosphineoxide, and 2,4,6-trimethylbenzoylphenylethoxyphosphineoxide.

Examples of the oxime-based compound may include O-acyloxim-based compound, 1,2-octanedion, 2-(O-benzoyloxime)-1-[4-(phenylthio)phenyl]-1,2-octanedione, 1-(O-acetyloxime)-1-[9-ethyl-6-(2-methylbenzoyl)-9H-carbazole-3-yl]ethanone, and O-ethoxycarbonyl-α-oxyamino-1-phenylpropane-1-one, and examples of the O-acyloxime-based compound may include 2-dimethylamino-2-(4-methylbenzyl)-1-(4-morpholine-4-yl-phenyl)-butane-1-one, 1-(4-phenylsulfanylphenyl)-butane-1,2-dione-2-oxime-O-benzoate, 1-(4-phenylsulfanylphenyl)-octane-1,2-dione-2-oxime-O-benzoate, 1-(4-phenylsulfanylphenyl)-octane-1-oneoxime-O-acetate, and 1-(4-phenylsulfanylphenyl)-butane-1-oneoxime-O-acetate.

The photopolymerization initiator may include, in addition to the above-described compounds, an organic peroxide-based compound, a carbazole-based compound, a diketone-based compound, a sulfonium borate-based compound, an azo-based compound, an imidazole-based compound, a non-imidazole-based compound, and a fluorene-based compound.

An amount of the photopolymerization initiator may be in a range of about 0.5 parts by weight to about 5 parts by weight based on 100 parts by weight of the organic layer formation composition.

The suitable or optimal thicknesses of the first organic layer 112 and the second organic layer 122 may be determined according to productivity or device characteristics. The thicknesses of the first organic layer 112 and the second organic layer 122 may each independently be in a range of about 0.1 μm to about 30 μm, for example, about 1 μm to about 30 μm, but embodiments of the present disclosure are not limited thereto. The thickness of the first organic layer 112 and the second organic layer 122 may be identical to or different from each other.

The first organic layer 112 and the second organic layer 122 may be formed by flash evaporation, ink-jet printing, screen printing, dip coating, or spin coating, but embodiments of the present disclosure are not limited thereto. For example, after the organic layer formation composition is coated by the above-described process, the first organic layer 112 and the second organic layer 122 may be formed through additional UV curing or thermal curing.

After the organic light-emitting diode 20 is manufactured, the encapsulation layer 100 may be manufactured on the organic light-emitting diode 20 by using organic/inorganic cross-deposition with respect to the organic layer and the inorganic layer.

The thickness of the encapsulation layer 100 may be in a range of about 0.1 μm to about 500 μm, but embodiments of the present disclosure are not limited thereto. When the encapsulation layer 100 has the above-described thickness, the encapsulation layer 100 may effectively prevent moisture and/or oxygen from penetrating into the light-emitting diode 20 (or may effectively reduce a likelihood or amount of moisture and/or oxygen penetrating into the light-emitting diode 20) and may have flexible characteristics and ultraviolet-absorbing characteristics.

Figure 4A:
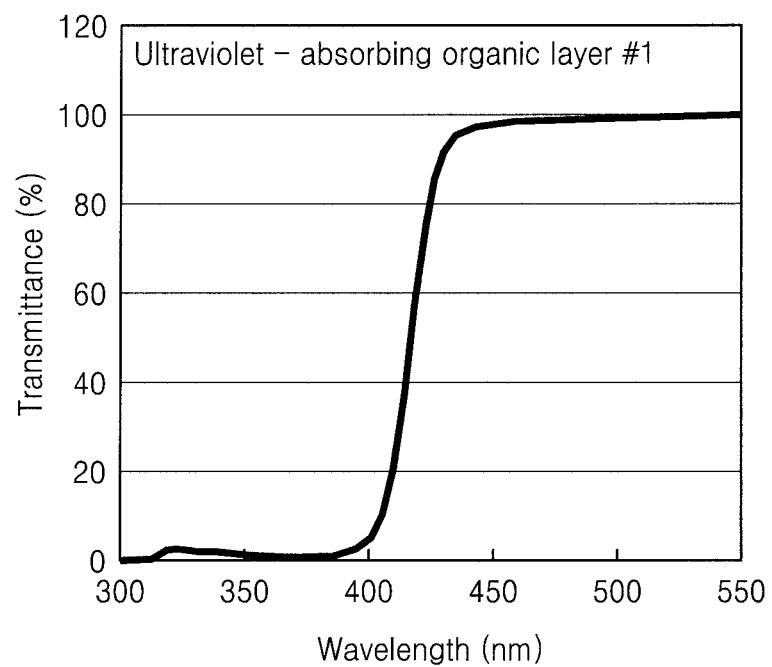
FIGS. 4A-4B are graphs and tables showing a change in transmittance according to a wavelength of incident light in an ultraviolet-absorbing organic layer, according to an embodiment.
Figure 4B:
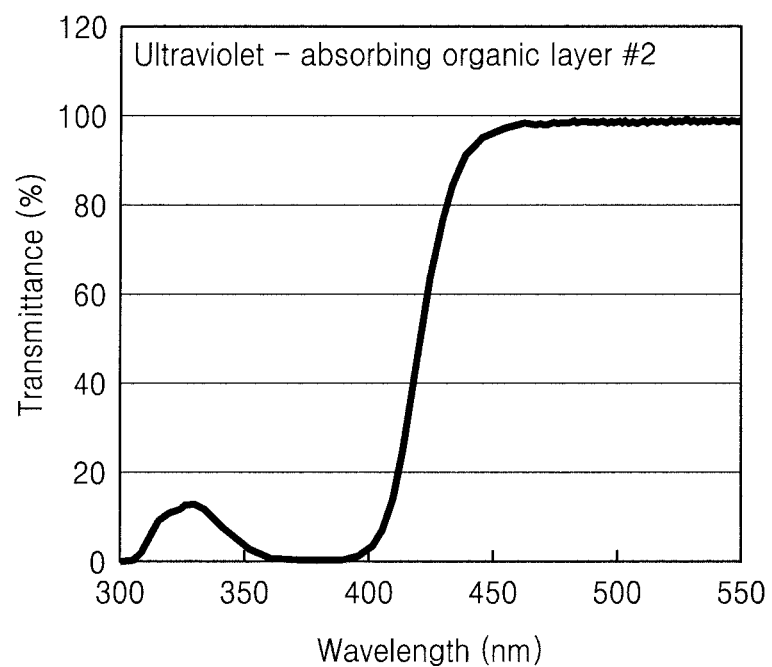

FIGS. 4A-4B are graphs showing a change in transmittance according to a wavelength of incident light in an ultraviolet-absorbing organic layer according to an embodiment. In FIGS. 4A-4B, the horizontal axis represents the wavelength of light, and the vertical axis represents the transmittance of light.

Referring to FIGS. 4A-4B, the ultraviolet-absorbing organic layer according to the embodiment may have a transmittance of about 80% or more with respect to external light having a wavelength of about 430 nm or more. The transmittance for the external light may be adjusted to various suitable values according to the type (or kind), combination, and concentration of the ultraviolet-absorbing materials, the thickness of the organic layer in which the ultraviolet-absorbing material is dispersed, and the like.

In addition, referring to FIGS. 4A-4B, the ultraviolet-absorbing organic layer according to the embodiment may have a transmittance of about 10% or less with respect to external light having a wavelength of about 405 nm or less. For example, the ultraviolet-absorbing organic layer according to the embodiment may have an absorptance of about 90% or more with respect to light having a wavelength of about 405 nm or less.

In the organic light-emitting device according to the embodiment, an organic layer included in a thin film encapsulation layer may include an ultraviolet-absorbing material. Therefore, the encapsulation layer may absorb ultraviolet light without attaching an additional ultraviolet blocking layer to the outside of the encapsulation layer of the organic light-emitting device. Therefore, it is possible to form the encapsulation layer which may absorb ultraviolet light without an additional process of attaching an ultraviolet blocking layer. In addition, since the additional ultraviolet blocking layer is not used, the total thickness of the encapsulation layer may be reduced.

Ultraviolet-Reflective Layer 200

The ultraviolet-reflective layer 200 may be an inorganic layer consisting of an inorganic material. The ultraviolet-reflective layer 200 may be a multi-layered film including two or more layers having different refractive indices. The ultraviolet-reflective layer 200 may include at least one first inorganic film having a first refractive index, and at least one second inorganic film having a second refractive index different from the first refractive index, and the first inorganic film and the second inorganic film may be alternately stacked.

The ultraviolet-reflective layer 200 may be a layer that reflects light having a wavelength of about 405 nm or less. The ultraviolet-reflective layer 200 may reflect ultraviolet light due to optical interference by adjusting the refractive index and the thickness of each inorganic film stacked with at least two layers. In one embodiment, the thickness of each inorganic film stacked with at least two layers may be identical to or different from each other.

The ultraviolet-reflective layer 200 may have a structure in which m stacking units are sequentially stacked from the encapsulation layer 100, wherein m may be an integer of 3 or more, for example, an integer from 3 to 30. For example, m may be an integer from 3 to 20, but embodiments of the present disclosure are not limited thereto. The stacking unit includes a first inorganic film having a first refractive index, and a second inorganic film having a second refractive index different from the first refractive index.

The repeating number of the stacking units may be variously and suitably changed according to luminescent efficiency of the organic light-emitting diode. For example, the ultraviolet-reflective layer 200 may include three or more stacking units. FIG. 1 illustrates an example in which m is 3.

The ultraviolet-reflective layer 200 may have a structure in which a first stacking unit 210, a second stacking unit 220, and a third stacking unit 230 are stacked in this order from the encapsulation layer 100. For example, in some embodiments, the ultraviolet-reflective layer 200 includes three stacking units (m=3) as described above. The first stacking unit 210 may include a first inorganic film 211 and a second inorganic film 212 stacked in this order from the encapsulation layer 100. The second stacking unit 212 may include a first inorganic film 211 and a second inorganic film 212 stacked in this order from the encapsulation layer 100. The third stacking unit 230 may include a first inorganic film 211 and a second inorganic film 212 stacked in this order from the encapsulation layer 100.

The first inorganic film 211 may have a first refractive index, and the second inorganic film 212 may have a second refractive index different from the first refractive index. For example, the first refractive index may be greater than the second refractive index, or the first refractive index may be less than the second refractive index. The first refractive index and the second refractive index may each independently be selected in a range of about 1.4 to 2.0.

In one embodiment, a difference between the first refractive index and the second refractive index may be about 0.15 or more.

In one embodiment, when the first refractive index is greater than the second refractive index, the first refractive index may be selected in a range of about 1.6 to about 2.0, and the second refractive index may be selected in a range of about 1.4 to about 1.5. In one or more embodiments, when the first refractive index is less than the second refractive index, the first refractive index may be selected in a range of about 1.4 to about 1.5, and the second refractive index may be selected in a range of about 1.6 to about 2.0.

The thicknesses of the first inorganic film 211 and the second inorganic film 212 may each independently be in a range of about 100 Å to about 3,000 Å. The thicknesses of the first inorganic film 211 and the second inorganic film 212 may be identical to or different from each other.

The first inorganic film 211 and the second inorganic film 212 may each independently include at least one selected from a metal, metal oxide, metal nitride, metal oxynitride, metal carbide, metal carbonitride, metal sulfate, and metal selenide. In one embodiment, the first inorganic film 211 and the second inorganic film 212 may each independently include at least one selected from oxide, nitride, oxynitride, carbide, carbonitride, sulfate, or selenide of a metal selected from silicon, aluminum, zinc, titanium, tantalum, hafnium, zirconium, cerium, tungsten, tin, and copper. In one embodiment, the first inorganic film 211 and the second inorganic film 212 may each independently include at least one selected from silicon oxide, silicon nitride, silicon oxynitride, silicon carbide, silicon carbonitride, aluminum oxide, aluminum nitride, zinc oxide, titanium oxide, titanium nitride, tantalum oxide, tantalum nitride, hafnium oxide, hafnium nitride, zirconium oxide, zirconium nitride, cerium oxide, cerium nitride, tungsten oxide, tin oxide, tin nitride, and copper oxide.

For example, the first inorganic film 211 may be silicon nitride, and the second inorganic film 212 may be silicon oxide. Since silicon nitride has a refractive index of about 1.9 and silicon oxide has a refractive index of about 1.5, silicon nitride corresponds to a relatively high refractive index material, and silicon oxide corresponds to a relative low refractive index material. The ultraviolet-reflective layer 200 may be formed by alternately stacking silicon nitride and silicon oxide. The ultraviolet-reflective layer 200, in which silicon nitride and silicon oxide are alternately stacked, may reflect ultraviolet light due to optical interference of films having different refractive indices.

The first inorganic film 211 and the second inorganic film 212 may be formed by using chemical vapor deposition (CVD), plasma enhanced chemical vapor deposition (PECVD), atom layer deposition (ALD), vacuum deposition, or sputtering. For example, the first inorganic film 211 and the second inorganic film 212 may be formed by using the chemical deposition method, such as CVD, PECVD, or ALD, but embodiments of the present disclosure are not limited thereto.

When the inorganic film is formed by using the chemical deposition method, the composition of a thin film may be controlled by adjusting gases used in the reaction during the processes. For example, a thin film to be formed may change to a silicon nitride film by reducing the supply of oxygen source gas during deposition of a silicon oxide film, or stopping the supply of oxygen source gas and supplying nitrogen source gas. In this manner, inorganic films having a great refractive index difference, such as a silicon oxide film and a silicon nitride film, may be deposited during one process by adjusting source gases. In one embodiment, an inorganic film having excellent uniformity may be formed by more precisely performing the same (e.g., substantially the same) process by using an atom layer deposition apparatus.

When the first inorganic film 221 and the second inorganic film 212 are formed by using CVD, PECVD, or ALD, the interface of the first inorganic film 211 and the second inorganic film 212 may form a concentration gradient of a high refractive index material and a low refractive index material due to process characteristics of the chemical deposition method.

The ultraviolet-reflective layer 200 may have a thickness in a range of about 3,000 Å to about 30,000 Å, for example, about 3,000 Å to about 20,000 Å. When the ultraviolet-reflective layer 200 is within any of these ranges, the ultraviolet-reflective layer 200 may effectively reflect ultraviolet light and maximize (or increase) transmittance of light having a visible light band.

The ultraviolet-reflective layer 200 may have a reflectance of about 90% or more with respect to light having a wavelength of about 405 nm or less. The ultraviolet-reflective layer 200 may have a transmittance of about 80% or more with respect to light having a visible light band.

Figure 5:
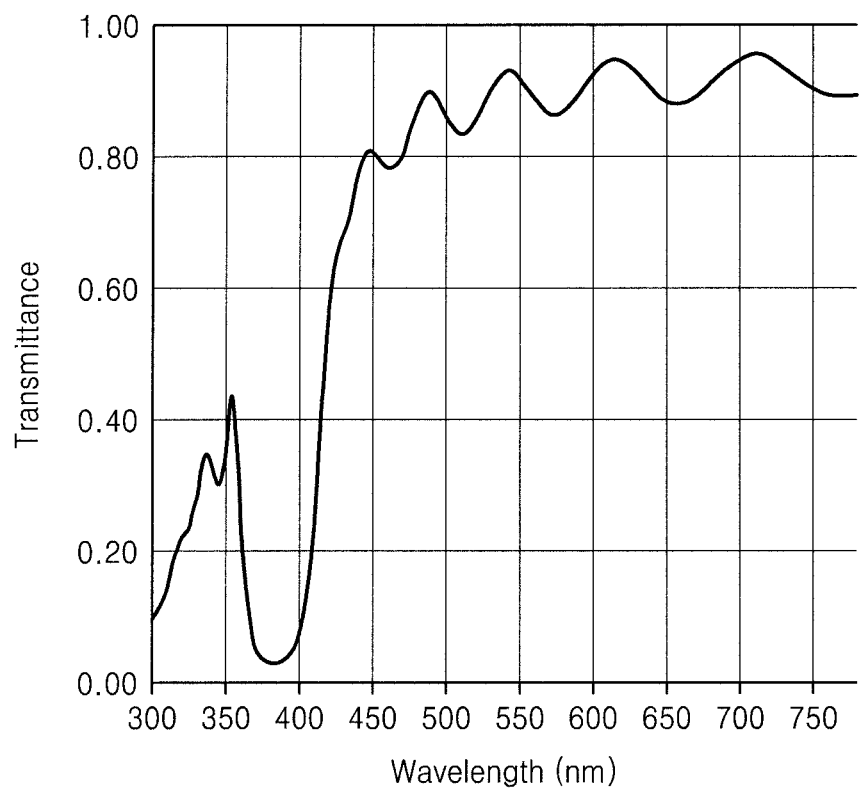
FIG. 5 is a graph showing a change in transmittance according to a wavelength of incident light in a reflective layer, according to an embodiment.

FIG. 5 is a graph showing a change in transmittance according to a wavelength of light in a reflective layer according to an embodiment. In FIG. 5, the horizontal axis represents the wavelength of light, and the vertical axis represents the transmittance of light.

Referring to FIG. 5, the reflective layer according to the embodiment may have a transmittance of about 80% or more with respect to external light having a wavelength of about 430 nm or more. The transmittance with respect to the external light may be changed to various suitable values according to the type (or kind) and combination of the inorganic material included in the reflective layer, the thickness of the inorganic material, or the like.

In addition, referring to FIG. 5, the reflective layer according to the embodiment may have a transmittance of about 10% or less with respect to external light having a wavelength of about 360 nm to about 405 nm. For example, the reflective layer according to the embodiment may have a reflectance of about 90% or more with respect to light having a wavelength of about 360 nm to about 405 nm.

Figure 6:
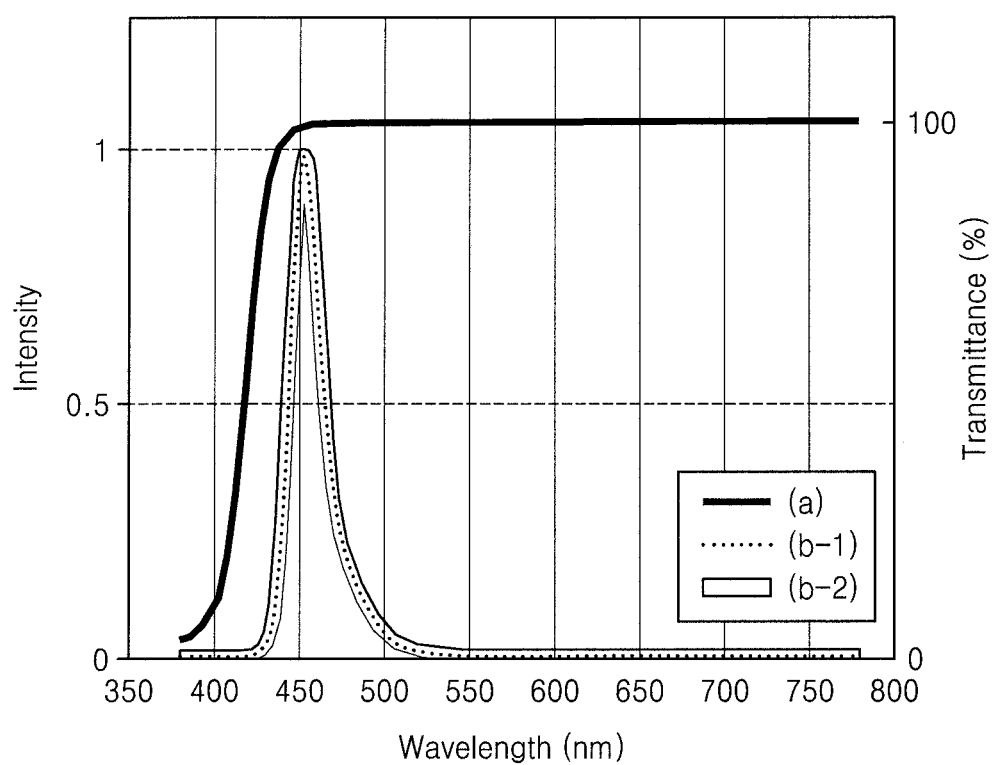
FIG. 6 is a graph showing a change in transmittance according to a wavelength of incident light and a change in intensity according to a wavelength of emitted light in an organic light-emitting device, according to an embodiment.

FIG. 6 is a graph showing a change in transmittance according to a wavelength of incident light and a change in intensity according to a wavelength of emitted light in an organic light-emitting device according to an embodiment. In FIG. 6, the horizontal axis represents the wavelength of light, the vertical axis on the left side of the graph represents the intensity of light, and the vertical axis on the right side of the graph represents the transmittance of light. In addition, the graphs illustrated in FIG. 6 show the measurement results for the organic light-emitting device having no polarizing plate.

The graph of line (a) of FIG. 6 shows the change in transmittance according to the wavelength of light incident on the organic light-emitting device according to the embodiment. As shown in the graph (a), the organic light-emitting device according to the embodiment may have a transmittance of about 80% or more with respect to external light having a wavelength of about 430 nm or more. The transmittance with respect to the external light may be adjusted to various suitable values according to the type (or kind), combination, and concentration of the ultraviolet-absorbing material included in the organic layer, the thickness of the organic layer in which the ultraviolet-absorbing material is dispersed, the type (or kind) and combination of the inorganic material included in the reflective layer, the thickness of the inorganic film, or the like.

In addition, referring to FIG. 6, the organic light-emitting device may have a transmittance of about 10% or less with respect to external light having a wavelength of about 405 nm or less. For example, the organic light-emitting device according to the embodiment may have an absorptance of about 90% or more with respect to light having a wavelength of about 405 nm or less.

The graph of line (b-1) of FIG. 6 shows a change in intensity according to a wavelength of blue light emitted by a general organic light-emitting device, and the graph of line (b-2) of FIG. 6 shows a change in intensity according to a wavelength of blue light emitted by the organic light-emitting device according to an embodiment of the present disclosure. For example, when the light emitted by the organic light-emitting device is blue light, green light, and red light, the blue light having a wavelength band closest to an ultraviolet light wavelength band is greatly influenced on the organic light-emitting device's degree of absorption of ultraviolet light. For example, the transmittance for the light between a visible light wavelength band and an ultraviolet light wavelength band may also be reduced in the process during which the organic light-emitting device absorbs the light of the ultraviolet light wavelength band. Thus, the luminescent efficiency of the blue light emitted by the organic light-emitting device may also be deteriorated. Referring to the graphs (b-1) and (b-2) of FIG. 6, as shown in the graph (a), when the transmittance with respect to the light having a wavelength of about 430 nm corresponding to the minimum value of the blue light wavelength band and the light having a wavelength of more than about 430 nm is about 80% or more, there is almost no difference between the intensity of the blue light of the general organic light-emitting device and the intensity of the blue light of the organic light-emitting device (including an encapsulation layer absorbing and reflecting ultraviolet light) according to the embodiment. For example, when the transmittance with respect to the external light having a wavelength of about 430 nm or more is about 80%, the decrease in the width of the luminescent efficiency of the blue light may be within about 2%.

Lower Organic Layer 311

The encapsulation layer 100 of the organic light-emitting device 1 may further include a lower organic layer 311 between the organic light-emitting diode 20 and the first encapsulation unit 110. The lower organic layer 311 may serve to planarize the lower structure of the encapsulation layer 100 and provide flexible characteristics to the encapsulation layer 100. The lower organic layer 311 may include an ultraviolet-absorbing material. The ultraviolet-absorbing material may include the above-described ultraviolet-absorbing material. The lower organic layer 311 may be understood by referring to the description about the first organic layer 112.

Figure 2:
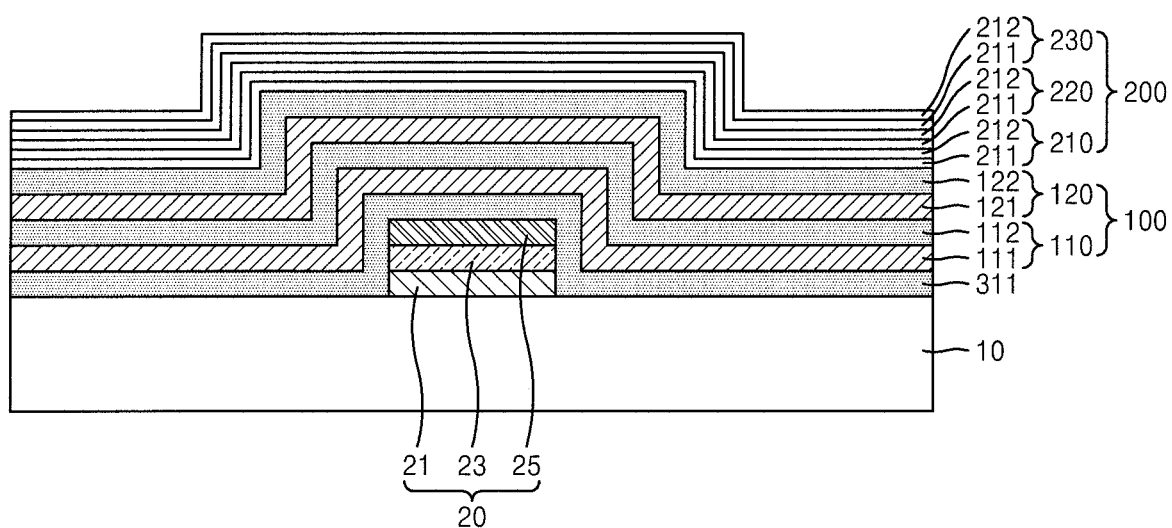
FIG. 2 is a schematic cross-sectional view of the structure of an organic light-emitting device according to an embodiment.

FIG. 2 is a schematic view of the structure of an organic light-emitting device according to an embodiment.

The organic light-emitting device 2 of FIG. 2 includes a substrate 10, an organic light-emitting diode 20 on the substrate 10, an encapsulation layer 100 on the organic light-emitting diode 20, and an ultraviolet-reflective layer 200, and includes a lower organic layer 311 between the organic light-emitting diode 20 and the encapsulation layer 100. The substrate 10 and the organic light-emitting diode 20 are the same (e.g., substantially the same) as those of FIG. 1.

The encapsulation layer 100 may have a structure in which a first encapsulation unit 110 and a second encapsulation unit 120 are stacked in this order from the organic light-emitting diode 20. The first encapsulation unit 110 and the second encapsulation unit 120 are the same (e.g., substantially the same) as described above.

The lower organic layer 311 may be disposed between the organic light-emitting diode 20 and the first encapsulation unit 110.

The ultraviolet-reflective layer 200 may have a structure in which a first stacking unit 210, a second stacking unit 220, and a third stacking unit 230 are stacked in this order from the encapsulation layer 100. The first stacking unit 210, the second stacking unit 220, and the third stacking unit 230 are the same (e.g., substantially the same) as described above.

A method of manufacturing the organic light-emitting device 1 of FIG. 1 will be described below.

First, an organic light-emitting diode 20 is formed on a substrate 10. A method of forming a first electrode 21 and a second electrode 25 of the organic light-emitting diode 20 are the same (e.g., substantially the same) as described above.

Layers included in the organic layer 23 (for example, a hole injection layer, a hole transport layer, a buffer layer, an electron transport layer, an electron injection layer, or the like) may be formed by using various suitable methods, such as vacuum deposition, spin coating, casting, Langmuir-Blodgett (LB) deposition, ink-jet printing, laser printing, or laser induced thermal imaging (LITI). When the layers included in the organic layer 23 are each formed by vacuum deposition, a deposition condition may be selected within a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed. Meanwhile, when the layers included in the organic layer 23 are each formed by spin coating, a coating condition may be selected within a coating speed of about 2,000 rpm to about 5,000 rpm and a heat treatment temperature of about 80° C. to about 200° C. (heat treatment temperature for removing a solvent after coating) by taking into account a material to be included in a layer to be formed and the structure of a layer to be formed.

Then, an encapsulation layer 100 is formed on the organic light-emitting diode 20 and the substrate 10. Embodiments of a method of forming the encapsulation layer 100 will now be described in more detail.

The encapsulation layer 100 may be formed by alternately stacking at least one inorganic layer and at least one organic layer. The first inorganic layer 111 may be formed on the organic light-emitting diode 20. The first inorganic layer 111 may be formed by using CVD, PECVD, ALD, vacuum deposition, or sputtering, but embodiments of the present disclosure are not limited thereto. The material and thickness of the first inorganic layer 111 are the same (e.g., substantially the same) as described above.

Then, a first organic layer 112 is formed on the first inorganic layer 111, thereby forming a first encapsulation unit 110. The first organic layer 112 may be formed by using flash evaporation, ink-jet printing, screen printing, dip coating, or spin coating, but embodiments of the present disclosure are not limited thereto. The material and thickness of the first organic layer 112 are the same (e.g., substantially the same) as described above.

Then, a second inorganic layer 121 may be formed on the first organic layer 112, and a second organic layer 122 is formed on the second inorganic layer 121, thereby forming a second encapsulation unit 120. The materials, thicknesses, and forming methods of the second inorganic layer 121 and the second organic layer 122 are the same (e.g., substantially the same) as those of the first inorganic layer 111 and the first organic layer 112.

At least one selected from the first organic layer 112 and the second organic layer 122 may include an ultraviolet-absorbing material.

In this manner, the first encapsulation unit 110 and the second encapsulation unit 120 are formed to thereby form the encapsulation layer 100.

Then, an ultraviolet-reflective layer 200 is formed on the encapsulation layer 100. Embodiments of a method of forming the ultraviolet-reflective layer 200 will now be described in more detail.

The ultraviolet-reflective layer 200 may be formed by alternately stacking inorganic films having different refractive indices. A first inorganic film 211 is formed on the encapsulation layer 100. The first inorganic film 211 may be formed by using CVD, PECVD, ALD, vacuum deposition, or sputtering, but embodiments of the present disclosure are not limited thereto. The material and thickness of the first inorganic layer 211 are the same (e.g., substantially the same) as descried above.

Then, a second inorganic film 212 is formed on the first inorganic film 211, thereby forming a first stacking unit 210. The second inorganic film 212 may be formed by using CVD, PECVD, ALD, vacuum deposition, or sputtering, but embodiments of the present disclosure are not limited thereto. The material and thickness of the second inorganic film 212 are the same (e.g., substantially the same) as described above.

A first inorganic film 211 is formed on the second inorganic film 212 of the first stacking unit 210, and a second inorganic film 212 is formed on the first inorganic film 211, thereby forming a second stacking unit 220. A first inorganic film 211 is formed on the second inorganic film 212 of the second stacking unit 220, and a second inorganic film 212 is formed on the first inorganic film 211, thereby forming a third stacking unit 230. In this manner, the first stacking unit 210, the second stacking unit 220, and the third stacking unit 230 are formed to thereby form the ultraviolet-reflective layer 200.

As described above, the ultraviolet-reflective layer 200 may be formed by repeatedly forming the stacking unit in which the first inorganic film 211 and the second inorganic film 212 are stacked. In some embodiments, one or more stacking units may be additionally formed on the third stacking unit 230. Since the ultraviolet-reflective layer 200 is formed as a multi-layered film in which the first inorganic film 211 and the second inorganic film 212 having different refractive indices are alternately stacked, ultraviolet light may be reflected through optical interference by adjusting the refractive indices and thicknesses of the first inorganic film 211 and the second inorganic film 212.

The organic light-emitting device has been described with reference to the organic light-emitting device 1 of FIG. 1, but the organic light-emitting device is not limited to the organic light-emitting device 1 of FIG. 1. For example, n in the encapsulation layer of the organic light-emitting device may be an integer of 1 or more, for example, an integer from 1 to 10. In one embodiment, n in the encapsulation layer of the organic light-emitting device may be 1, 2, 3, 4, or 5, but embodiments of the present disclosure are not limited thereto. Meanwhile, when the encapsulation layer includes two or more encapsulation layers, another layer (for example, any suitable organic film and/or any suitable inorganic film included in an encapsulation layer of another organic light-emitting diode) may be additionally disposed between two different encapsulation layers. In this manner, various suitable modifications may be made thereto. In addition, m in the ultraviolet-reflective layer of the organic light-emitting device may be an integer of 3 or more, for example, an integer from 3 to 10, but embodiments of the present disclosure are not limited thereto.

As illustrated in FIG. 2, when a lower organic layer 311 is formed between the light-emitting diode 20 and the first encapsulation unit 110, one lower organic layer 311 is formed on the light-emitting diode 20 before the encapsulation layer 100 is formed. The material, thickness, and forming method of the lower organic layer 311 are the same (e.g., substantially the same) as those of the first organic layer 112.

Meanwhile, in some embodiments, the organic layer 23 may further include a hole transport region between the first electrode 21 and the emission layer and an electron transport region between the emission layer and the second electrode 25

Hole Transport Region in Organic Layer 23

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/ electron blocking layer structure, wherein for each structure, constituting layers are sequentially stacked from the first electrode 21 in this stated order, but the structure of the hole transport region is not limited thereto.

The hole transport region may include at least one selected from m-MTDATA, TDATA, 2-TNATA, NPB (NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), PEDOT/PSS (poly(3,4-ethylenedioxythiophene)/poly(4-styrenesulfonate)), polyaniline/camphor sulfonic acid (PANI/CSA), polyaniline/poly(4-styrenesulfonate) (PANI/PSS), a compound represented by Formula 201, and a compound represented by Formula 202:

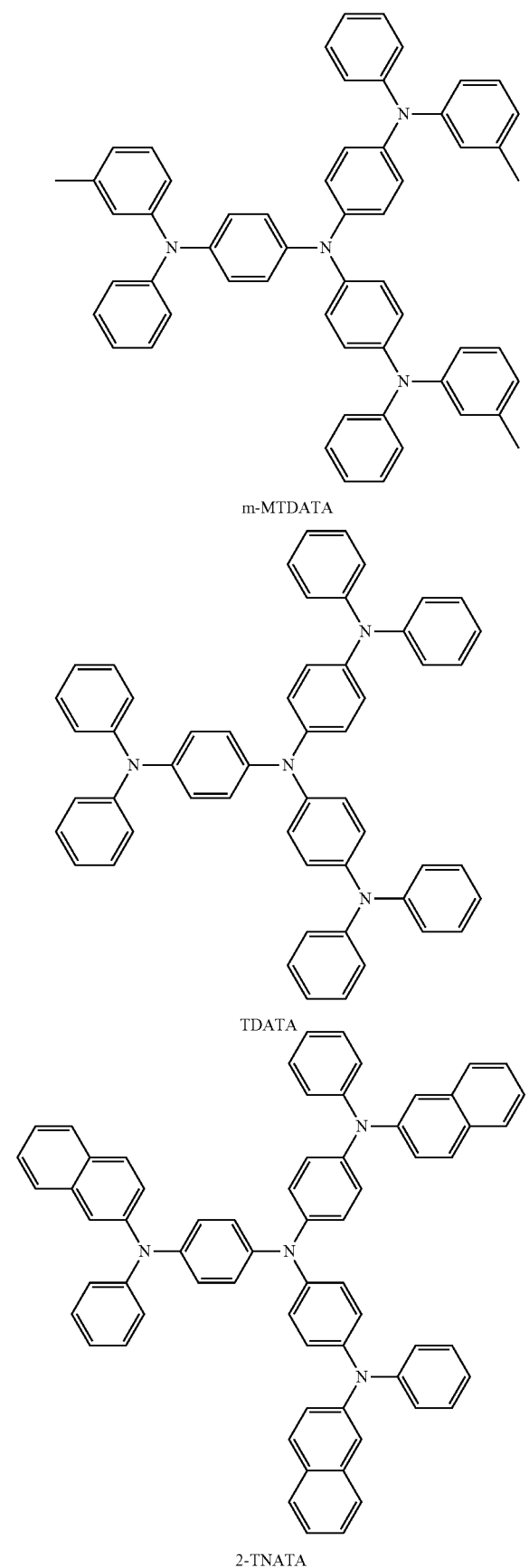

m-MTDATA

TDATA

2-TNATA

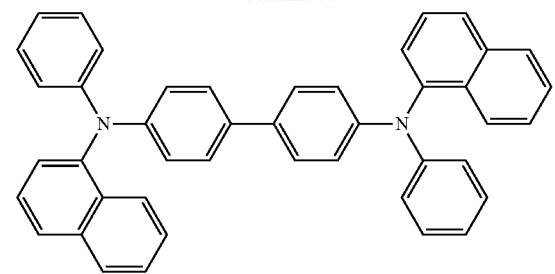

NPB

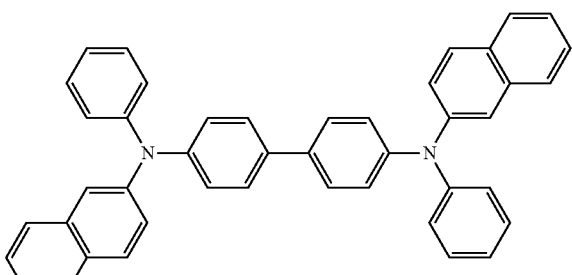

β-NPB

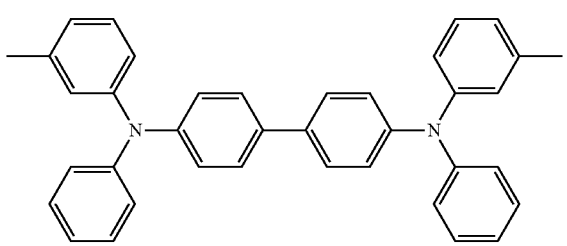

TPD

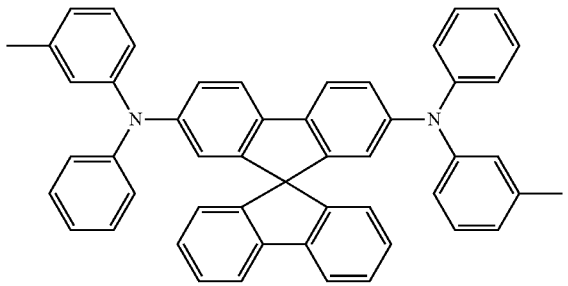

Spiro-TPD

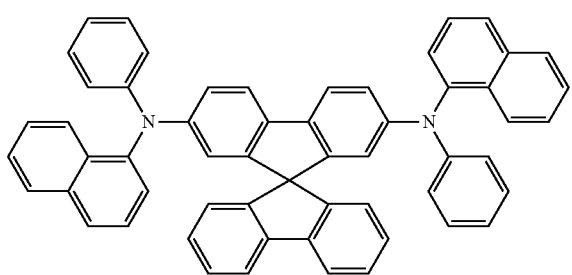

Spiro-NPB

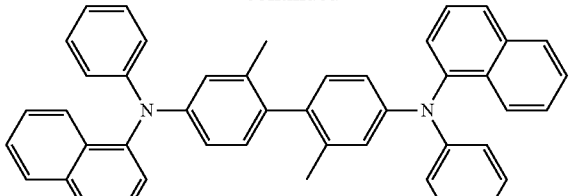

methylated NPB

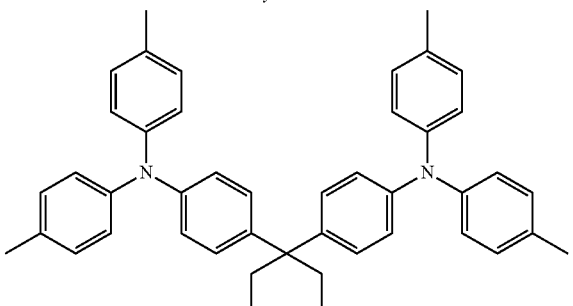

TAPC

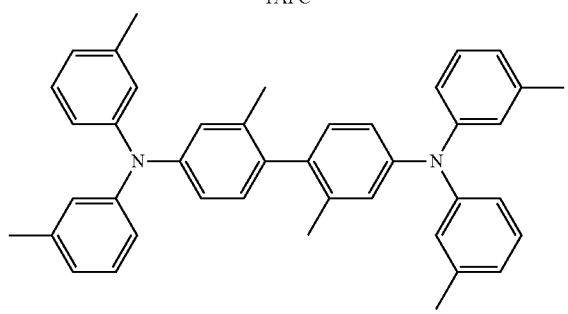

HMTPD

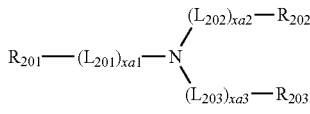

Formula 201

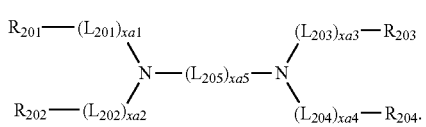

Formula 202

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked each other via a single bond, a dimethyl-methylene group, or a diphenyl-methylene group, and $R_{203}$ and $R_{204}$ may optionally be linked each other via a single bond, a dimethyl-methylene group, or a diphenyl-methylene group.

In one or more embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ are the same as described above.

In one or more embodiments, in Formula 201, at least one selected from $R_{201}$ to $R_{203}$ may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked each other via a single bond, and/or ii) $R_{203}$ and $R_{204}$ may be linked each other via a single bond.

In one or more embodiments, in Formula 202, at least one selected from $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

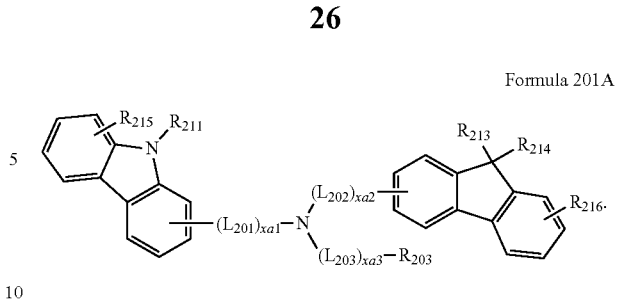

Formula 201A

In one embodiment, the compound represented by Formula 201 may be represented by Formula 201A(1), but embodiments of the present disclosure are not limited thereto:

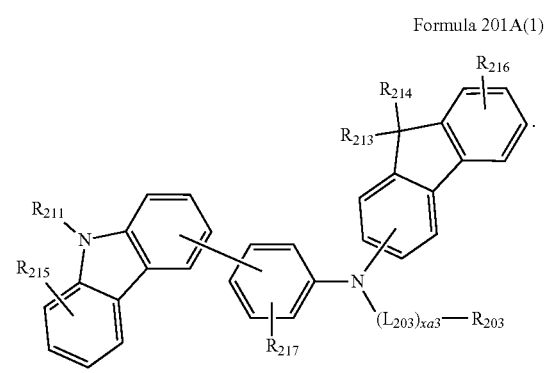

Formula 201A(1)

In one embodiment, the compound represented by Formula 201 may be represented by Formula 201A-1, but embodiments of the present disclosure are not limited thereto:

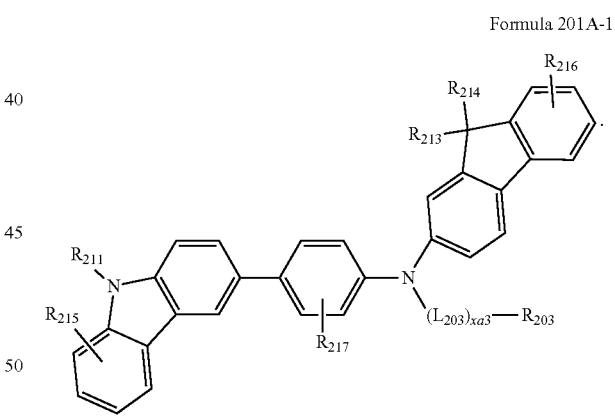

Formula 201A-1

In one embodiment, the compound represented by Formula 202 may be represented by Formula 202A:

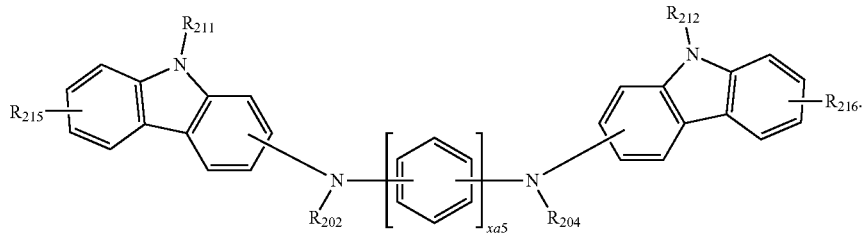

Formula 202A

In one embodiment, the compound represented by Formula 202 may be represented by Formula 202A-1:

Formula 202A-1

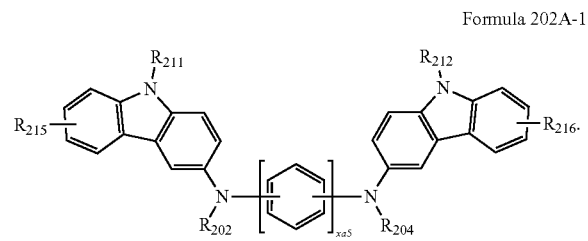

In Formulae 201A, 201A(1), 201A-1, 202A, and 202A-1,
$L_{201}$ to $L_{203}$, xa1 to xa3, xa5, and $R_{202}$ to $R_{204}$ are the same as described above, $R_{211}$ and $R_{212}$ may each independently be the same as $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

HT1

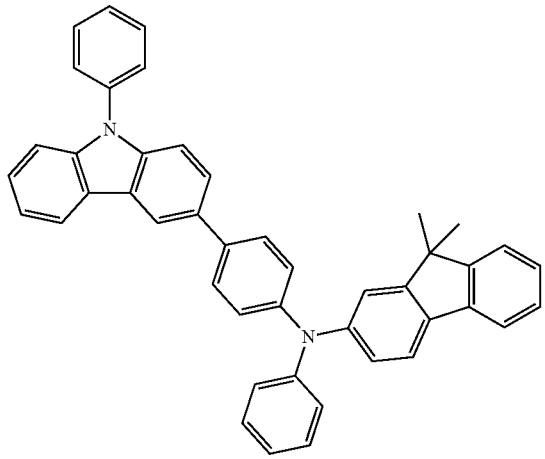

HT2

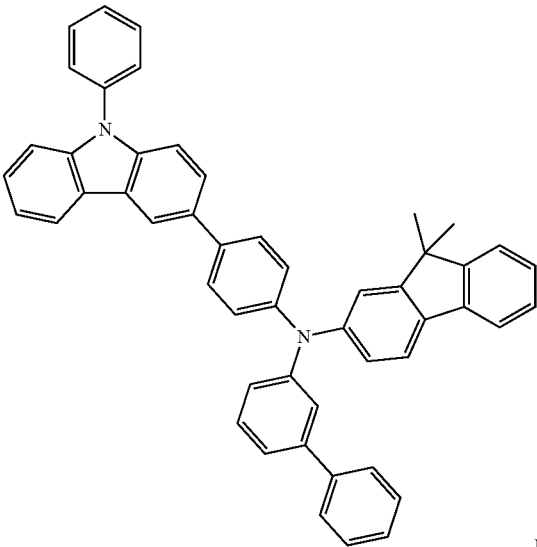

HT3

HT4

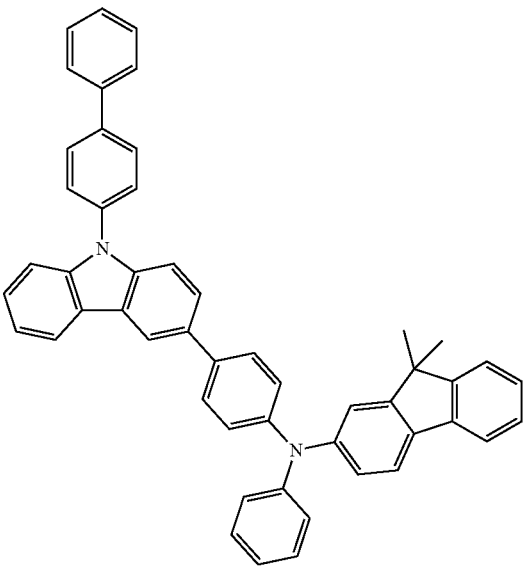

-continued
HT5
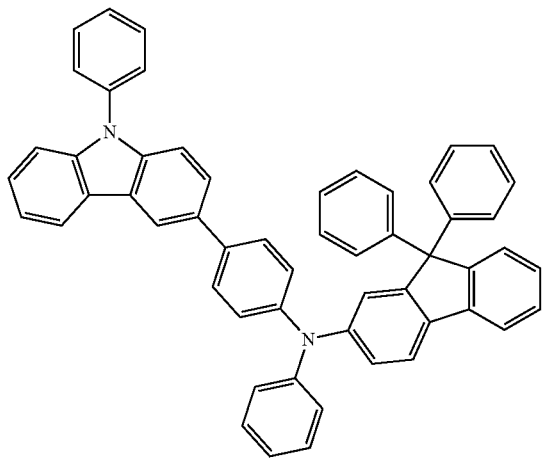
HT6
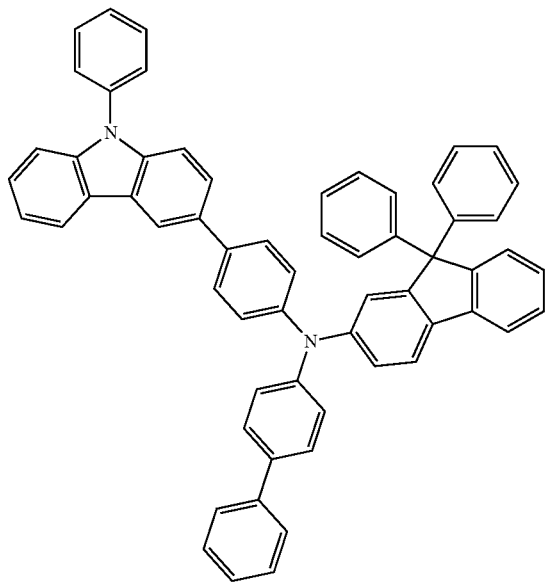
HT7
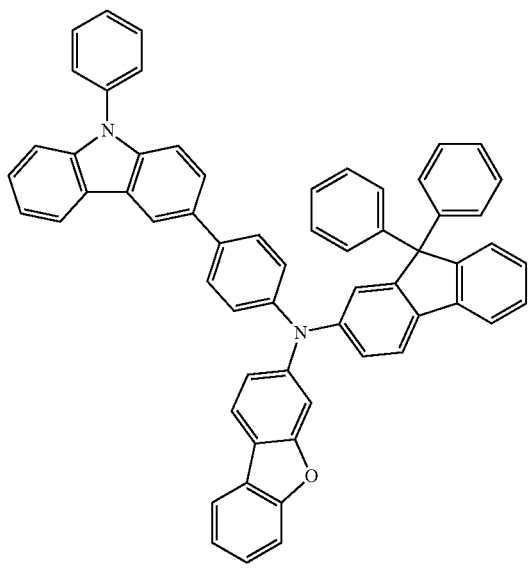
HT8
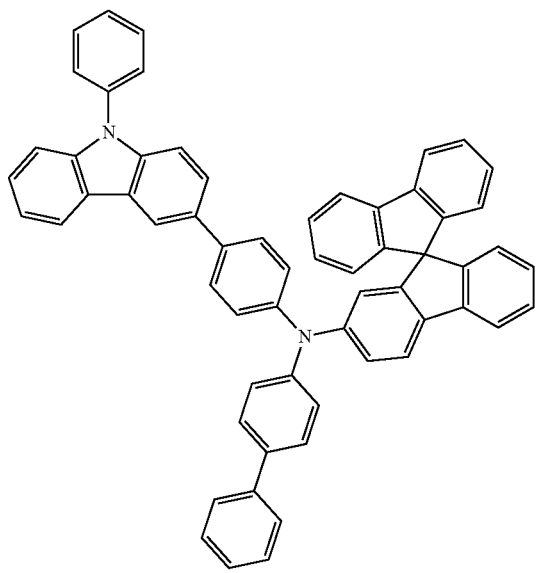

HT9
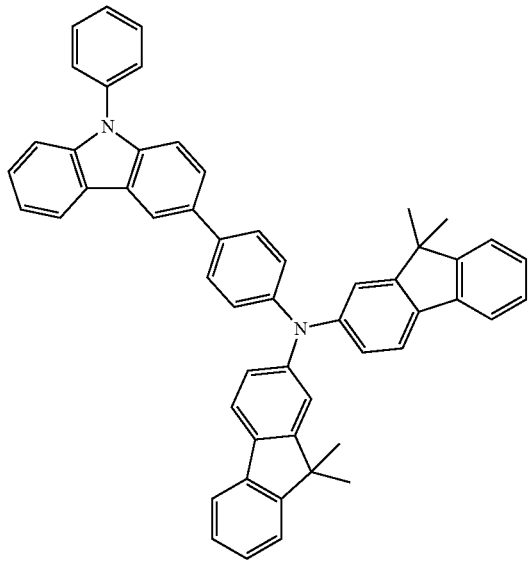
HT10
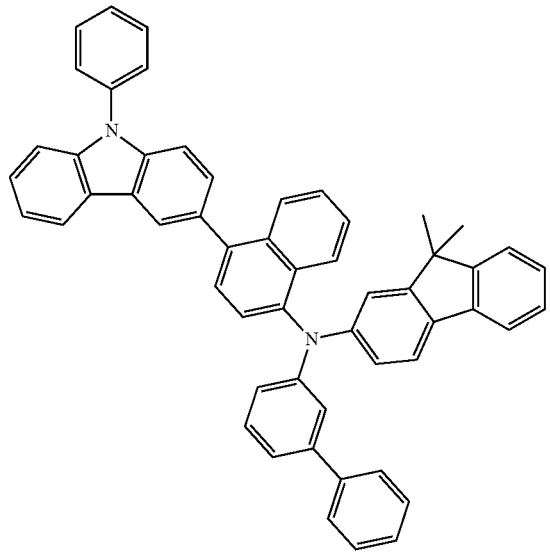
HT11
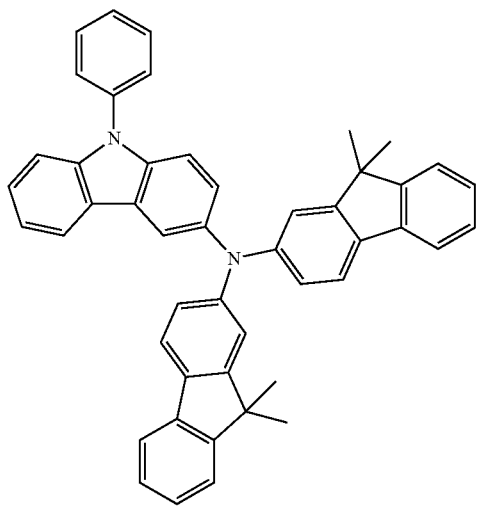
HT12
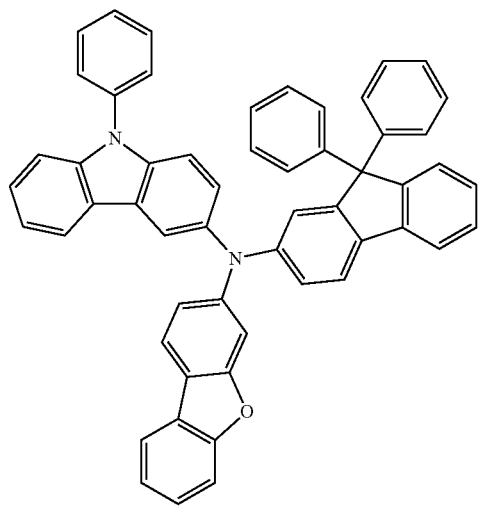
HT13
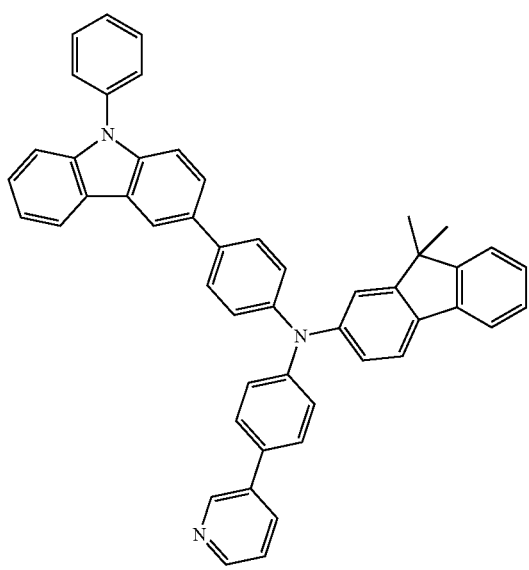
HT14
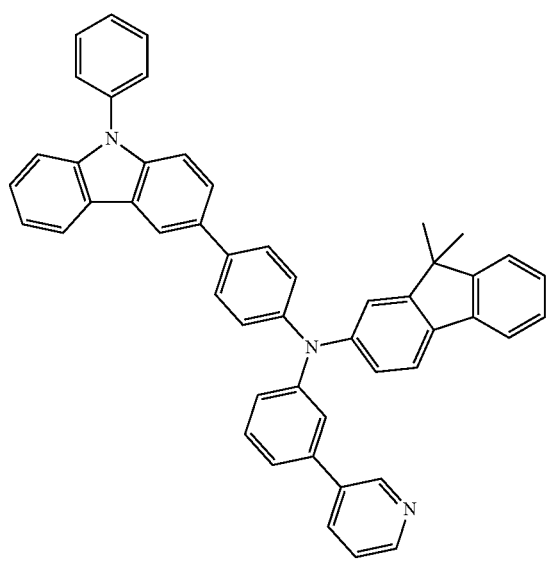

-continued
HT15
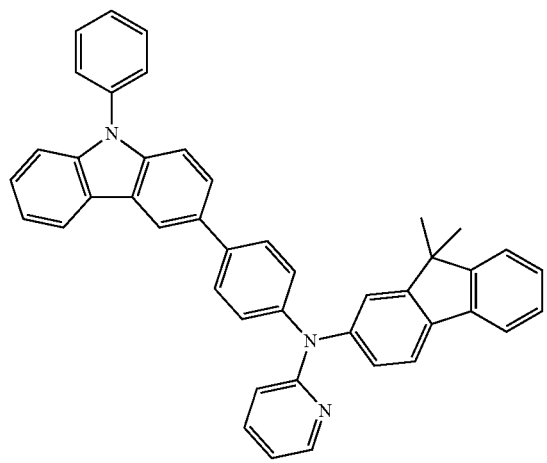
HT16
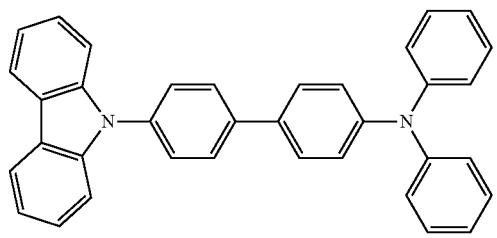
HT17
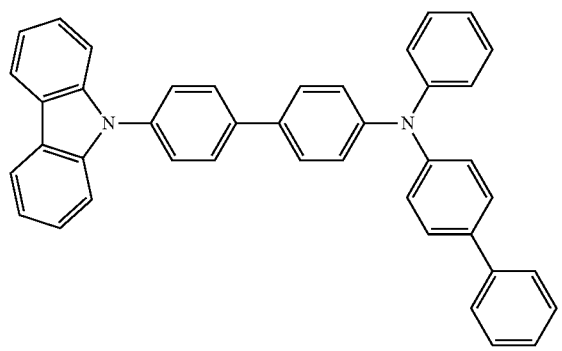
HT18
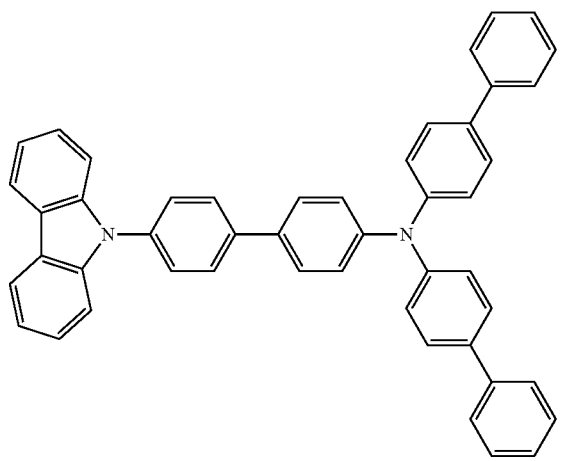
HT19
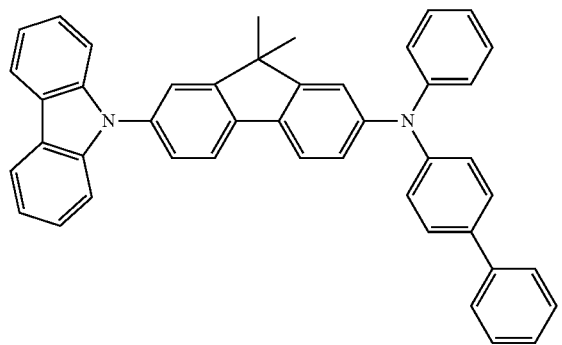
HT20
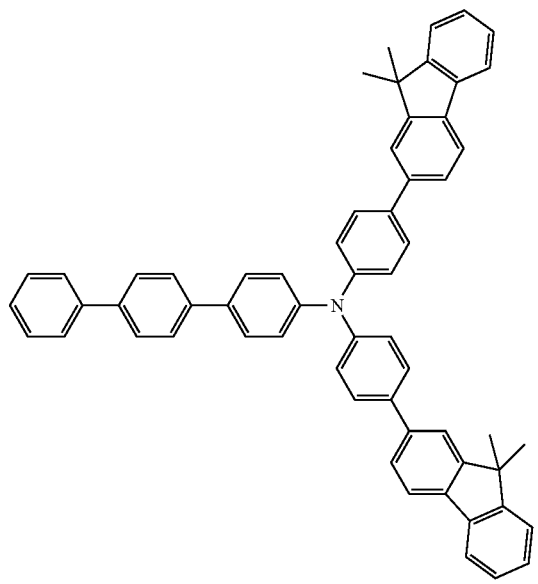

HT21
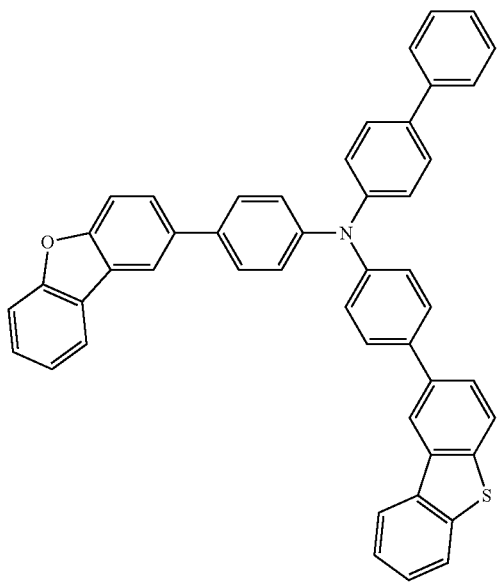
HT22
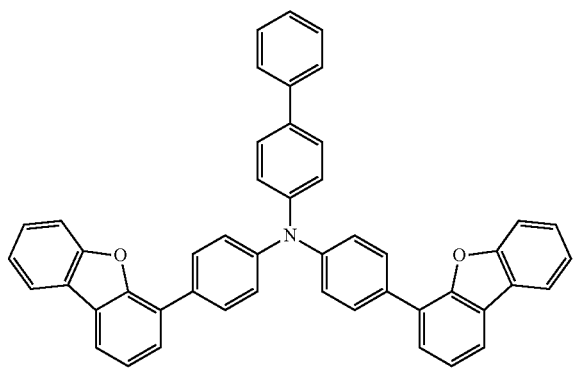
HT23
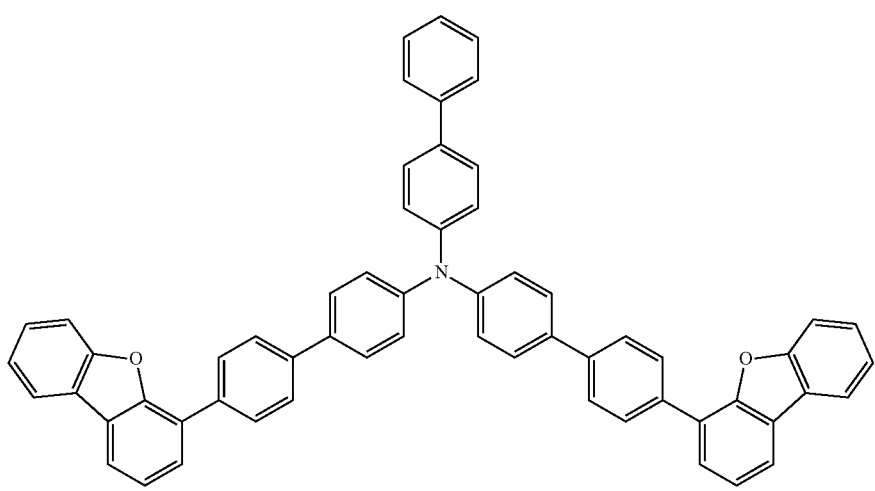

-continued
HT24
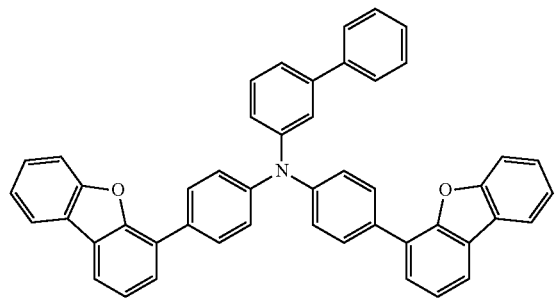
HT25
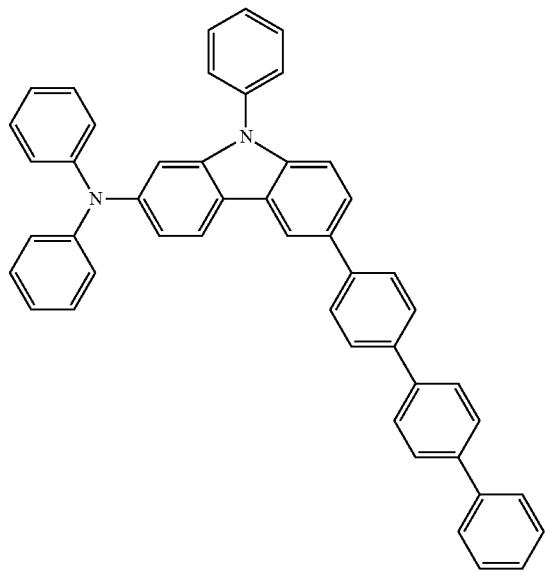
HT26
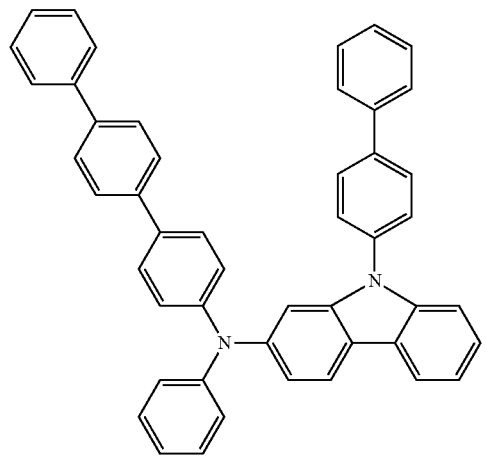
HT27
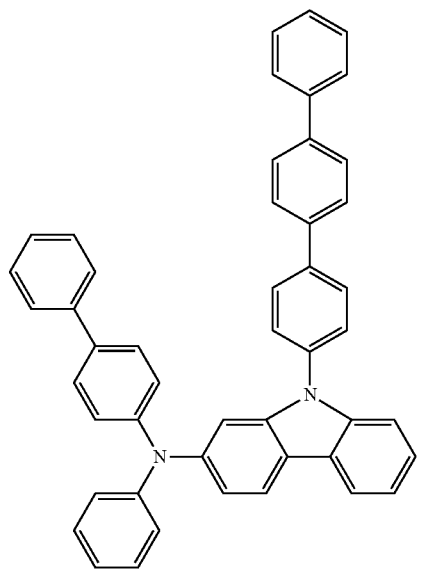
HT28
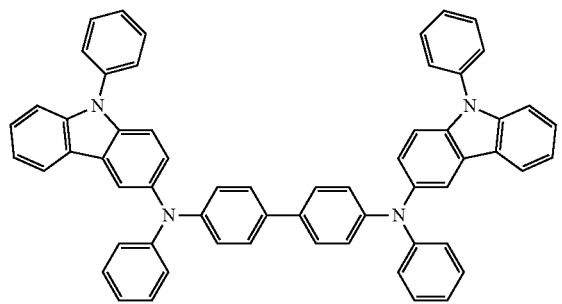
HT29
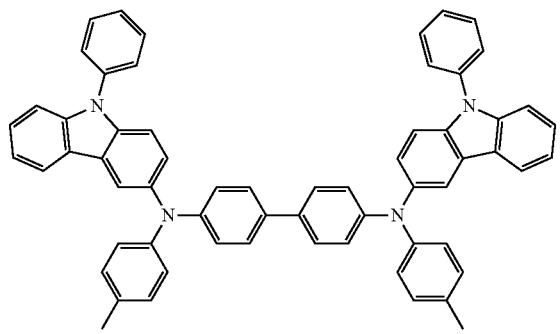

-continued
HT30
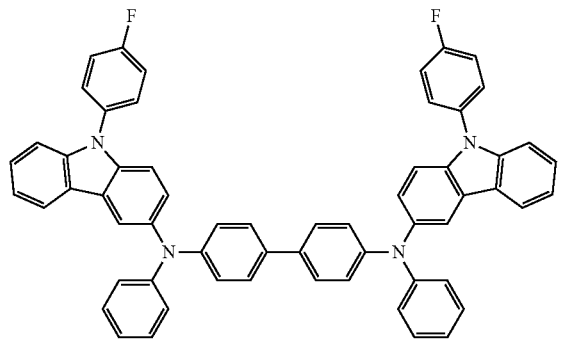
HT31
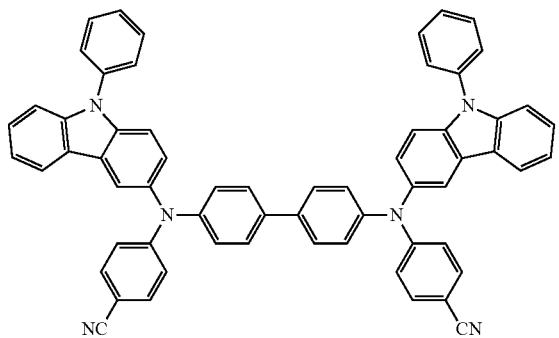
HT32
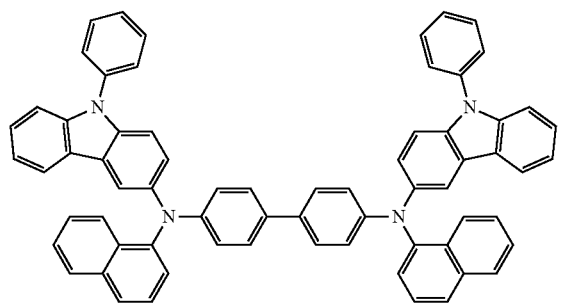
HT33
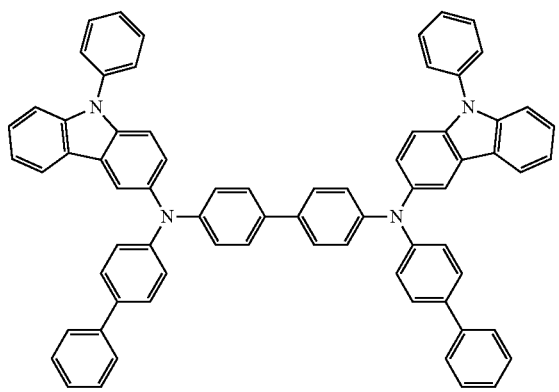
HT34
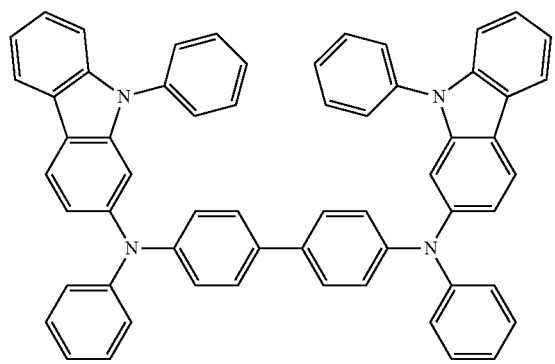
HT35
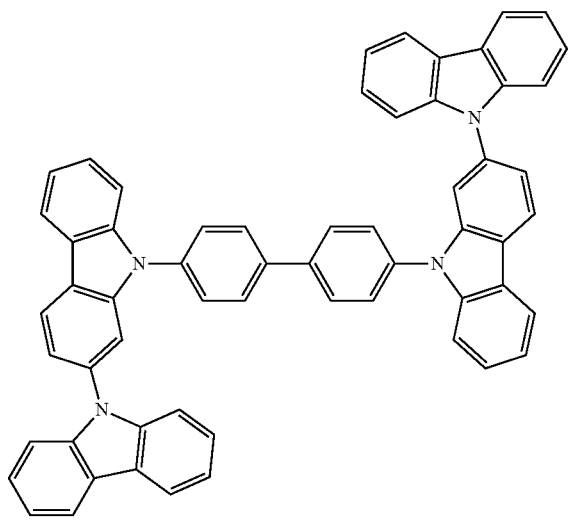

-continued

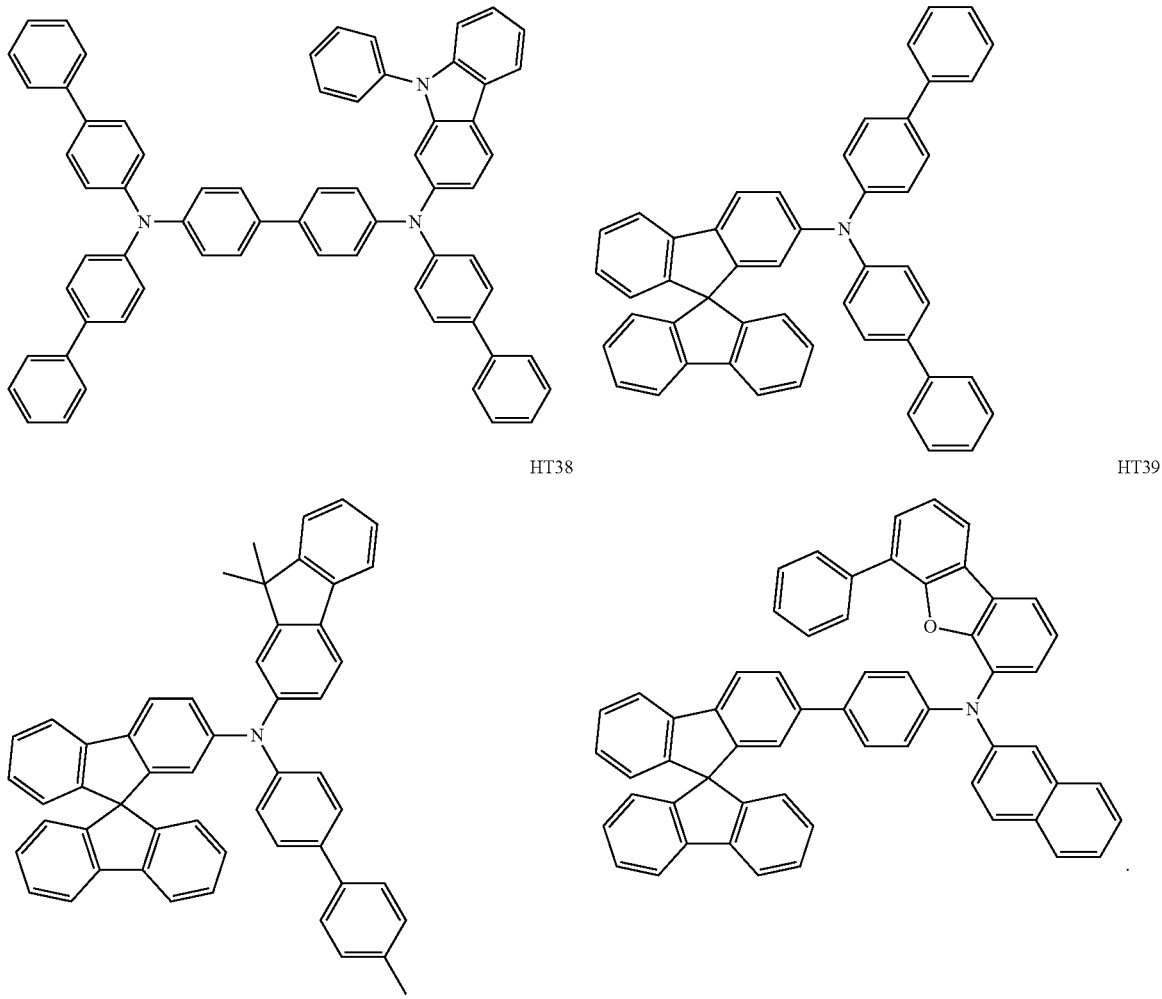

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 9,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from:

a quinone derivative, such as tetracyanoquinodimethane (TCNQ) and 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN); and a compound represented by Formula 221, but embodiments of the present disclosure are not limited thereto:

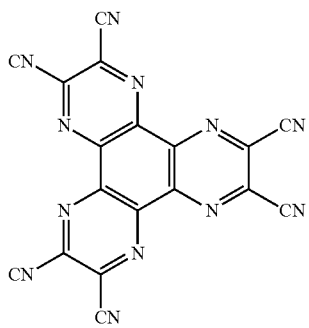

HAT-CN

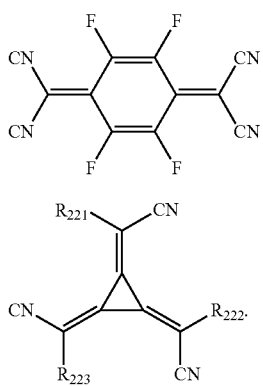

F4-TCNQ

Formula 221

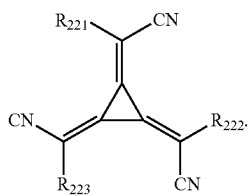

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 23

When the organic light-emitting device 1 is a full-color organic light-emitting diode, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include at least one selected from a phosphorescent dopant and a fluorescent dopant.

In the emission layer, an amount of the dopant material may be in a range of about 0.01 parts to about 15 parts by weight based on 100 parts by weight of the host material, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Host in Emission Layer

In one or more embodiments, the host may include a compound represented by Formula 301:

$$[Ar_{301}]_{xb11}\text{-}[(L_{301})_{xb1}\text{-}R_{301}]_{xb21}.$$ Formula 301

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 may be an integer from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group. However, embodiments of the present disclosure are not limited thereto.

When xb11 in Formula 301 is two or more, two or more $Ar_{301}$(s) may be linked via a single bond.

In one or more embodiments, the compound represented by Formula 301 may be represented by Formula 301-1 or 301-2:

hydrazino group, a hydrazono group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ are the same as described above, $L_{302}$ to $L_{304}$ may each independently be the same as $L_{301}$, xb2 to xb4 may each independently be the same as xb1, and $R_{302}$ to $R_{304}$ may each independently be the same as $R_{301}$.

For example, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a

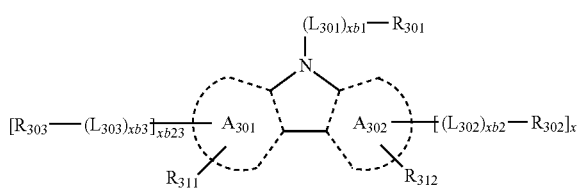

Formula 301-1

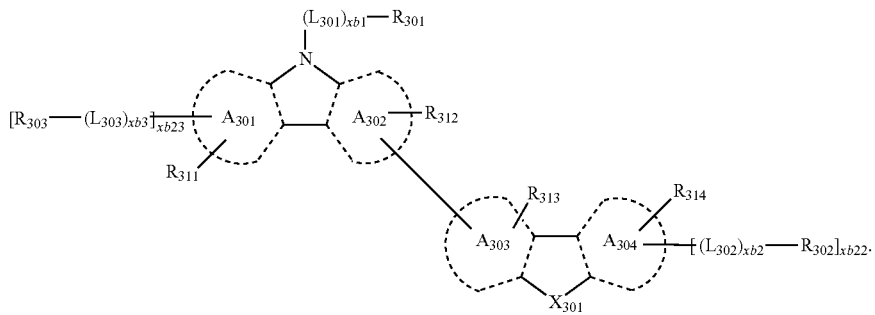

Formula 301-2

In Formulae 301-1 and 301-2, $A_{301}$ to $A_{304}$ may each independently be selected from a benzene, a naphthalene, a phenanthrene, a fluoranthene, a triphenylene, a pyrene, a chrysene, a pyridine, a pyrimidine, an indene, a fluorene, a spiro-bifluorene, a benzofluorene, a dibenzofluorene, an indole, a carbazole, benzocarbazole, dibenzocarbazole, a furan, a benzofuran, a dibenzofuran, a naphthofuran, a benzonaphthofuran, dinaphthofuran, a thiophene, a benzothiophene, a dibenzothiophene, a naphthothiophene, a benzonaphthothiophene, and a dinaphthothiophene, $X_{301}$ may be O, S, or N-[($L_{304}$)$_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{31}$ to $Q_{33}$ are the same as described above.

In one embodiment, Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$ ($Q_{31}$), and —P(=O)($Q_{31}$)($Q_{32}$), and $Q_{31}$ and $Q_{33}$ are the same as described above.

In one or more embodiments, the host may include an alkaline earth metal complex. For example, the host may be selected from a Be complex (for example, Compound H55), a Mg complex, and a Zn complex.

The host may include at least one selected from 9,10-di (2-naphthyl)anthracene (ADN), 2-methyl-9,10-bis(naphthalen-2-yl)anthracene (MADN), 9,10-di-(2-naphthyl)-2-t-butyl-anthracene (TBADN), a 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments of the present disclosure are not limited thereto:

H1

H2

H3

H4

H5
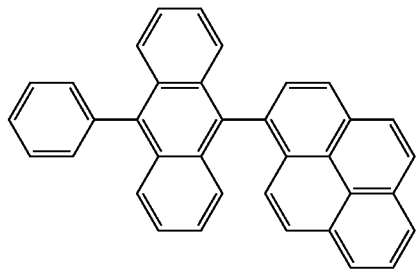

H6
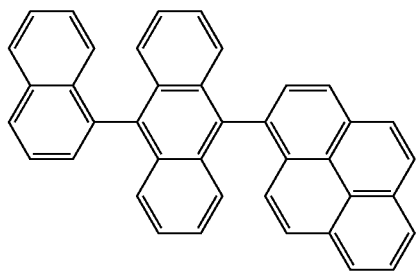

H7
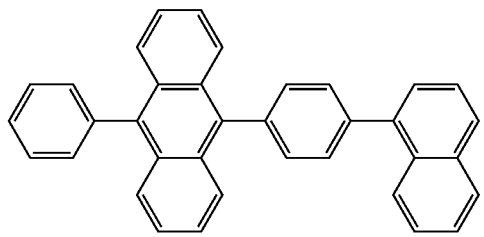

H8
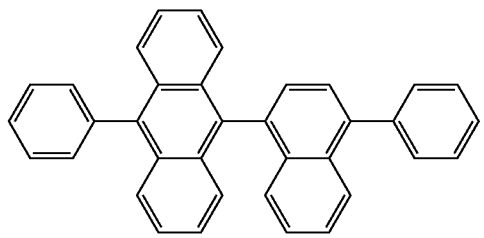

H9
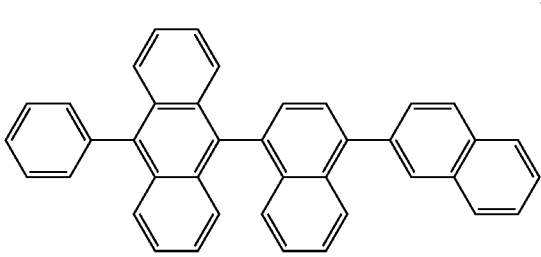

H10
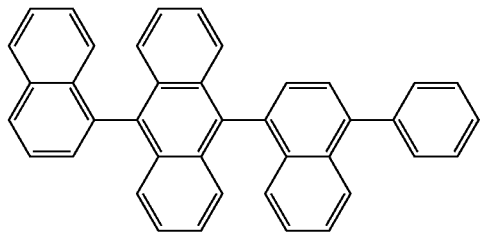

H11
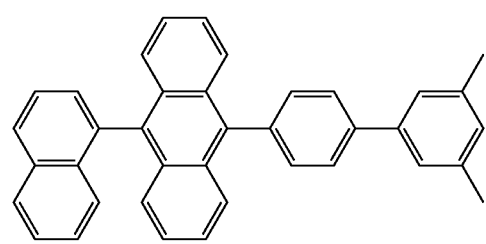
H12
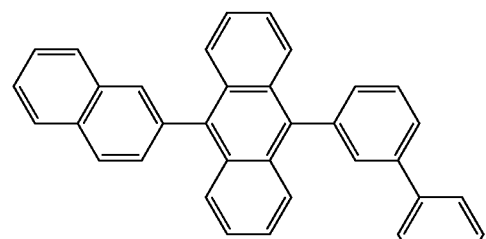
H13
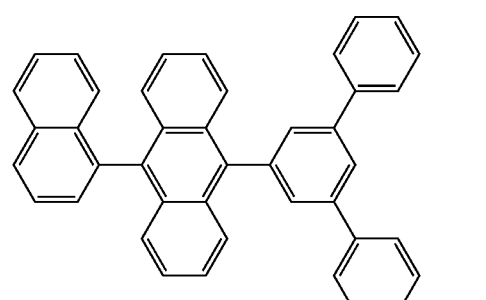
H14
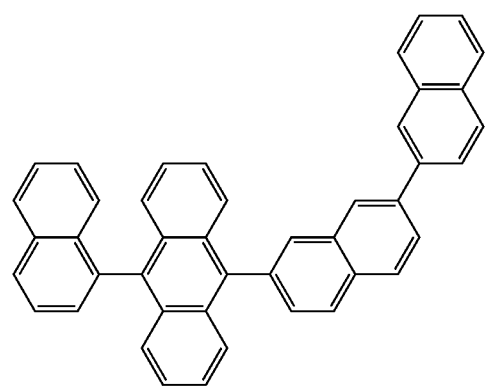
H15
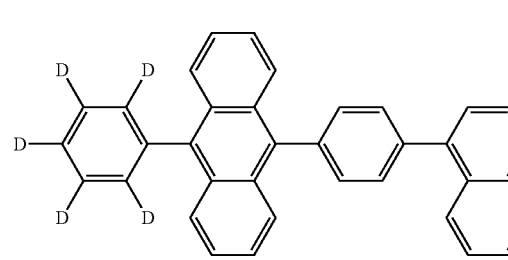
H16
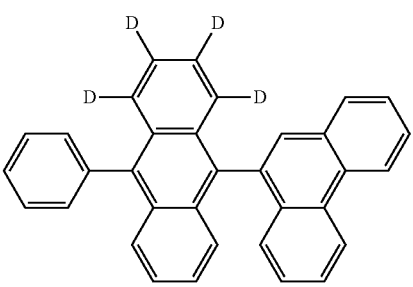
H17
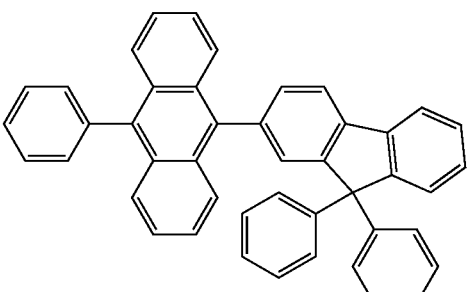
H18
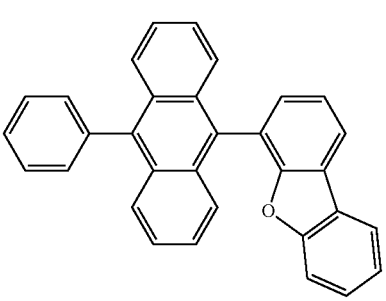
H19
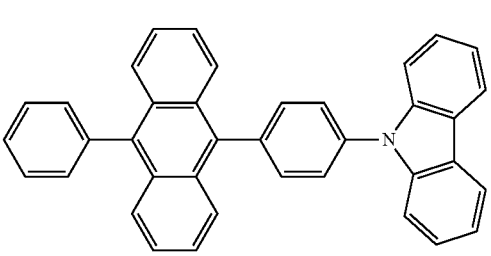
H20
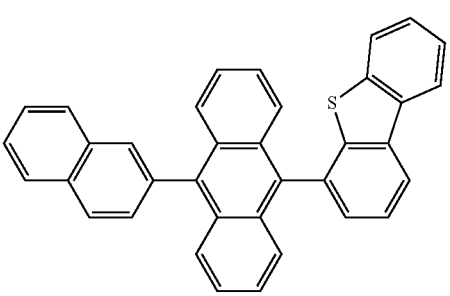

H21
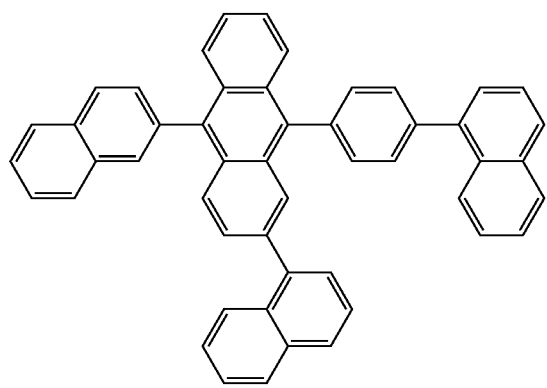
H22
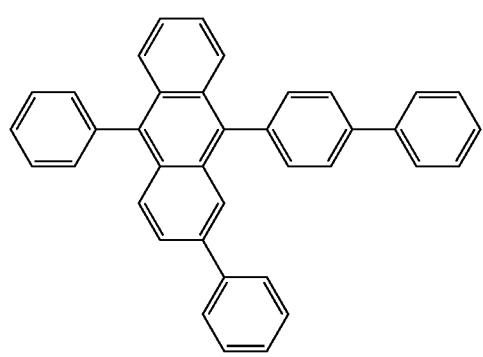
H23
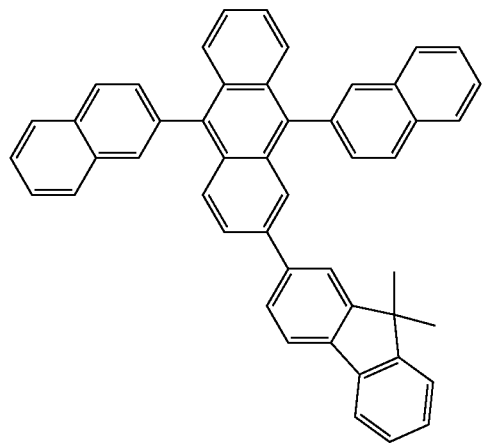
H24
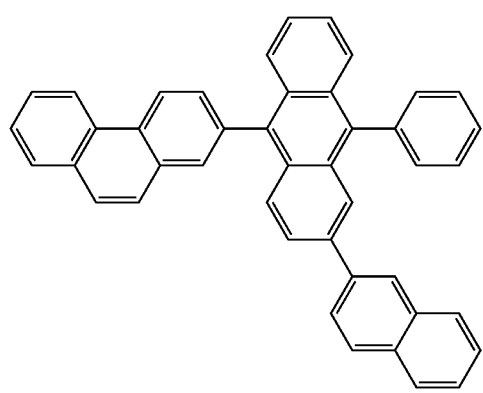
H25
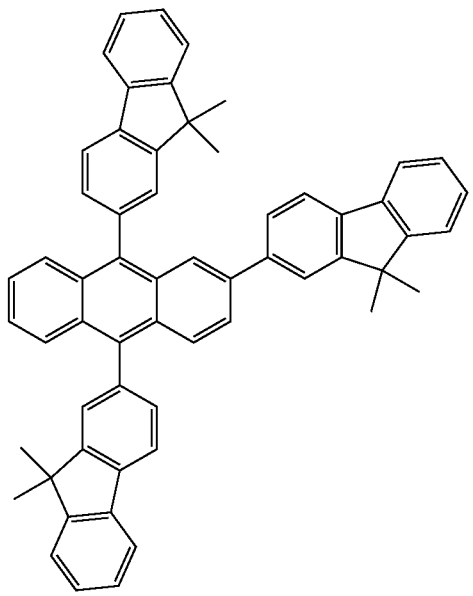
H26
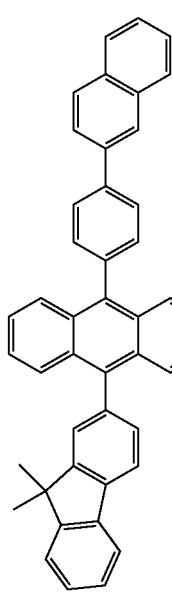
H27
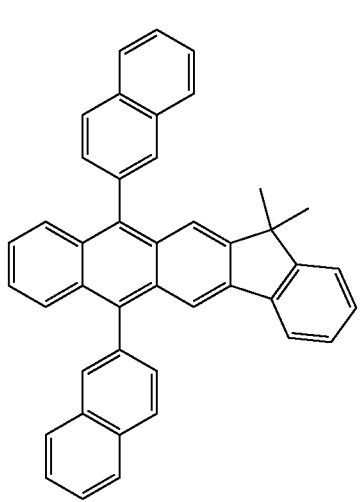

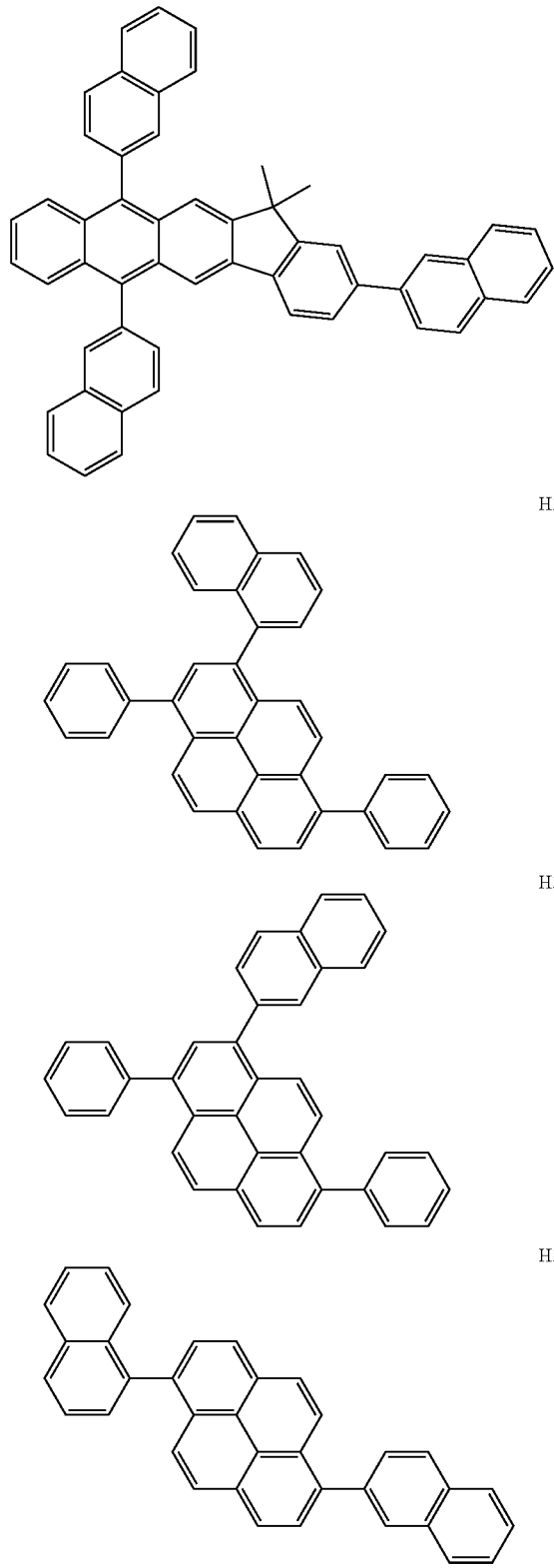
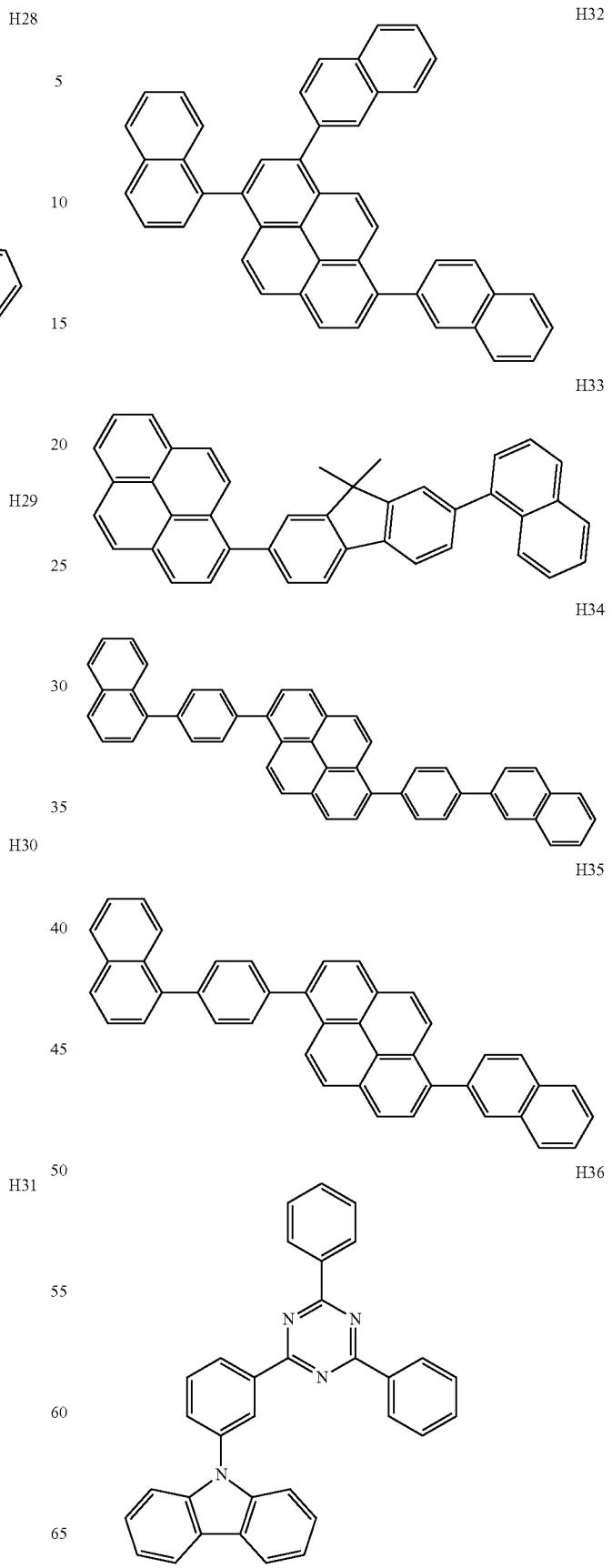

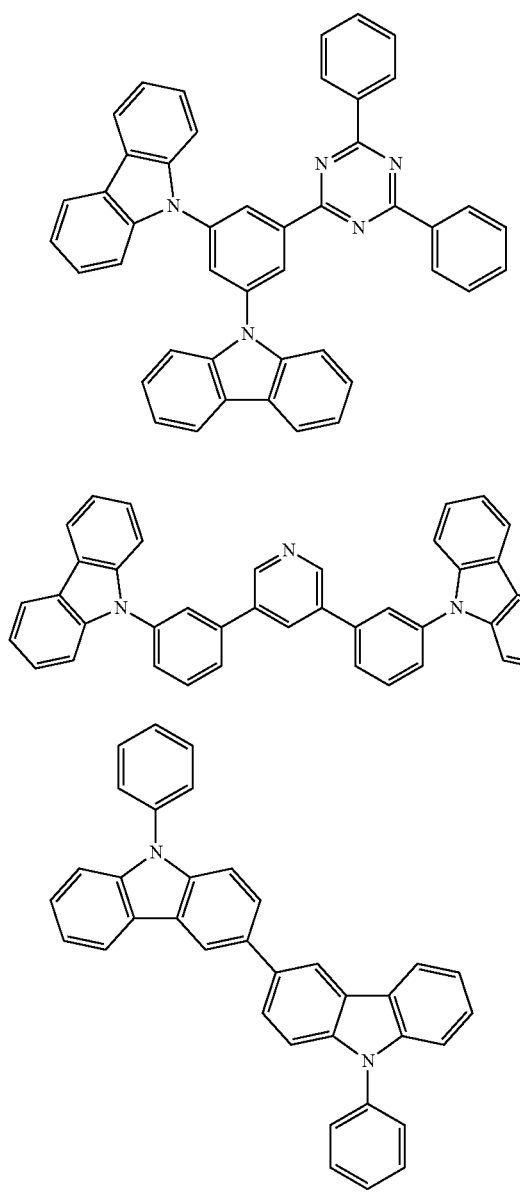
H37
H38
H39
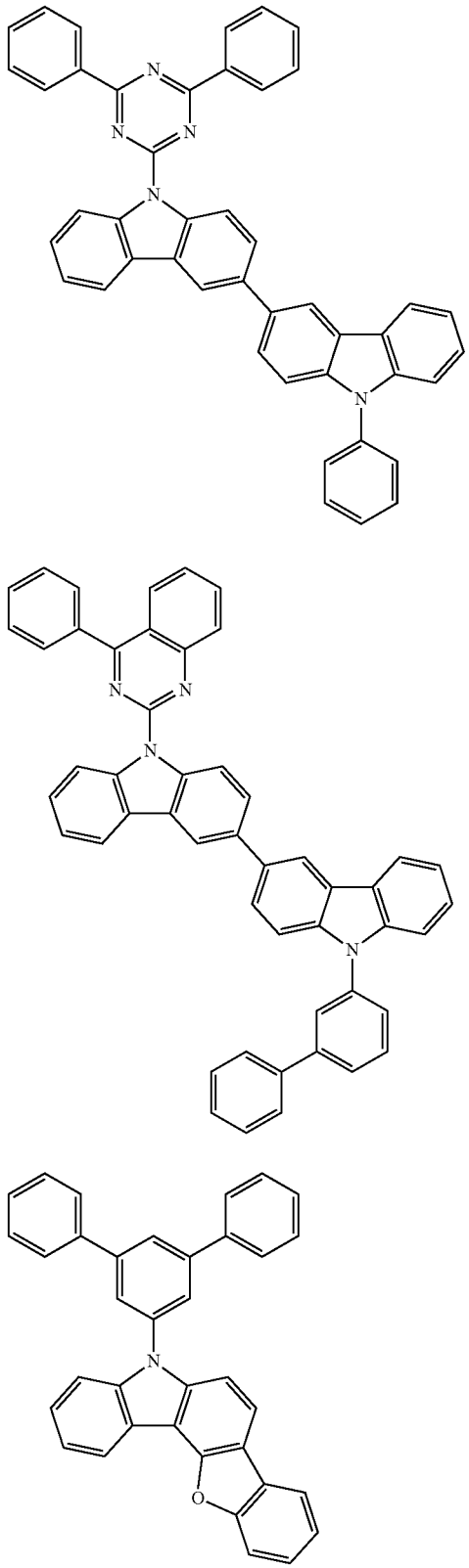
H40
H41
H42

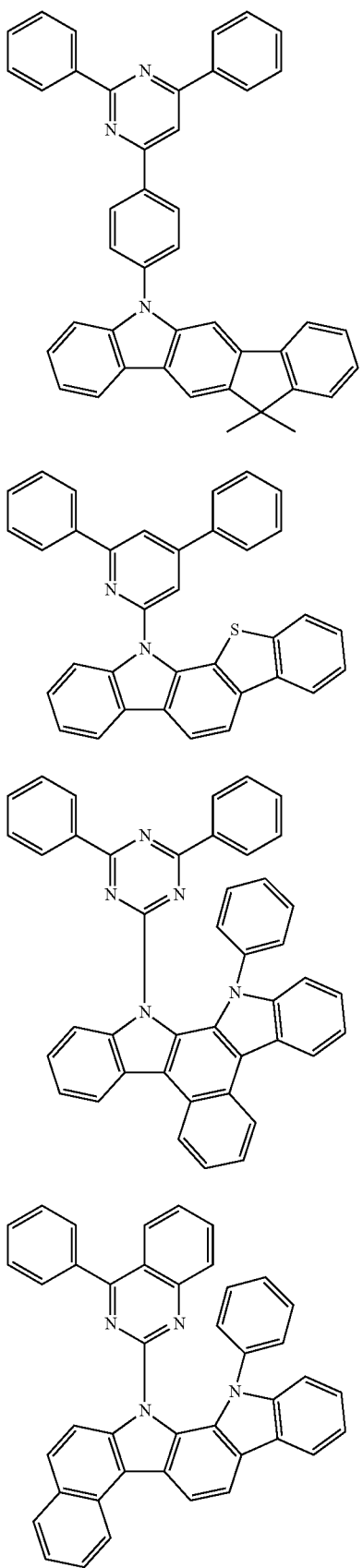
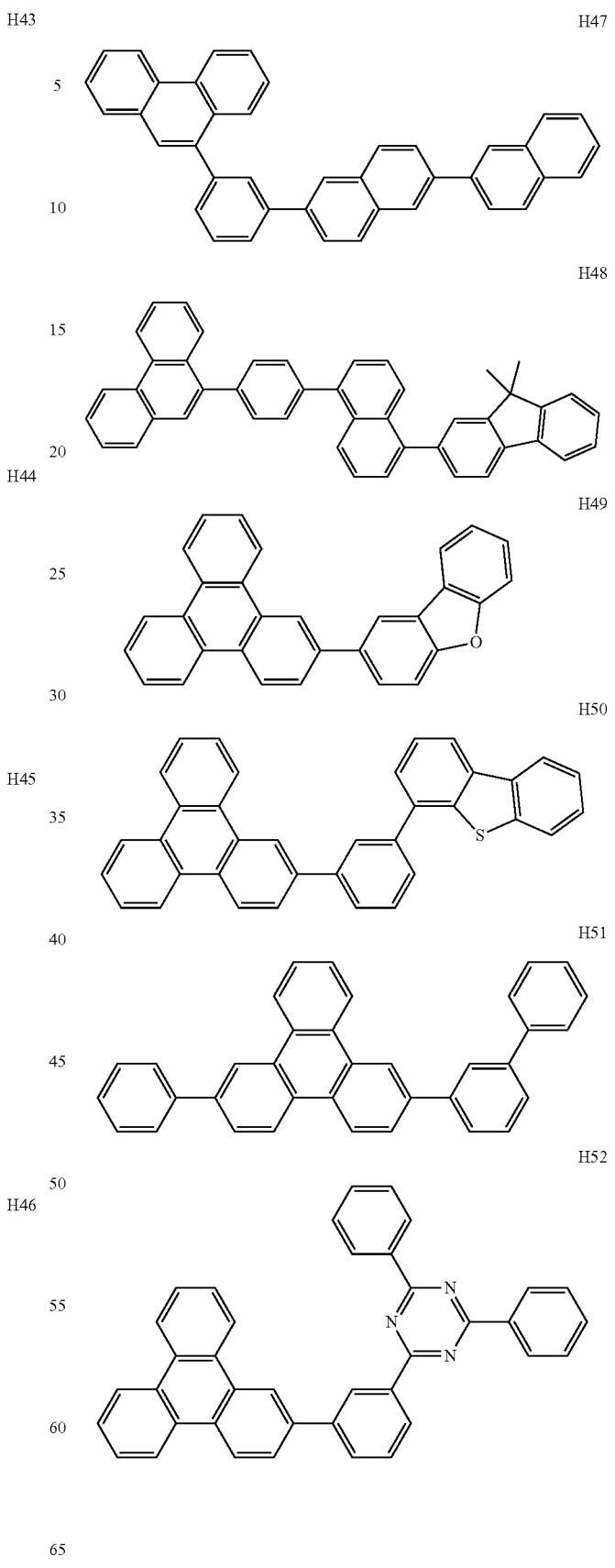

-continued

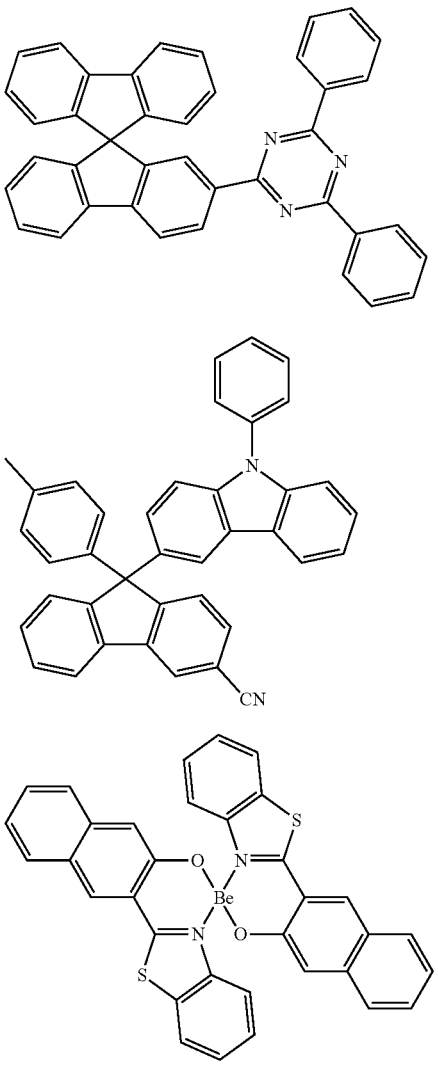

H53

H54

H55

Phosphorescent Dopant Included in Emission Layer in Organic Layer 23

The phosphorescent dopant may include an organometallic complex represented by Formula 401:

$$M(L_{401})_{xc1}(L_{402})_{xc2}$$ Formula 401

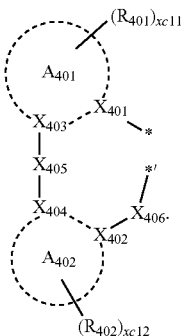

Formula 402

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is two or more, two or more $L_{401}$(s) may be identical to or different from each other, $L_{402}$ may be an organic ligand, and xc2 may be an integer from 0 to 4, wherein, when xc2 is two or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from: hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each independently indicate a binding site to M in Formula 401.

In one embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen, and $X_{402}$ may be carbon, or ii) $X_{401}$ and $X_{402}$ may each be nitrogen at the same time.

In one or more embodiments, $R_{402}$ and $R_{402}$ in Formula 401 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$) and —P(=O)($Q_{401}$)($Q_{402}$), and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but are not limited thereto.

In one or more embodiments, when xc1 in Formula 401 is two or more, two $A_{401}$(s) in two or more of $L_{401}$(s) may optionally be linked via $X_{407}$, which is a linking group, or two $A_{402}$(s) in two or more of $L_{401}$(s) may optionally be linked via $X_{408}$, which is a linking group (see Compounds PD1 to PD4 and PD7). $X_{407}$ and $X_{408}$ may each independently be a single bond, *—O—*', *—S—*', *—C(=O)—*', *—N($Q_{413}$)-*', *—C($Q_{413}$)($Q_{414}$)-*' or *—C($Q_{413}$)=C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

In Formula 401, $L_{402}$ may be a monovalent, divalent, or trivalent organic ligand. For example, and $L_{402}$ may be halogen, diketone (for example, acetylacetonate), carboxylic acid (for example, picolinate), —C(=O), isonitrile, —CN, or phosphorus (for example, phosphine and phosphite), but embodiments of the present disclosure are not limited thereto.

In one embodiment, the phosphorescent dopant may be, for example, selected from Compounds PD1 to PD25, but embodiments of the present disclosure are not limited thereto:

PD1

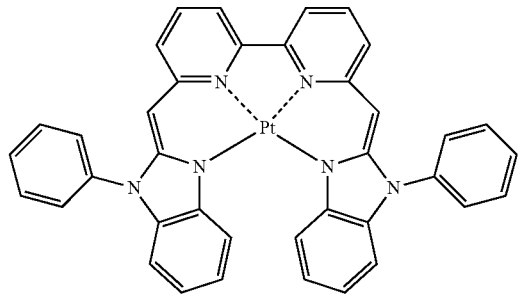

PD2

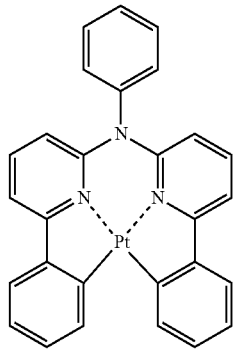

PD3

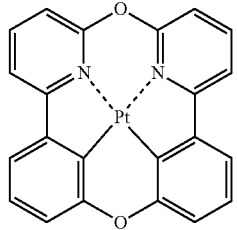

PD4

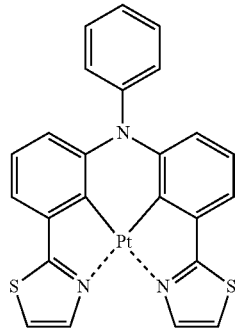

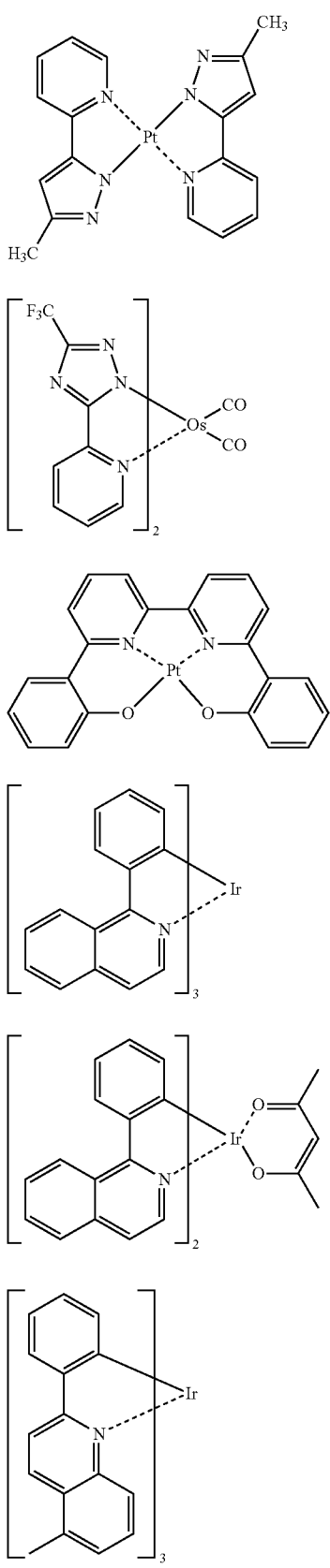
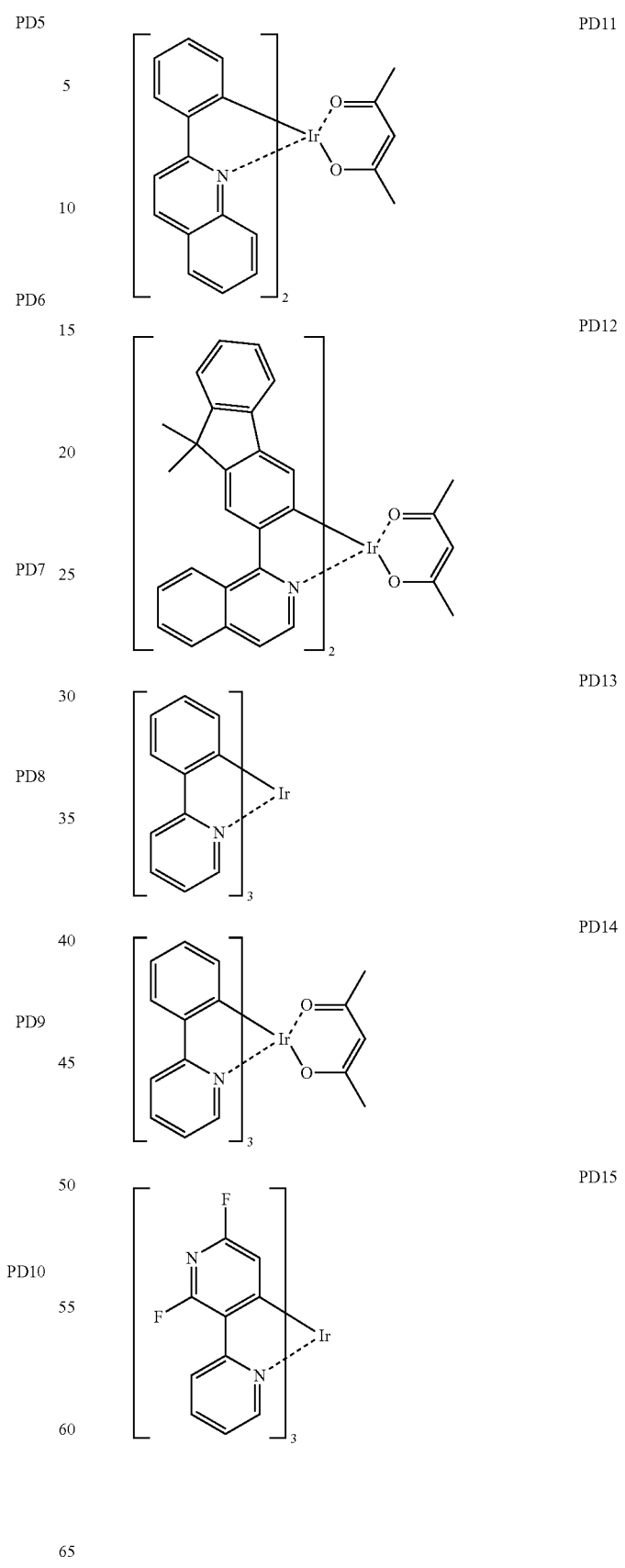

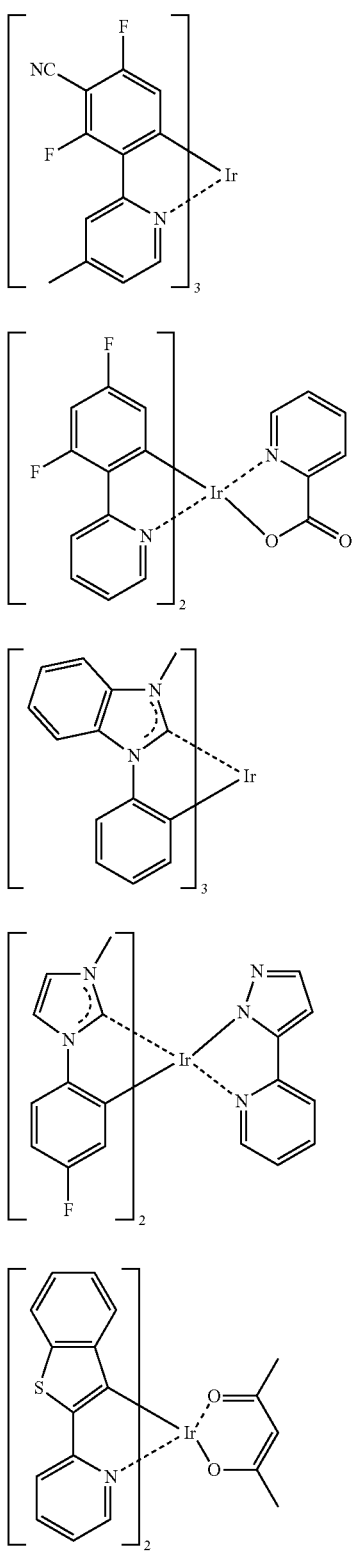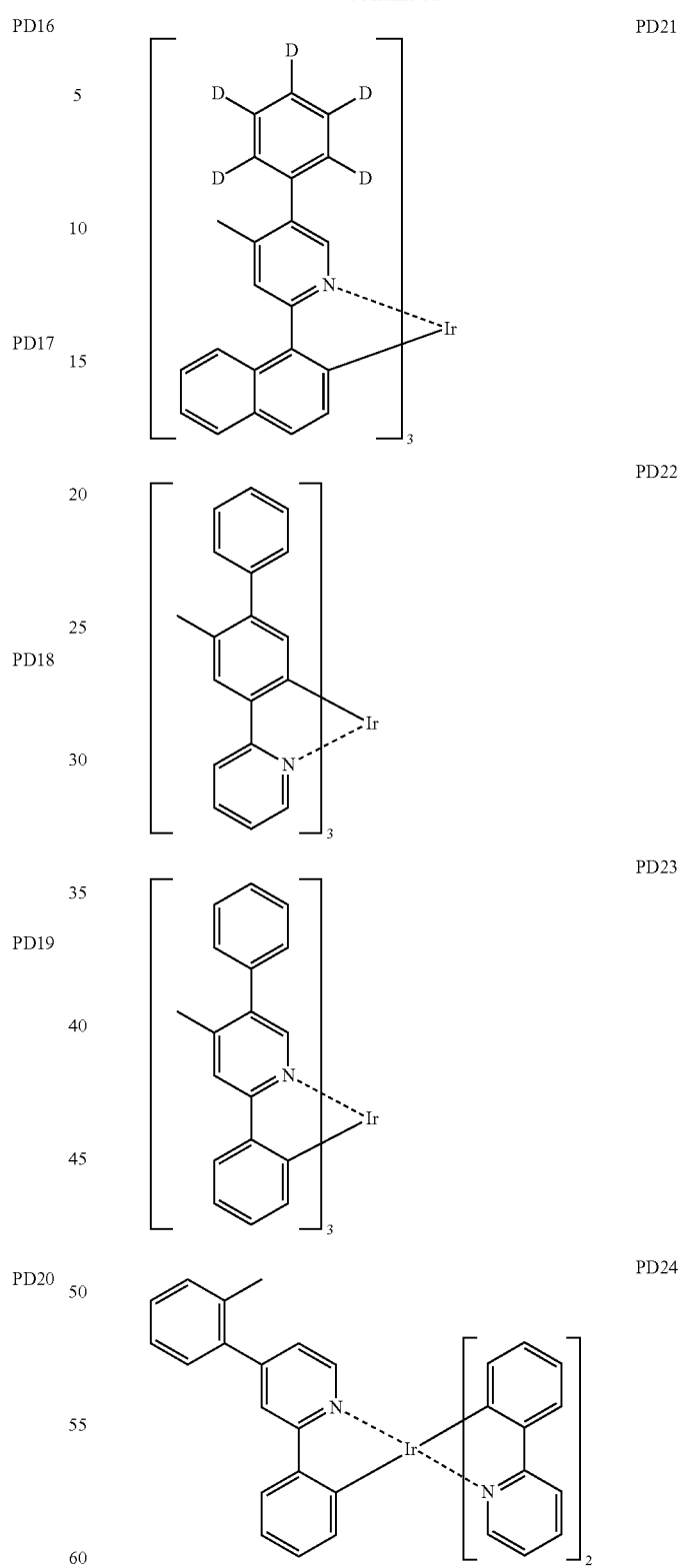

-continued

PD25

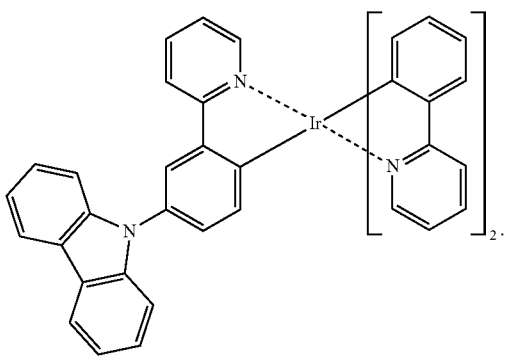

Fluorescent Dopant in Emission Layer

The fluorescent dopant may include an arylamine compound or a styrylamine compound.

The fluorescent dopant may include a compound represented by Formula 501 below.

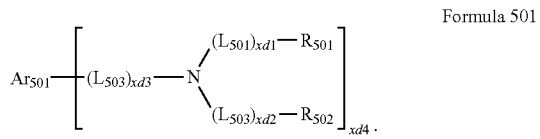

Formula 501

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer of 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer of 1 to 6.

In one embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), and $Q_{31}$ to $Q_{33}$ may each be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

FD1

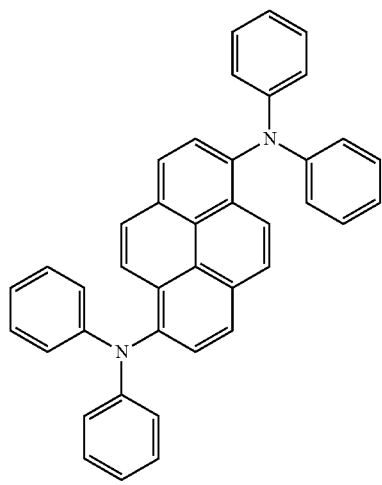

FD2

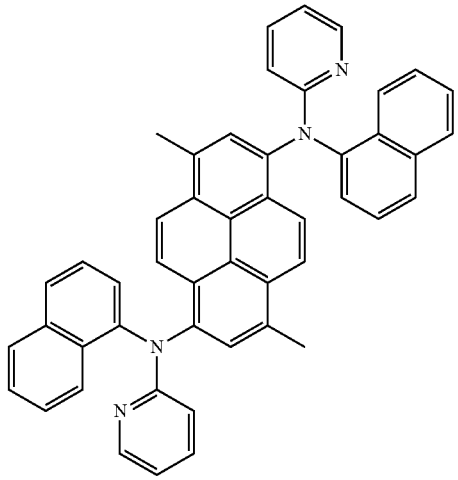

FD3

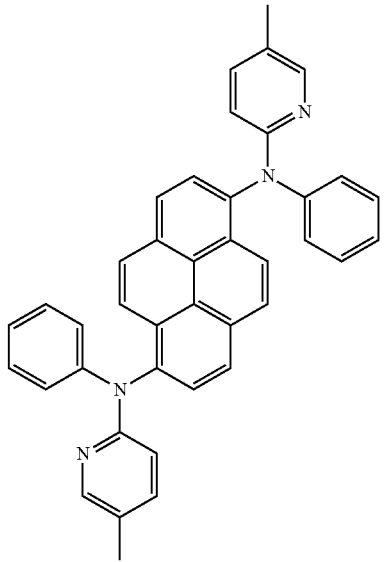

FD4

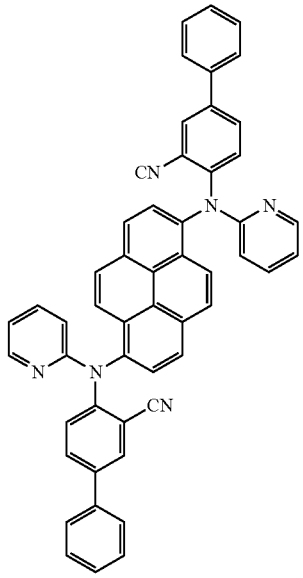

FD5
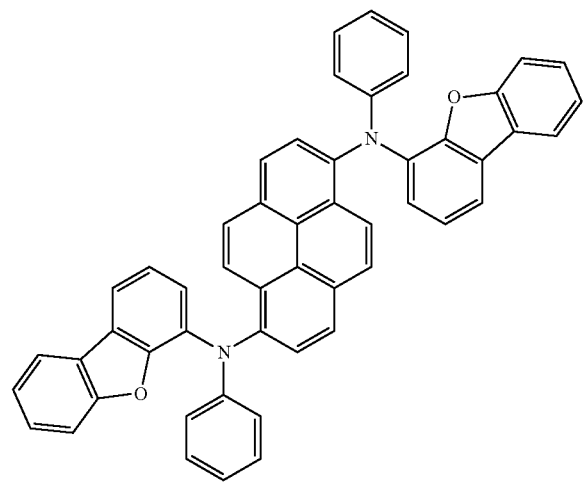
FD6
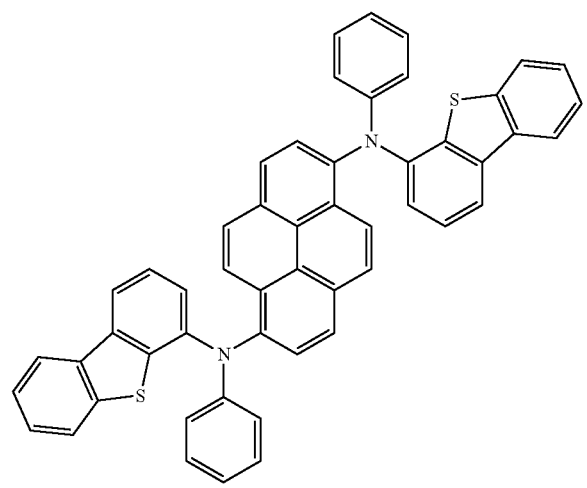
FD7
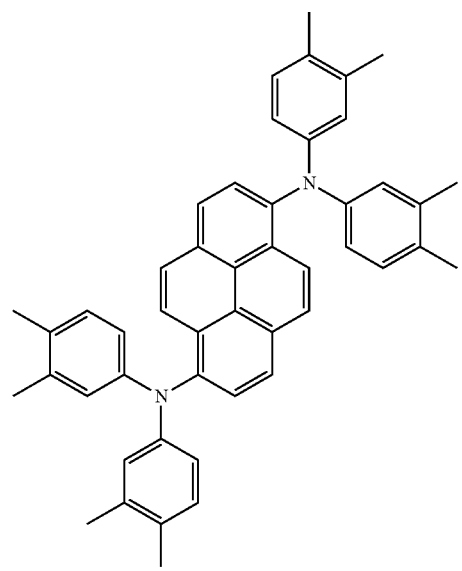
FD8
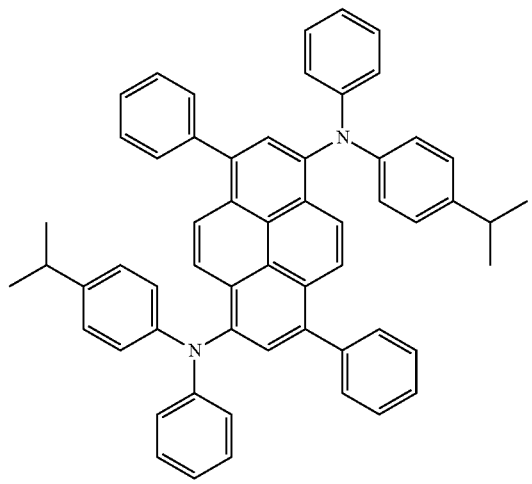
FD9
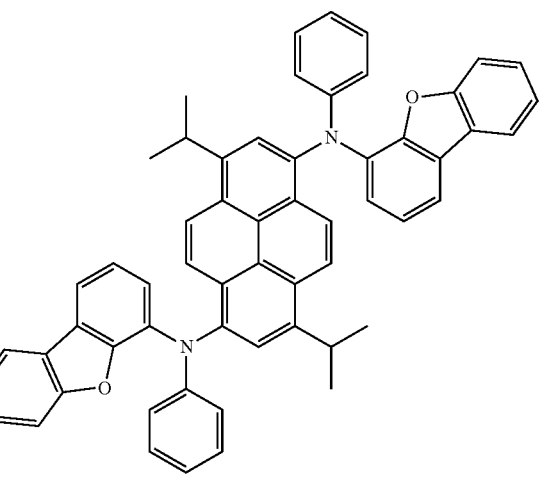
FD10
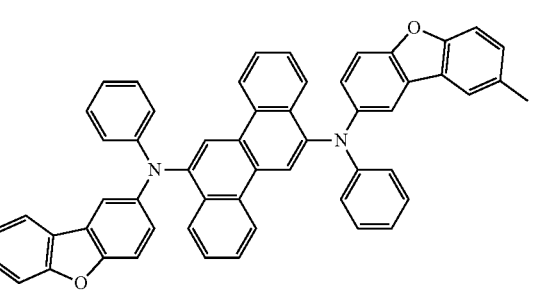
FD11
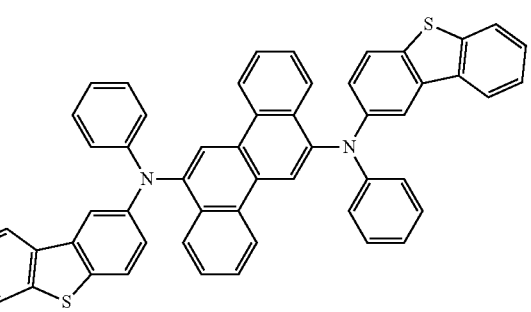

FD12
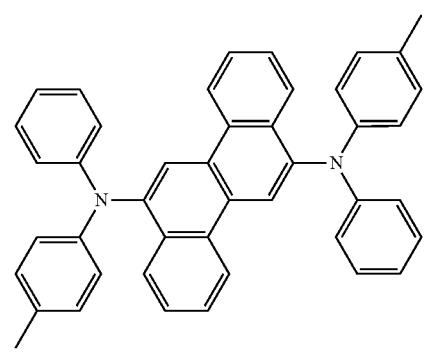
FD13
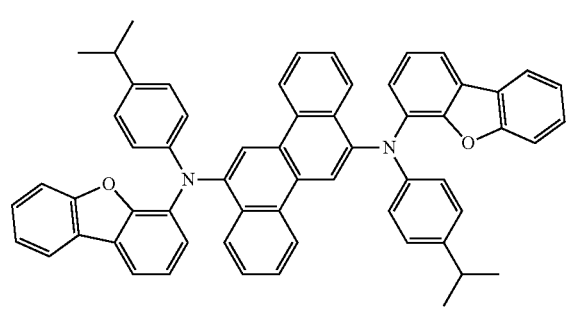
FD14
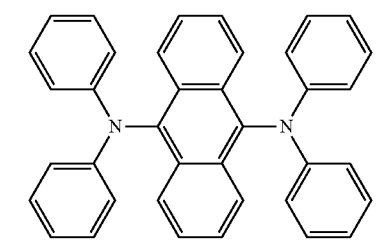
FD15
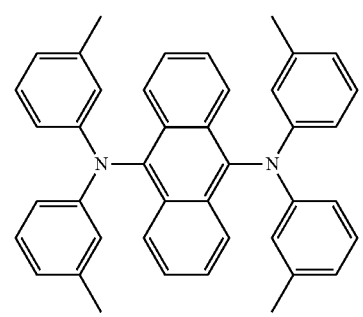
FD16
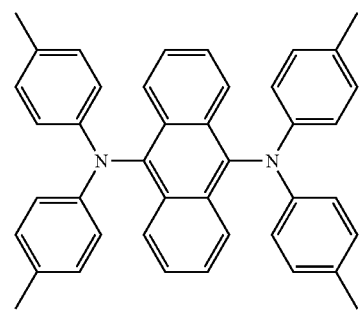
FD17
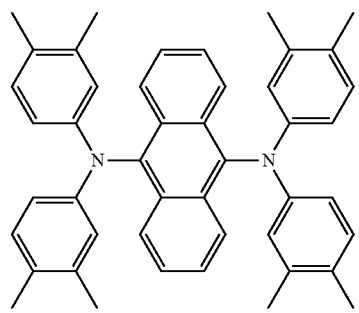
FD18
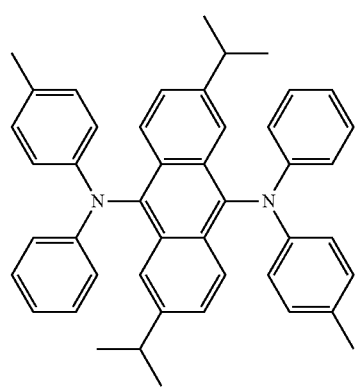
FD19
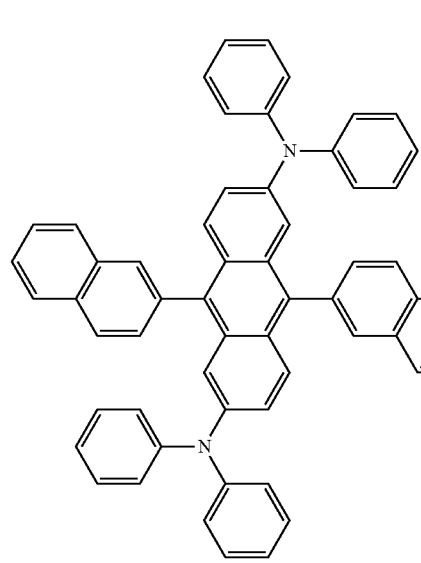
FD20
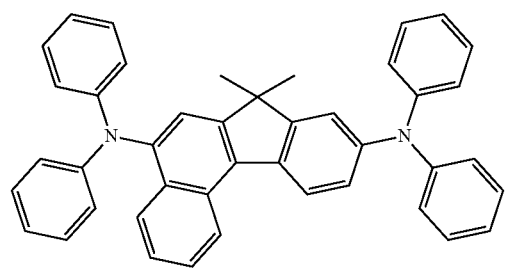

-continued
FD21
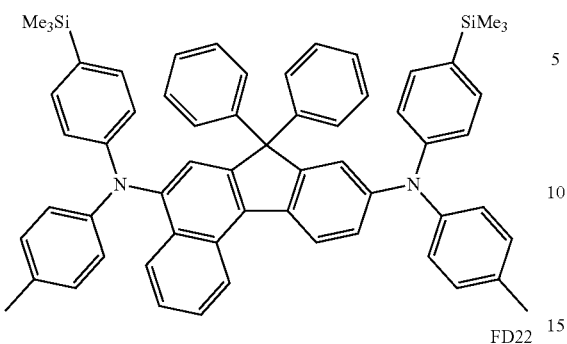
FD22
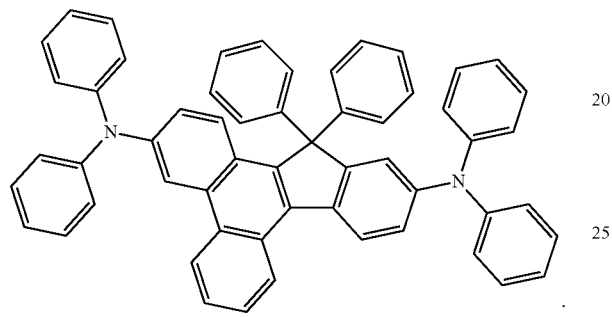
In one or more embodiments, the fluorescent dopant may be selected from the following compounds, but embodiments of the present disclosure are not limited thereto.
DPVBi
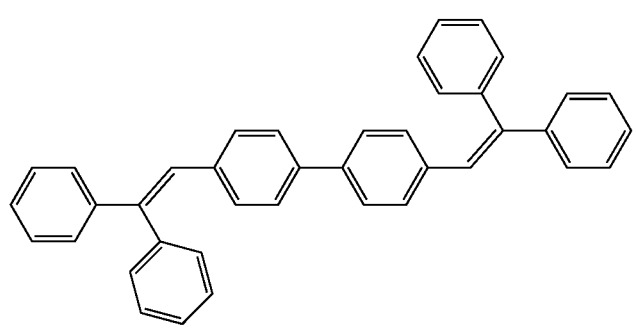
DPAVBi
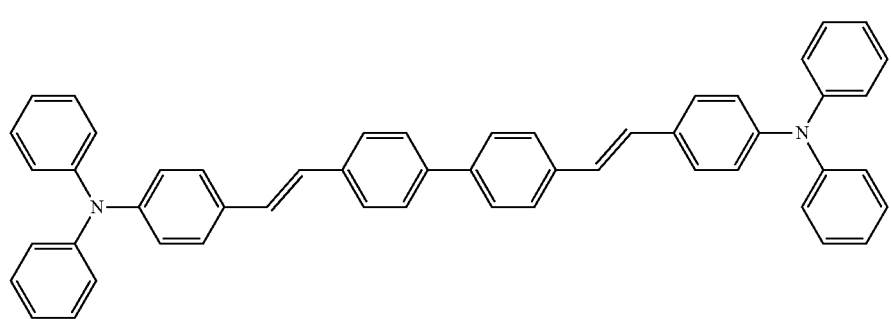

TBPe

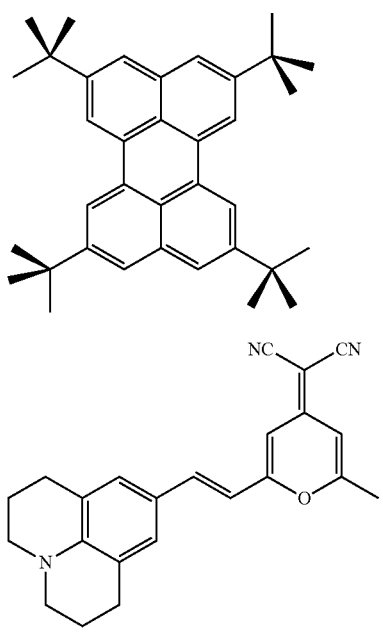

DCM

DCJTB

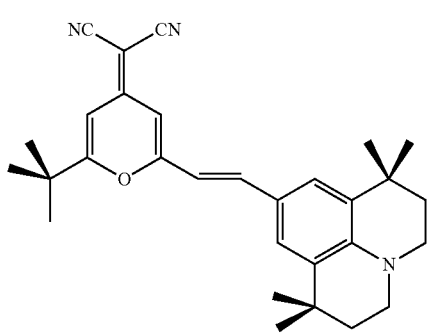

Coumarin 6

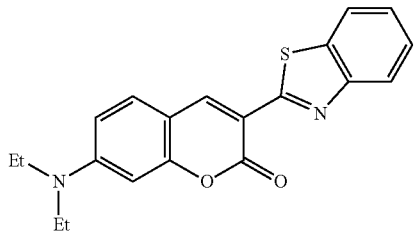

C545T

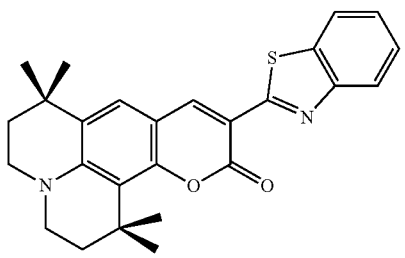

Electron Transport Region in Organic Layer 23

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from (or on) an emission layer. However, embodiments of the structure of the electron transport region are not limited thereto.

The electron transport region (for example, a buffer layer, a hole blocking layer, an electron control layer, or an electron transport layer in the electron transport region) may include a metal-free compound containing at least one π electron-depleted nitrogen-containing ring.

The term "π electron-depleted nitrogen-containing ring," as used herein, refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazol, an imidazopyridine, an imidazopyrimidine, and an azacarbazole, but are not limited thereto.

For example, the electron transport region may include a compound represented by Formula 601:

$[Ar_{601}]_{xe11}$-$[(L_{601})_{xe1}$-$R_{601}]_{xe21}$.  Formula 601

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and/or at least one of $R_{601}$(s) in the number of xe21 may include the π electron-depleted nitrogen-containing ring.

In one embodiment, ring $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(s) may be linked via a single bond.

In one or more embodiments, $Ar_{601}$ in Formula 601 may be an anthracene group.

In one or more embodiments, a compound represented by Formula 601 may be represented by Formula 601-1:

Formula 601-1

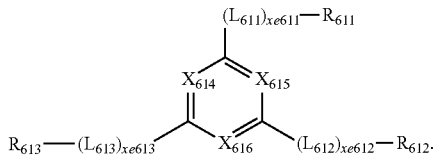

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but are not limited thereto, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formula 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), and Q$_{601}$ and Q$_{602}$ are the same as described above.

The electron transport region may include at least one compound selected from Compounds ET1 to ET36, but embodiments of the present disclosure are not limited thereto:

ET1

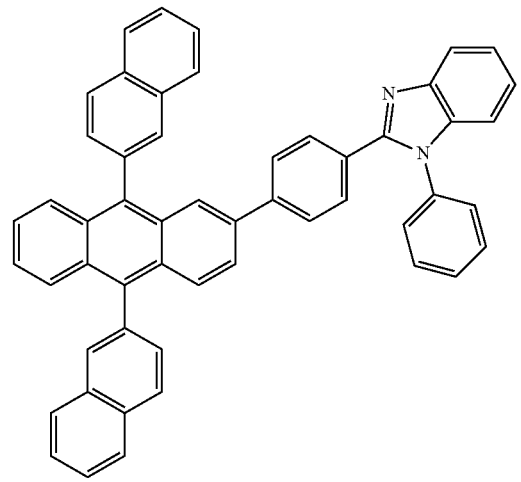

ET2

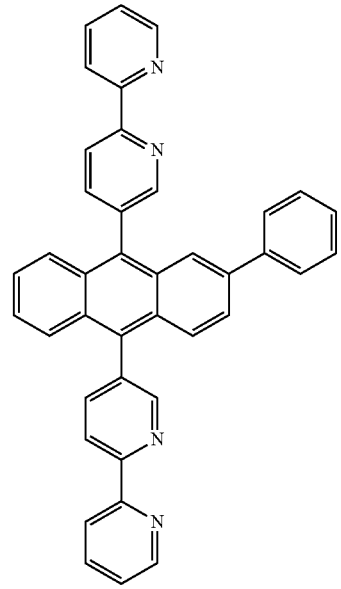

ET3
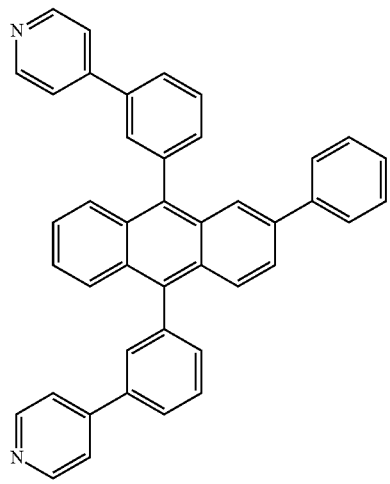
ET6
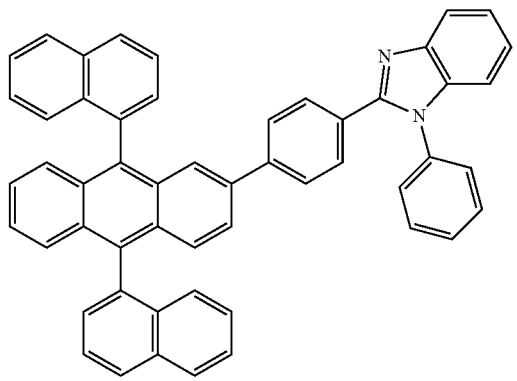
ET4
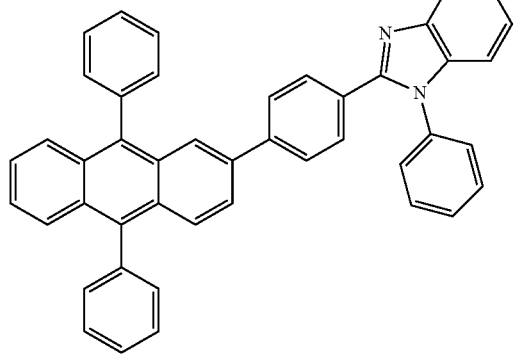
ET7
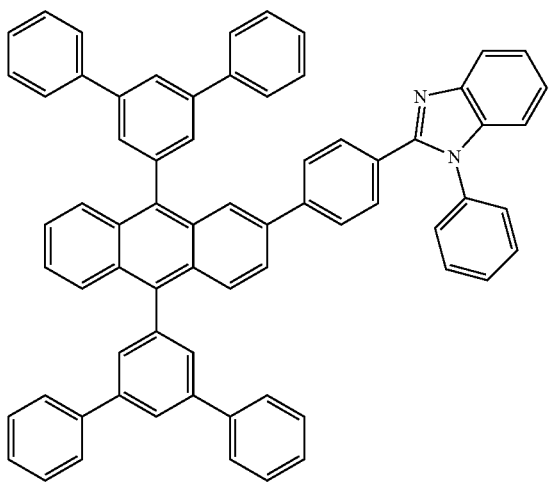
ET5
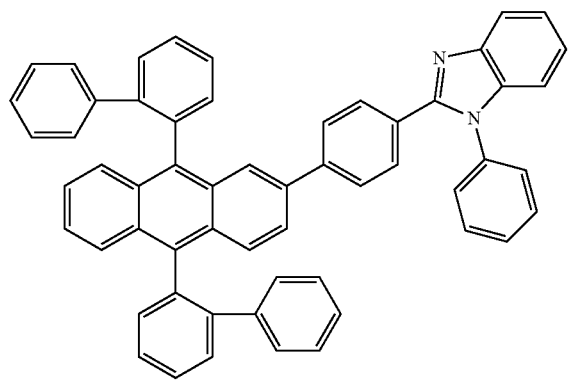
ET8
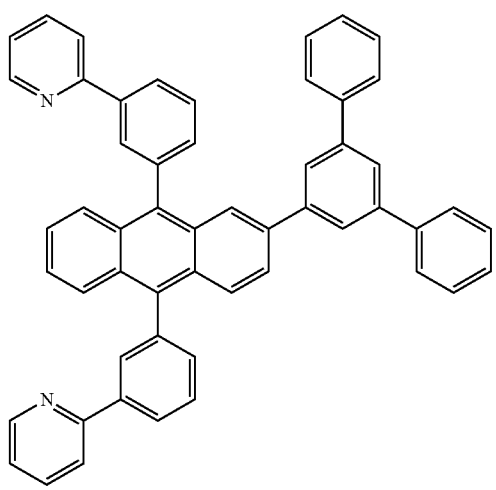

ET9
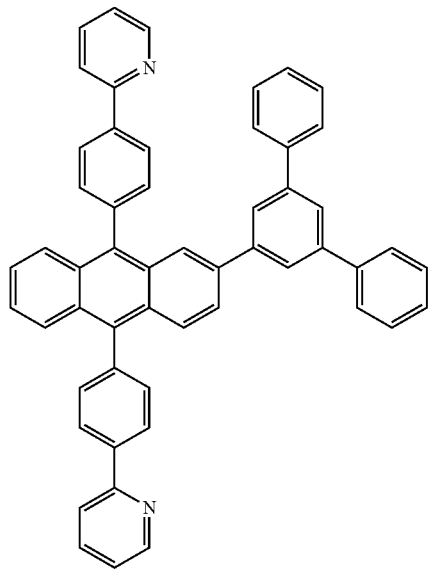
ET10
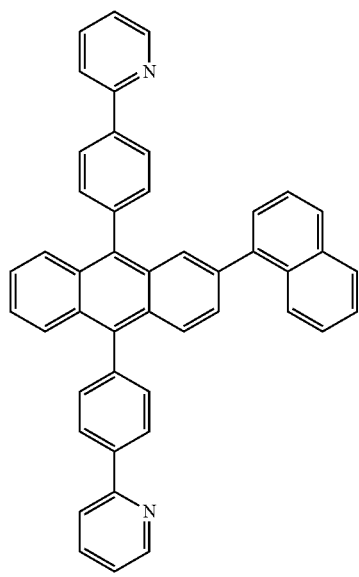
ET11
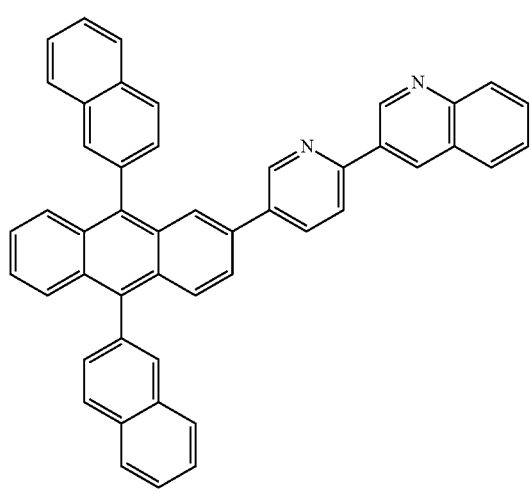
ET12
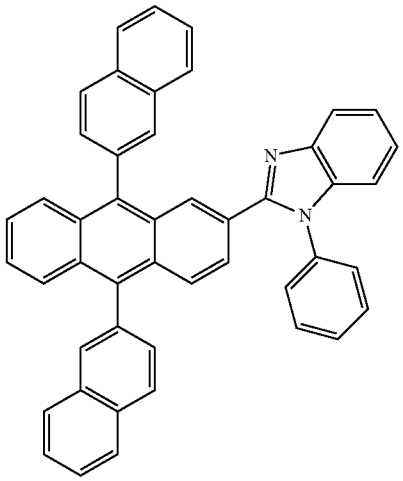
ET13
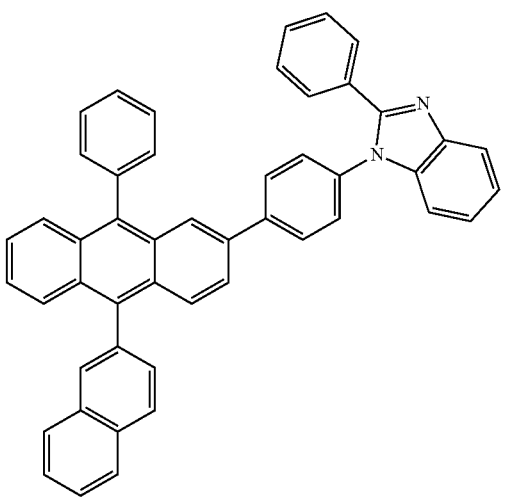
ET14
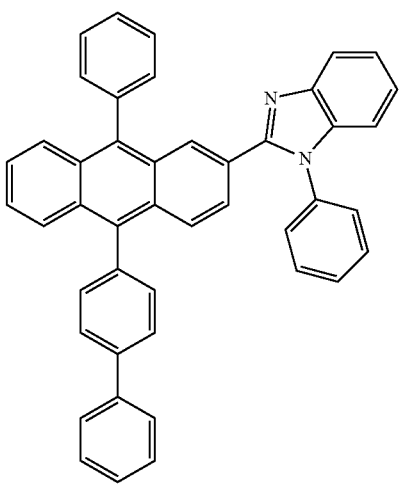

ET15
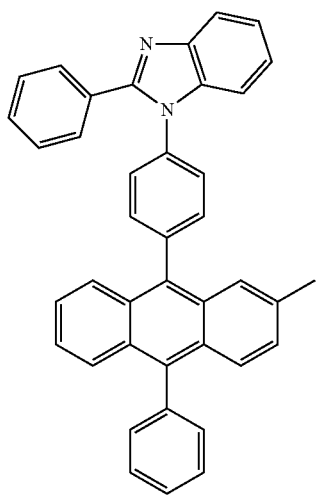
ET16
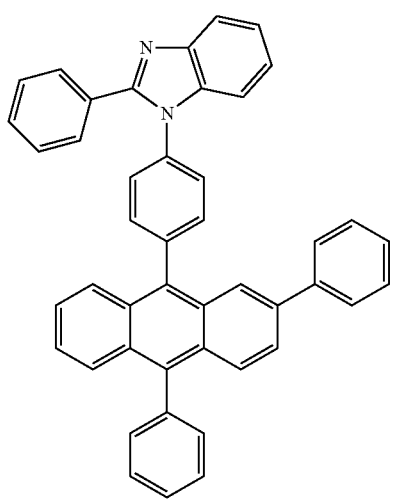
ET17
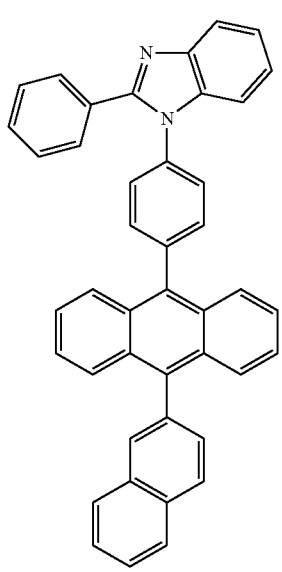
ET18
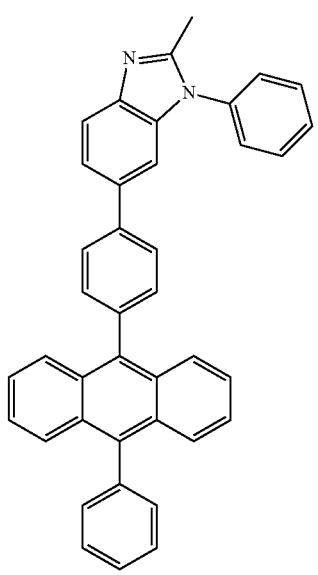
ET19
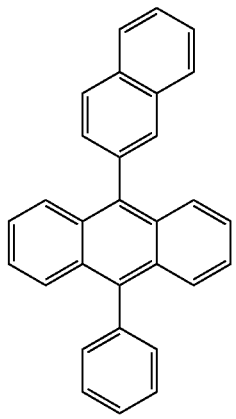
ET20
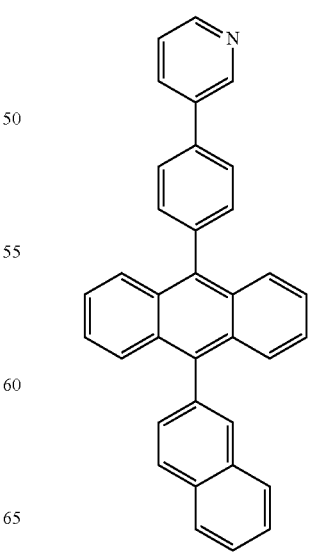

ET21
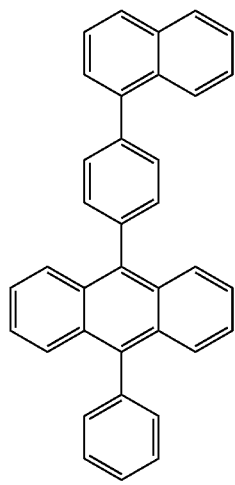
ET22
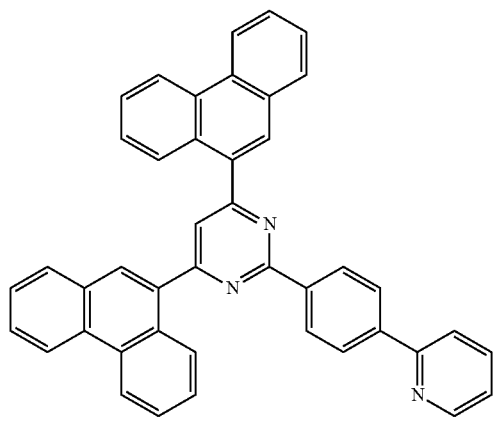
ET23
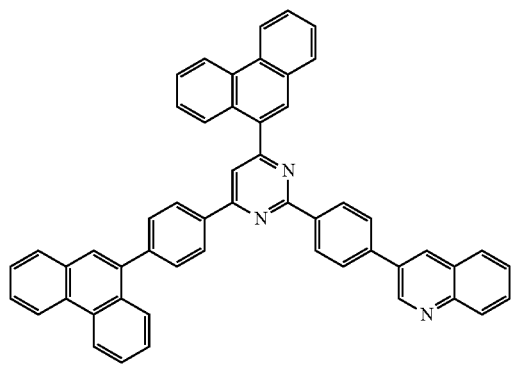
ET24
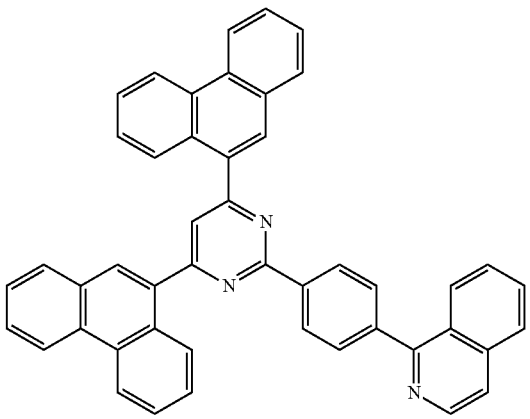
ET25
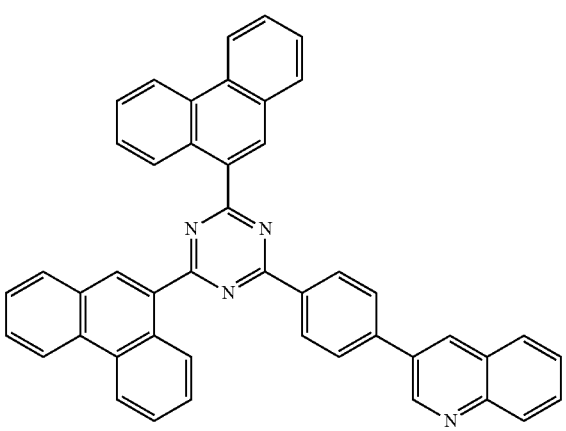
ET26
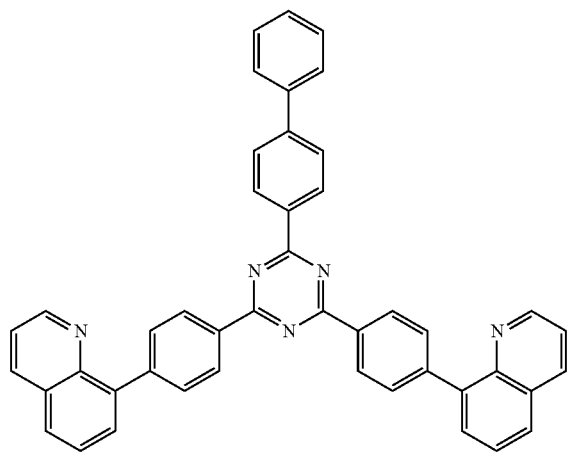

ET27
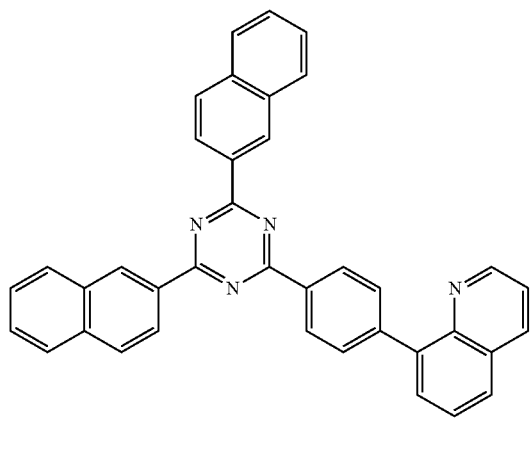
ET28
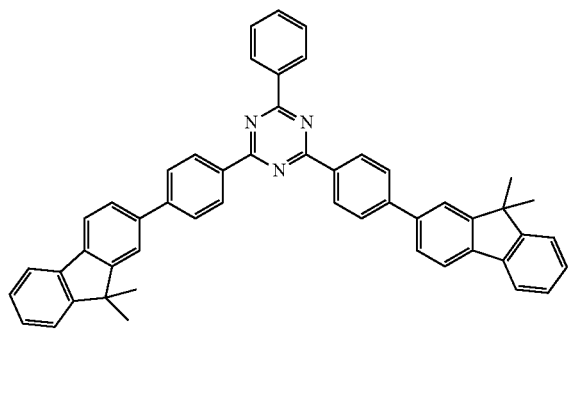
ET29
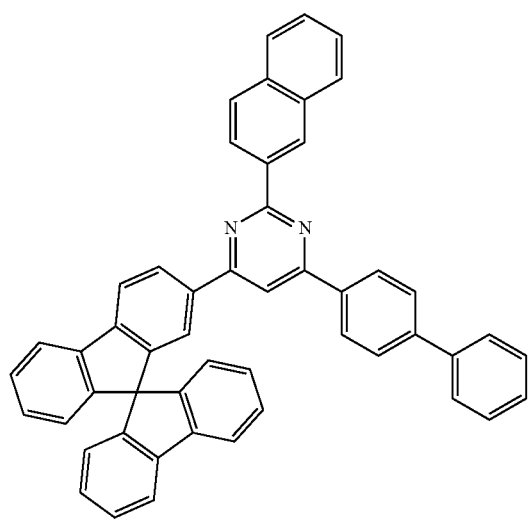
ET30
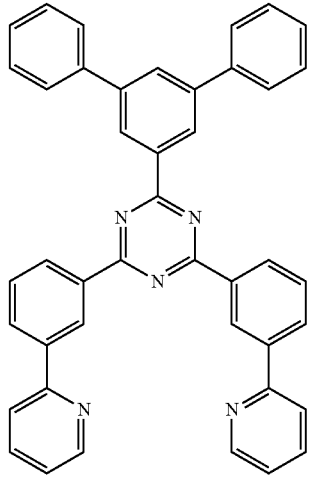
ET31
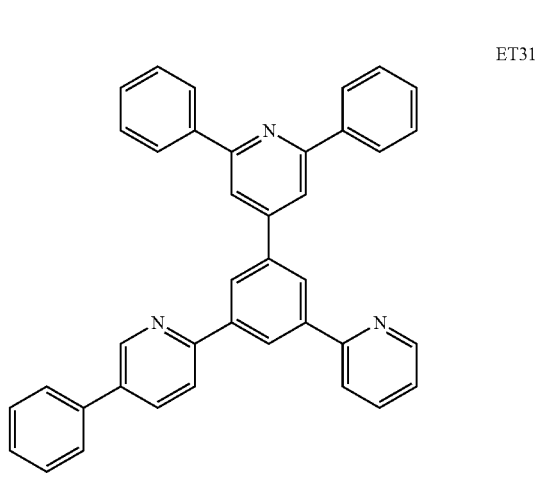
ET32
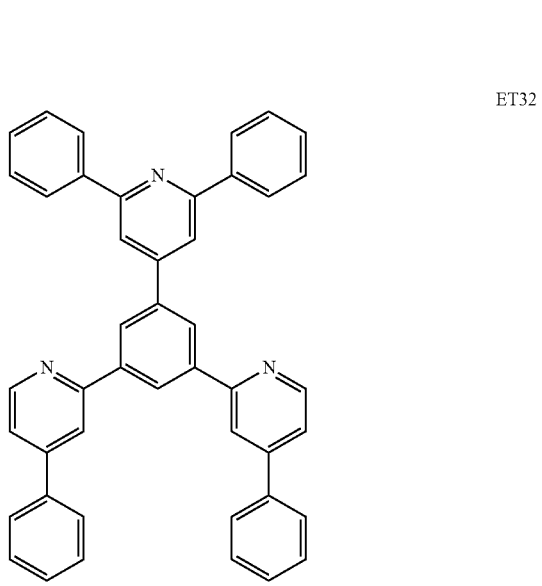

ET33
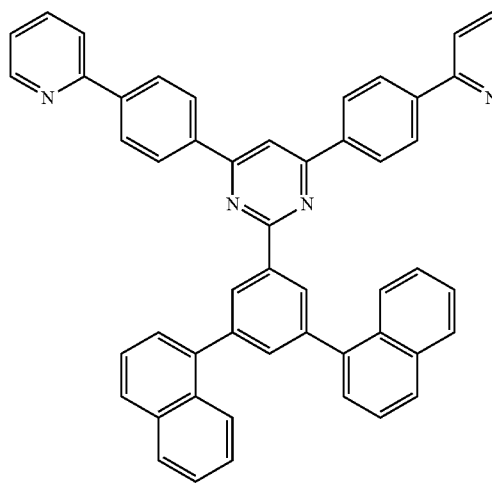
ET34
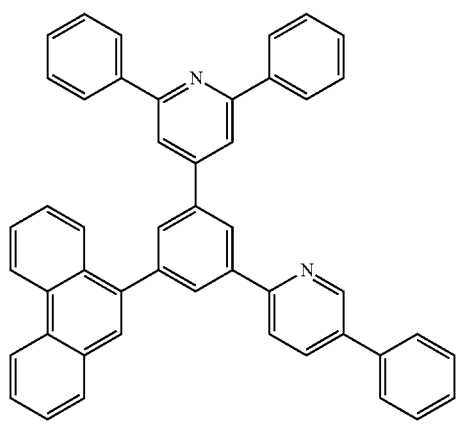
ET35
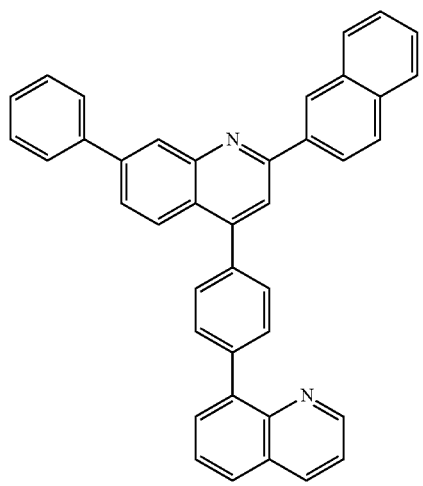
ET36
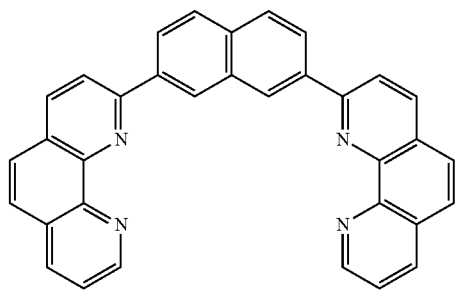
In one or more embodiments, the electron transport region may include at least one compound selected from 2,9-dimethyl-4,7-diphenyl-1,10-phenanthroline (BCP), 4,7-diphenyl-1,10-phenanthroline (Bphen), Alq3, BAlq, 3-(biphenyl-4-yl)-5-(4-tert-butylphenyl)-4-phenyl-4H-1,2,4-triazole (TAZ), and NTAZ.
Alq₃
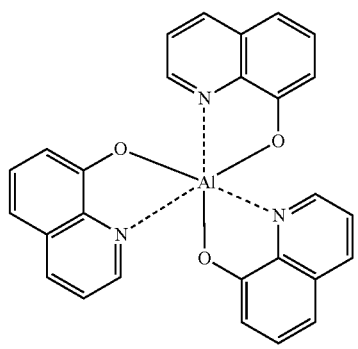
BAlq
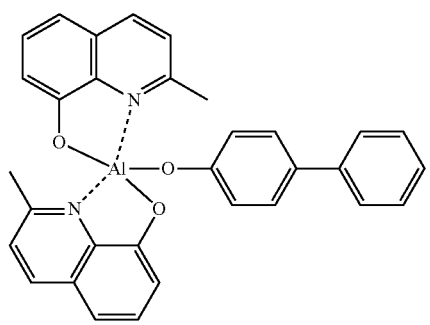
TAZ
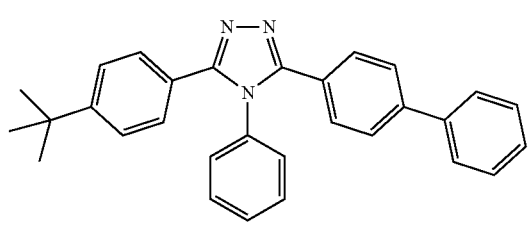

-continued

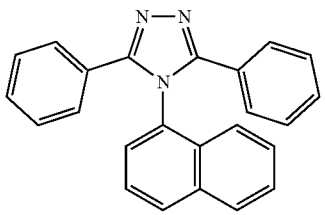
NTAZ

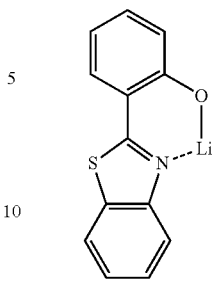
ET-D2

The thickness of the buffer layer, the hole blocking layer, or the electron controlling layer may each independently be in a range of about 20 Å to about 1,000 Å, for example, about 30 Å to about 300 Å. When the thicknesses of the buffer layer, the hole blocking layer, and the electron control layer are within these ranges, the electron blocking layer may have excellent hole blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have suitable or satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazol, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) or ET-D2.

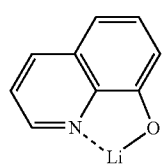
ET-D1

The electron transport region may include an electron injection layer that facilitates injection of electrons from the second electrode 25. The electron injection layer may directly contact the second electrode 25.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (0<x<1), or $Ba_xCa_{1-x}O$ (0<x<1). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazol, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (or consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have suitable or satisfactory electron injection characteristics without a substantial increase in driving voltage.

The electron injection layer may further include, in addition to the material described above, a metal-containing material in the same (e.g., substantially the same) manner as in the electron transport layer.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

General Definition of Some of the Substituents

The term "$C_1$-$C_{60}$ alkyl group," as used herein, refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group," as used herein, refers to a divalent group having the same (e.g., substantially the same) structure as the $C_1$-$C_{60}$ alkyl group.

The term "$C_2$-$C_{60}$ alkenyl group," as used herein, refers to a hydrocarbon group formed by substituting at least one carbon-carbon double bond at a main chain (e.g., in the middle) or at a terminus of the $C_2$-$C_{60}$ alkyl group, and non-limiting examples thereof include an ethenyl group, a propenyl group, and a butenyl group. The term "$C_2$-$C_{60}$ alkenylene group," as used herein, refers to a divalent group having the same (e.g., substantially the same) structure as the $C_2$-$C_{60}$ alkenyl group.

The term "$C_2$-$C_{60}$ alkynyl group," as used herein, refers to a hydrocarbon group formed by substituting at least one carbon-carbon triple bond at a main chain (e.g., in the middle) or at a terminus of the $C_2$-$C_{60}$ alkyl group, and non-limiting examples thereof include an ethynyl group, and a propynyl group. The term "$C_2$-$C_{60}$ alkynylene group," as used herein, refers to a divalent group having the same (e.g., substantially the same) structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having the same (e.g., substantially the same) structure as the $C_3$-$C_{10}$ cycloalkyl group.

The term "$C_1$-$C_{10}$ heterocycloalkyl group," as used herein, refers to a monovalent saturated monocyclic group having at least one heteroatom selected from N, O, Si, P, and S as a ring-forming atom and 1 to 10 carbon atoms, and non-limiting examples thereof include a 1,2,3,4-oxatriazolidinyl group, a tetrahydrofuranyl group, a tetrahydrothiophenyl group. The term "$C_1$-$C_{10}$ heterocycloalkylene group," as used herein, refers to a divalent group having the same (e.g., substantially the same) structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., the entire ring, group, and/or molecule is not aromatic), and non-limiting examples thereof include a cyclopentenyl group, a cyclohexenyl group, and a cycloheptenyl group. The term "$C_3$-$C_{10}$ cycloalkenylene group," as used herein, refers to a divalent group having the same (e.g., substantially the same) structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having the same (e.g., substantially the same) structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together).

The term "$C_1$-$C_{60}$ heteroaryl group," as used herein, refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group," as used herein, refers to a divalent group having a heterocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other (e.g., combined together).

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure (e.g., the entire molecule is not aromatic). An example of the monovalent non-aromatic condensed polycyclic group is a fluorenyl group. The term "divalent non-aromatic condensed polycyclic group," as used herein, refers to a divalent group having the same (e.g., substantially the same) structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together), at least one heteroatom selected from N, O, Si, P, and S, other than carbon atoms, as a ring-forming atom, and no aromaticity in its entire molecular structure (e.g., the entire molecule is not aromatic). An example of the monovalent non-aromatic condensed heteropolycyclic group is a carbazolyl group. The term "divalent non-aromatic condensed heteropolycyclic group," as used herein, refers to a divalent group having the same (e.g., substantially the same) structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group," as used herein, refers to a group having the same (e.g., substantially the same) structure as the $C_1$-$C_{60}$ carbocyclic group, except that as a ring-forming atom, at least one heteroatom selected from N, O, Si, P, and S is used in addition to carbon (the number of carbon atoms may be in a range of 1 to 60).

At least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph," as used herein, may refer to a phenyl group; the term "Me," as used herein, may refer to a methyl group; the term "Et," as used herein, may refer to an ethyl group; the terms "ter-Bu" or "But," as used herein, may refer to a tert-butyl group; and the term "OMe," as used herein, may refer to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a phenyl group having, as a substituent, a $C_6$-$C_{60}$ aryl group substituted with a $C_6$-$C_{60}$ aryl group.

* and *' used herein, unless defined otherwise, each refer to a binding site to a neighboring atom in a corresponding formula.

Since the encapsulation layer of the organic light-emitting device may prevent moisture and/or oxygen from penetrating into the organic light-emitting diode for a long time (or may effectively reduce a likelihood or amount of moisture and/or oxygen penetrating into the light-emitting diode over a long period of time), the organic light-emitting device including the encapsulation layer may have a long lifespan. In addition, since the at least one organic layer included in the encapsulation layer includes the ultraviolet-absorbing material, the encapsulation layer of the organic light-emitting device may protect the organic light-emitting diode from the ultraviolet light. In addition, since the ultraviolet-reflective layer protects the organic light-emitting diode from the ultraviolet light, it is possible to prevent or reduce performance deterioration of the device.

It should be understood that embodiments described herein should be considered in a descriptive sense only and not for purposes of limitation. Descriptions of features or aspects within each embodiment should typically be considered as available for other similar features or aspects in other embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. An organic light-emitting device comprising:
a substrate;
an organic light-emitting diode on the substrate;
an encapsulation layer sealing the organic light-emitting diode; and
an ultraviolet-reflective layer,
wherein the organic light-emitting diode is between the substrate and the encapsulation layer,
the encapsulation layer is between the organic light-emitting diode and the ultraviolet-reflective layer,
the encapsulation layer comprises n encapsulation units, in which an inorganic layer and an organic layer are stacked sequentially from the organic light-emitting diode, and wherein n is an integer of 1 or more,
at least one selected from n organic layers comprised in the encapsulation layer comprises an ultraviolet-absorbing material,
the ultraviolet-reflective layer comprises a plurality of stacking units, in which a first inorganic film having a first refractive index and a second inorganic film having a second refractive index different from the first refractive index are stacked, and
the first inorganic film and the second inorganic film each independently consists of at least one selected from group consisting of silicon oxide, silicon nitride, silicon oxynitride, silicon carbide, silicon carbonitride, aluminum oxide, aluminum nitride, zinc oxide, titanium oxide, titanium nitride, tantalum oxide, tantalum nitride, hafnium oxide, hafnium nitride, zirconium oxide, zirconium nitride, cerium oxide, cerium nitride, tungsten oxide, tin oxide, tin nitride, and copper oxide.

2. The organic light-emitting device of claim 1, wherein the plurality of stacking units of the ultraviolet-reflective layer comprises m stacking units, and
wherein m is an integer of 3 or more.

3. The organic light-emitting device of claim 1, wherein a difference between the first refractive index and the second refractive index is 0.15 or more.

4. The organic light-emitting device of claim 1, wherein the first refractive index is selected from a range of 1.6 to 2.0, and the second refractive index is selected from a range of 1.4 to 1.5.

5. The organic light-emitting device of claim 1, wherein the ultraviolet-reflective layer has a reflectance of 90% or more with respect to light having a wavelength of 405 nm or less.

6. The organic light-emitting device of claim 1, wherein the organic layer comprising the ultraviolet-absorbing material has an absorptance of 90% or more with respect to light having a wavelength of 405 nm or less.

7. The organic light-emitting device of claim 1, wherein the ultraviolet-reflective layer and the organic layer comprising the ultraviolet-absorbing material each independently have a transmittance of 80% or more with respect to light in a visible light region.

8. The organic light-emitting device of claim 1, wherein the ultraviolet-absorbing material comprises at least one selected from a benzophenone-based compound, a cyanoacrylate-based compound, a benzotriazine-based compound, a benzotriazole-based compound, a triazine-based compound, an oxanilide-based compound, a salicylate-based compound, an ultraviolet-absorbing dye, and a photoluminescent material that absorbs ultraviolet light.

9. The organic light-emitting device of claim 1, wherein the at least one selected from n organic layers comprises a cured product of an organic layer formation composition comprising a monomer, a photopolymerization initiator, and an ultraviolet-absorbing material.

10. The organic light-emitting device of claim 9, wherein the monomer comprises at least one selected from a compound represented by Formula 1 and a compound represented by Formula 2:

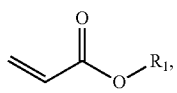

Formula 1 wherein, in Formula 1, $R_1$ is selected from:

hydrogen, deuterium, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, and a $C_1$-$C_{30}$ heteroaryl group; and a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, and a $C_1$-$C_{30}$ heteroaryl group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, a $C_6$-$C_{30}$ aryloxy group, a $C_6$-$C_{30}$ aryloxy group substituted with a $C_6$-$C_{30}$ aryl group, a $C_6$-$C_{30}$ arylthio group, and a $C_1$-$C_{30}$ heteroaryl group,

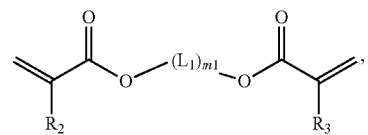

Formula 2 wherein, in Formula 2, $L_1$ is —O—, —S—, $S(=O)_2$—, —C(=O)—, —C(=O)O—, —C(=O)NH—, —N($R_6$)—, —C($R_6$)($R_7$)—, —Si($R_6$)($R_7$)—, or an unbranched $C_6$-$C_{20}$ alkylene group, m1 is an integer from 1 to 10, $R_2$ and $R_3$ are each independently selected from:

hydrogen, deuterium, a $C_1$-$C_{20}$ alkyl group, a $C_2$-$C_{20}$ alkenyl group, a $C_2$-$C_{20}$ alkynyl group, and a $C_1$-$C_{20}$ alkoxy group; and a $C_1$-$C_{20}$ alkyl group, a $C_2$-$C_{20}$ alkenyl group, a $C_2$-$C_{20}$ alkynyl group, and a $C_1$-$C_{20}$ alkoxy group, each substituted with at least one selected from deuterium, —F, —Cl, —Br, —I, a hydroxyl group, a cyano group, an epoxy group, a nitro group, an amidino group, a hydrazino group, a hydrazono group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_6$-$C_{30}$ aryl group, a $C_6$-$C_{30}$ aryloxy group, a $C_6$-$C_{30}$ aryloxy group substituted with a $C_6$-$C_{30}$ aryl group, a $C_6$-$C_{30}$ arylthio group, and a $C_1$-$C_{30}$ heteroaryl group.

11. The organic light-emitting device of claim 1, further comprising a lower organic layer between the organic light-emitting diode and the encapsulation layer.

12. A method of manufacturing an organic light-emitting device, the method comprising:

providing a substrate;

forming an organic light-emitting diode on the substrate;

forming an encapsulation layer on the organic light-emitting diode and the substrate; and forming an ultraviolet-reflective layer on the encapsulation layer, wherein the encapsulation layer comprises n encapsulation units, in which an inorganic layer and an organic layer are stacked sequentially from the organic light-emitting diode, and wherein n is an integer of 1 or more, at least one selected from n organic layers comprised in the encapsulation layer comprises an ultraviolet-absorbing material, the ultraviolet-reflective layer comprises a plurality of stacking units, in which a first inorganic film having a first refractive index and a second inorganic film having a second refractive index different from the first refractive index are stacked, and the first inorganic film and the second inorganic film each independently comprises at least one selected from group consisting of silicon oxide, silicon nitride, silicon oxynitride, silicon carbide, silicon carbonitride, aluminum oxide, aluminum nitride, zinc oxide, titanium oxide, titanium nitride, tantalum oxide, tantalum nitride, hafnium oxide, hafnium nitride, zirconium oxide, zirconium nitride, cerium oxide, cerium nitride, tungsten oxide, tin oxide, tin nitride, and copper oxide.

13. The method of claim 12, wherein the ultraviolet-reflective layer is formed by a method of chemical vapor deposition (CVD), plasma-enhanced chemical vapor deposition (PECVD), atomic layer deposition (ALD), vacuum deposition, or sputtering.

14. The method of claim 12, wherein at least one of n inorganic layers is formed by a method of chemical vapor deposition (CVD), plasma-enhanced chemical vapor deposition (PECVD), atomic layer deposition (ALD), vacuum deposition, or sputtering.

15. The method of claim 12, wherein at least one of n organic layers is formed by a method of flash evaporation, ink-jet printing, screen printing, dip coating, or spin coating.

* * * * *